US009716395B2

(12) United States Patent
Kinzer et al.

(10) Patent No.: US 9,716,395 B2
(45) Date of Patent: Jul. 25, 2017

(54) GAN CIRCUIT DRIVERS FOR GAN CIRCUIT LOADS

(71) Applicant: NAVITAS SEMICONDUCTOR INC., El Segundo, CA (US)

(72) Inventors: Daniel M. Kinzer, El Segundo, CA (US); Santosh Sharma, Laguna Niguel, CA (US); Ju Jason Zhang, Monterey Park, CA (US)

(73) Assignee: NAVITAS SEMICONDUCTOR, INC., El Segundo, CA (US)

( * ) Notice: Subject to any disclaimer, the term of this patent is extended or adjusted under 35 U.S.C. 154(b) by 215 days.

(21) Appl. No.: 14/737,259

(22) Filed: Jun. 11, 2015

(65) Prior Publication Data

US 2016/0079854 A1 Mar. 17, 2016

Related U.S. Application Data

(60) Provisional application No. 62/051,160, filed on Sep. 16, 2014, provisional application No. 62/127,725, filed on Mar. 3, 2015.

(51) Int. Cl.
*H03B 1/00* (2006.01)
*H03K 3/00* (2006.01)
(Continued)

(52) U.S. Cl.
CPC .......... *H02J 7/0052* (2013.01); *H01L 25/072* (2013.01); *H01L 27/0883* (2013.01);
(Continued)

(58) Field of Classification Search
CPC ....... H01L 2924/13091; H01L 29/2003; H01L 25/072; H01L 27/0883; H02M 1/088;
(Continued)

(56) References Cited

U.S. PATENT DOCUMENTS 4,698,530 A * 10/1987 Thomson ................ H02M 1/10
327/410
5,808,879 A 9/1998 Liu et al.
(Continued)

FOREIGN PATENT DOCUMENTS

| CN | 101572490 B | 11/2009 |
| JP | 2001-308462 A | 11/2001 |
| JP | 2013-106027 A | 5/2013 |

OTHER PUBLICATIONS

International Search Report and Written Opinion dated Jan. 14, 2016, for International Application No. PCT/US2015/050510, 9 pages.

*Primary Examiner* — Lincoln Donovan
*Assistant Examiner* — Diana J Cheng
(74) *Attorney, Agent, or Firm* — Kilpatrick Townsend & Stockton

(57) ABSTRACT

An electronic circuit is disclosed. The electronic circuit includes a substrate having GaN, and a power switch formed on the substrate and including a first control gate and a first source. The electronic circuit also includes a drive circuit formed on the substrate and including an output coupled to the first control gate, and a power supply having a supply voltage and coupled to the drive circuit, where the output can be driven to the supply voltage.

31 Claims, 45 Drawing Sheets

(51) Int. Cl.
*H02J 7/00* (2006.01)
*H02M 1/088* (2006.01)
*H02M 3/158* (2006.01)
*H03K 3/012* (2006.01)
*H01L 29/20* (2006.01)
*H03K 17/10* (2006.01)
*H03K 19/0185* (2006.01)
*H01L 25/07* (2006.01)
*H02M 3/157* (2006.01)
*H03K 3/356* (2006.01)
*H01L 27/088* (2006.01)
*H02M 1/00* (2006.01)

(52) U.S. Cl.
CPC ........ *H01L 29/2003* (2013.01); *H02M 1/088* (2013.01); *H02M 3/157* (2013.01); *H02M 3/1584* (2013.01); *H02M 3/1588* (2013.01); *H03K 3/012* (2013.01); *H03K 3/356017* (2013.01); *H03K 17/102* (2013.01); *H03K 19/018507* (2013.01); *H01L 2924/0002* (2013.01); *H02M 2001/0048* (2013.01); *Y02B 70/1466* (2013.01); *Y02B 70/1483* (2013.01)

(58) Field of Classification Search
CPC .. H02M 3/1588; H02M 3/157; H02M 3/1584; H02J 7/0052
USPC ............ 327/108–112; 257/76, 194, E29.089, 257/E27.016, E29.246
See application file for complete search history.

(56) References Cited

U.S. PATENT DOCUMENTS

| | | | |
|---|---|---|---|
| 6,605,963 B2* | 8/2003 | Kitamoto | H03K 3/356113 326/62 |
| 7,724,046 B2* | 5/2010 | Wendt | H03K 17/0822 327/110 |
| 2005/0219017 A1 | 10/2005 | Shirakawa | |
| 2011/0284862 A1 | 11/2011 | Zhang | |
| 2014/0175454 A1* | 6/2014 | Roberts | H01L 25/18 257/76 |
| 2014/0300413 A1* | 10/2014 | Hoyerby | H02M 1/08 330/251 |

* cited by examiner

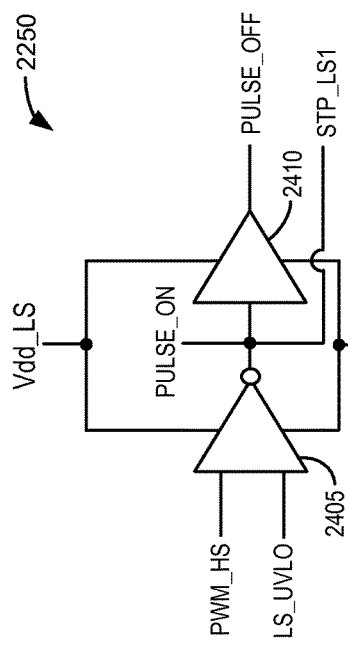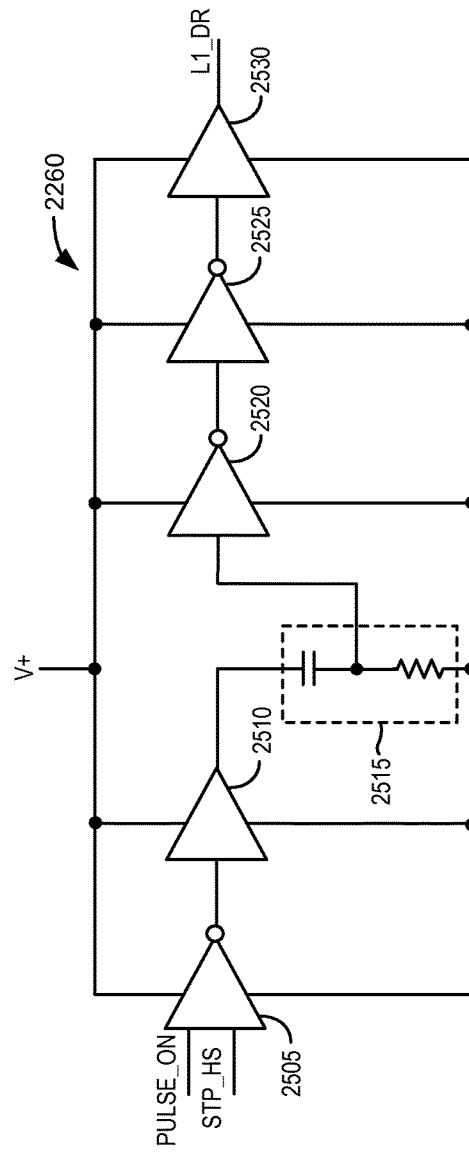

GAN CIRCUIT DRIVERS FOR GAN CIRCUIT LOADS

This application claims priority to U.S. provisional patent application Ser. No. 62/051,160, for "HYBRID HALF-BRIDGE DRIVER USING GAN AND SILICON DEVICES" filed on Sep. 16, 2014 and to U.S. provisional patent application Ser. No. 62/127,725, for "HALF BRIDGE POWER CONVERSION CIRCUITS USING GAN AND SILICON DEVICES" filed on Mar. 3, 2015 which are hereby incorporated by reference in their entirety for all purposes.

FIELD OF THE INVENTION

The present invention relates generally to power conversion circuits and in particular to power conversion circuits utilizing one or more GaN-based semiconductor devices.

BACKGROUND OF THE INVENTION

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to the size and efficiency of the power conversion circuit, new half bridge converter circuits and components may be required to meet the needs of new electronic devices.

SUMMARY OF THE INVENTION

One inventive aspect is an electronic circuit. The electronic circuit includes a substrate having GaN, and a power switch formed on the substrate and including a first control gate and a first source. The electronic circuit also includes a drive circuit formed on the substrate and including an output coupled to the first control gate, and a power supply having a supply voltage and coupled to the drive circuit, where the output can be driven to the supply voltage.

Another inventive aspect is an electronic component including a package base, and at least one GaN-based die secured to the package base and including an electronic circuit. The electronic circuit includes a power switch formed on the at least one GaN based die, where the switch includes a first control gate and a first source. The electronic circuit also includes a drive circuit formed on the at least one GaN based die and including an output coupled to the first control gate, and a power supply having a supply voltage, coupled to the drive circuit, where the output can be driven to the supply voltage.

Another inventive aspect is a method of operating GaN-based circuit. The method includes receiving a signal with a drive circuit, processing the signal with the drive circuit, and transmitting a signal to a control gate of a switch, where the drive circuit and the switch are disposed on a unitary GaN substrate. The drive circuit includes at least one enhancement mode transistor, at least one current conducting element, and does not include any depletion mode transistors.

BRIEF DESCRIPTION OF THE DRAWINGS

FIG. 20 is a schematic of a high side reference voltage generation circuit illustrated in

FIG. 14.

FIG. 24 is a schematic of the inverter/buffer circuit illustrated in FIG. 22.

FIG. 25 is a schematic of the on pulse generator circuit illustrated in FIG. 22.

DETAILED DESCRIPTION OF THE INVENTION

Certain embodiments of the present invention relate to half bridge power conversion circuits that employ one or more gallium nitride (GaN) devices. While the present invention can be useful for a wide variety of half bridge circuits, some embodiments of the invention are particularly useful for half bridge circuits designed to operate at high frequencies and/or high efficiencies with integrated driver circuits, integrated level shift circuits, integrated bootstrap capacitor charging circuits, integrated startup circuits and/or hybrid solutions using GaN and silicon devices, as described in more detail below.

Half Bridge Circuit #1

Figure 1:
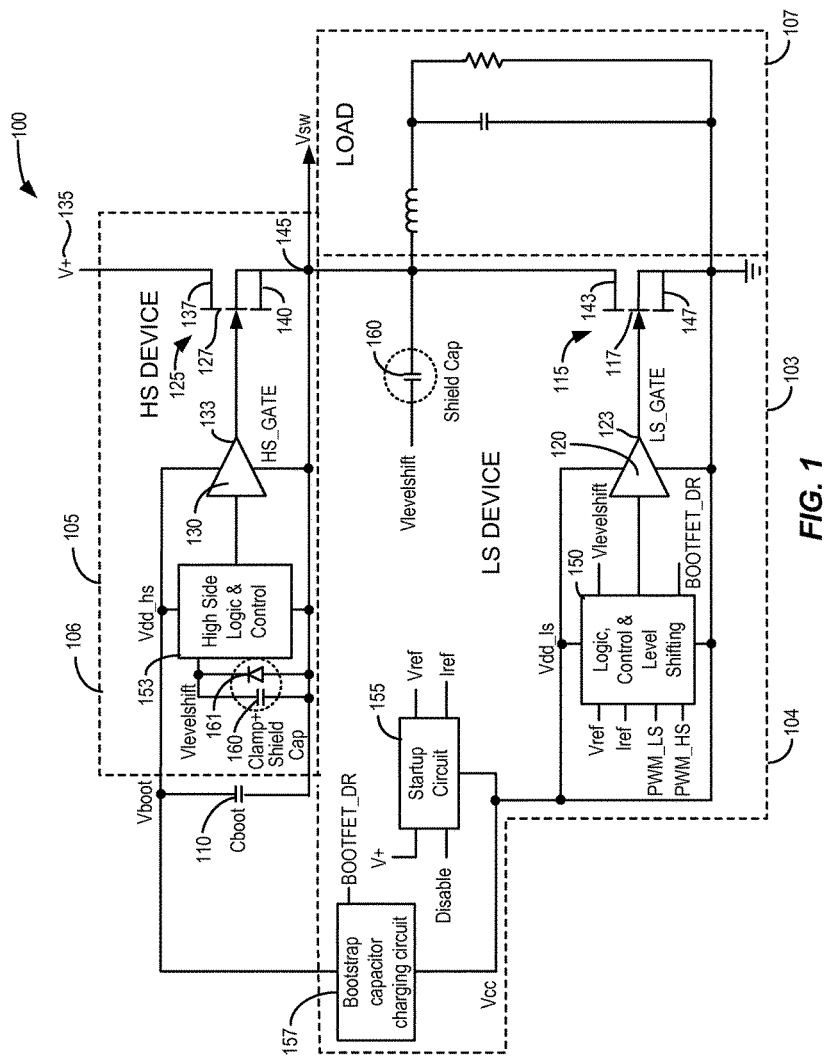
FIG. 1 is a simplified schematic of a half bridge power conversion circuit according to an embodiment of the invention.

Now referring to FIG. 1, in some embodiments circuit 100 may include a pair of complementary power transistors (also referred to herein as switches) that are controlled by one or more control circuits configured to regulate power delivered to a load. In some embodiments a high side power transistor is disposed on a high side device along with a portion of the control circuit and a low side power transistor is disposed on a low side device along with a portion of the control circuit, as described in more detail below.

The integrated half bridge power conversion circuit 100 illustrated in FIG. 1 includes a low side GaN device 103, a high side GaN device 105 a load 107, a bootstrap capacitor 110 and other circuit elements, as illustrated and discussed in more detail below. Some embodiments may also have an external controller (not shown in FIG. 1) providing one or more inputs to circuit 100 to regulate the operation of the circuit. Circuit 100 is for illustrative purposes only and other variants and configurations are within the scope of this disclosure.

In one embodiment, low side GaN device 103 may have a GaN-based low side circuit 104 that includes a low side power transistor 115 having a low side control gate 117. Low side circuit 104 may further include an integrated low side transistor driver 120 having an output 123 connected to low side transistor control gate 117. In another embodiment high, side GaN device 105 may have a GaN-based high side circuit 106 that includes a high side power transistor 125 having a high side control gate 127. High side circuit 106 may further include an integrated high side transistor driver 130 having an output 133 connected to high side transistor control gate 127.

A voltage source 135 (also known as a rail voltage) may be connected to a drain 137 of high side transistor 125, and the high side transistor may be used to control power input into power conversion circuit 100. High side transistor 125 may further have a source 140 that is coupled to a drain 143 of low side transistor 115, forming a switch node 145. Low side transistor 115 may have a source 147 connected to ground. In one embodiment, low side transistor 115 and high side transistor 125 may be GaN-based enhancement-mode field effect transistors. In other embodiments low side transistor 115 and high side transistor 125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 105 and low side device 103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN. In further embodiments, GaN-based low side circuit 104 and GaN-based high side circuit 106 may be disposed on a monolithic GaN-based device. In other embodiments GaN-based low side circuit 104 may be disposed on a first GaN-based device and GaN-based high side circuit 106 may be disposed on a second GaN-based device. In yet further embodiments GaN-based low side circuit 104 and GaN-based high side circuit 106 may be disposed on more than two GaN-based devices. In one embodiment, GaN-based low side circuit 104 and GaN-based high side circuit 106 may contain any number of active or passive circuit elements arranged in any configuration.

Low Side Device

Low side device 103 may include numerous circuits used for the control and operation of the low side device and high side device 105. In some embodiments, low side device 103 may include logic, control and level shift circuits (low side control circuit) 150 that controls the switching of low side transistor 115 and high side transistor 125 along with other functions, as discussed in more detail below. Low side device 103 may also include a startup circuit 155, a bootstrap capacitor charging circuit 157 and a shield capacitor 160, as also discussed in more detail below.

Figure 2:
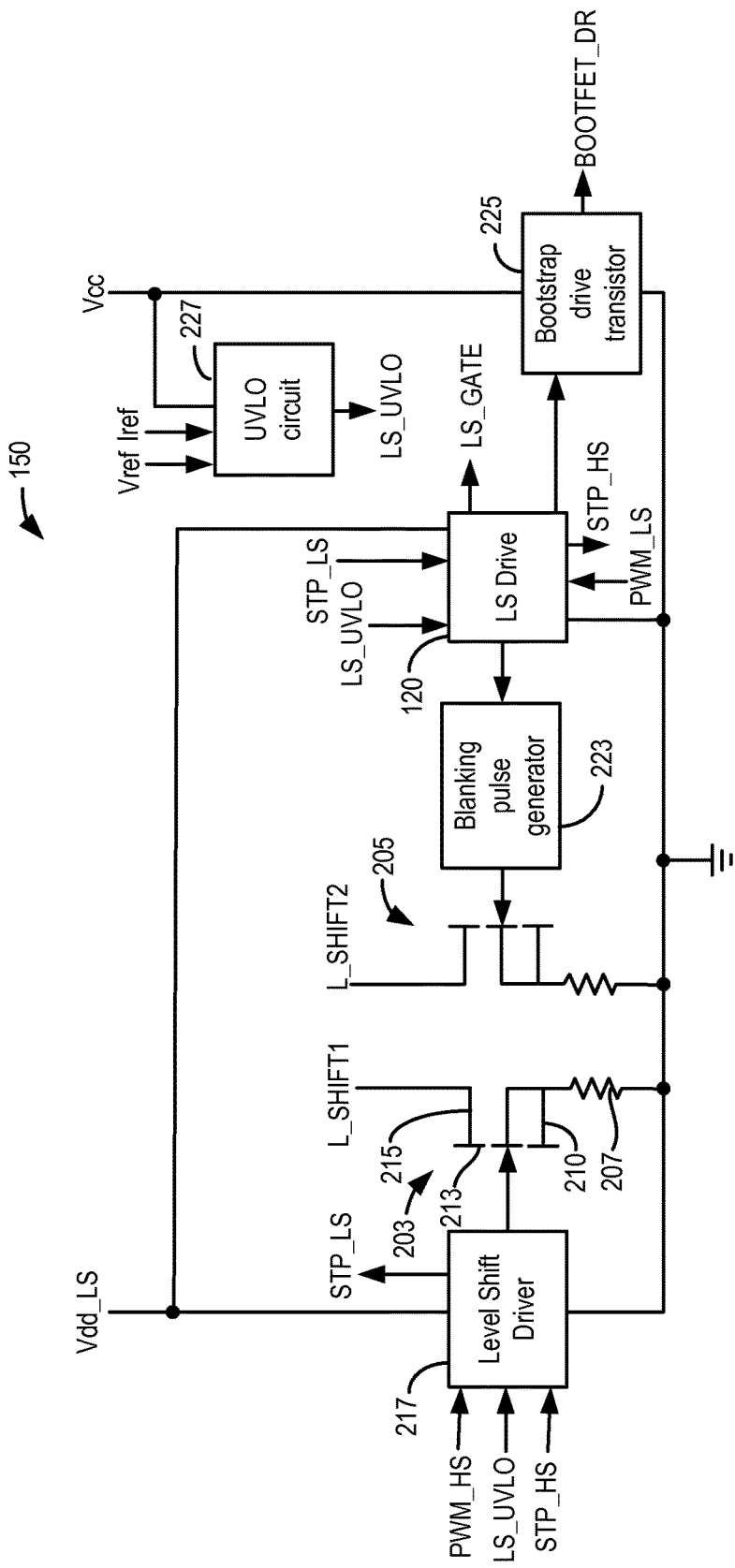
FIG. 2 is a simplified schematic of the circuits within the low side control circuit illustrated in FIG. 1.

Now referring to FIG. 2, the circuits within low side control circuit 150 are functionally illustrated. Each circuit within low side control circuit 150 is discussed below, and in some cases is shown in more detail in FIGS. 3-14. In one embodiment the primary function of low side control circuit 150 may be to receive one or more input signals, such as a PWM signal from a controller, and control the operation of low side transistor 115, and high side transistor 125.

In one embodiment, first and a second level shift transistors 203, 205, respectively, may be employed to communicate with high side logic and control circuit 153 (see FIG. 1). In some embodiments, first level shift transistor 203 may be a high voltage enhancement-mode GaN transistor. In further embodiments, first level shift transistor 203 may be similar to low side transistor 115 (see FIG. 1) and high side transistor 125, except it may be much smaller in size (e.g., first level shift transistor may be tens of microns in gate width with minimum channel length).

In other embodiments first level shift transistor 203 may experience high voltage and high current at the same time (i.e. the device may operate at the high power portion of the device Safe Operating Area) for as long as high side transistor 125 (see FIG. 1) is on. Such conditions may cause relatively high power dissipation, thus some embodiments may involve design and device reliability considerations in the design of first level shift transistor 203, as discussed in more detail below. In further embodiments, a first level shift resistor 207 may be added in series with a source 210 of first level shift transistor 203 to limit gate 213 to source 210 voltage and consequently the maximum current through the first level shift transistor. Other methods may be employed to limit the current through first level shift transistor 203, and are within the scope of this disclosure. Drain 215 of first level shift transistor 203 may be coupled to high side logic and control circuit 153 (see FIG. 1), as discussed in more detail below.

In one embodiment, first level shift transistor 203 may comprise a portion of an inverter circuit having a first input and a first output and configured to receive a first input logic signal at the first input terminal and in response, provide a first inverted output logic signal at the first output terminal, as discussed in more detail below. In further embodiments the first input and the first inverted output logic signals can be referenced to different voltage potentials. In some embodiments, first level shift resistor 207 may be capable of operating with the first inverted output logic signal referenced to a voltage that is more than 13 volts higher than a reference voltage for the first input logic signal. In other embodiments it may be capable of operating with the first inverted output logic signal referenced to a voltage that is more than 20 volts higher than a reference voltage for the first input logic signal, while in other embodiments it may be between 80-400 volts higher.

In other embodiments, first level shift resistor 207 may be replaced by any form of a current sink. For example, in one embodiment, source 210 of first level shift transistor 203 may be connected to a gate to source shorted depletion-mode device. In a further embodiment, the depletion-mode device may be fabricated by replacing the enhancement-mode gate stack with a high voltage field plate metal superimposed on top of the field dielectric layers. The thickness of the field dielectric and the work function of the metal may be used to determine the pinch-off voltage of the stack.

In other embodiments first level shift resistor 207 may be replaced by a current sink. The current sink may use a reference current (Iref) that may be generated by startup circuit 155 (illustrated in FIG. 1 and discussed in more detail below). Both the depletion-mode transistor and current sink embodiments may result in a significant device area reduction compared to the resistor embodiment (i.e., because a relatively small depletion-mode transistor would suffice and Iref is already available from startup circuit 155).

Second level shift transistor 205 may be designed similar to first level shift transistor 203 (e.g., in terms of voltage capability, current handling capability, thermal resistance, etc.). Second level shift transistor 205 may also be built with either an active current sink or a resistor, similar to first level shift transistor 203. In one embodiment the primary difference with second level shift transistor 205 may be in its operation. In some embodiments the primary purpose of second level shift transistor 205 may be to prevent false triggering of high side transistor 125 (see FIG. 1) when low side transistor 115 turns off In one embodiment, for example, false triggering can occur in a boost operation when low side transistor 115 turn off results in the load current flowing through high side transistor 125 while the transistor is operating in the third quadrant with its gate shorted to its source (i.e., in synchronous rectification mode). This condition may introduce a dv/dt condition at switch node (Vsw) 145 since the switch node was at a voltage close to ground when low side transistor 115 was on and then transitions to rail voltage 135 over a relatively short time period. The resultant parasitic C*dv/dt current (i.e., where C=Coss of first level shift transistor 203 plus any other capacitance to ground) can cause first level shift node 305 (see FIG. 3) to get pulled low which will then turn on high side transistor 125. In some embodiments this condition may not be desirable because there may be no dead time control, and shoot through may occur from high side transistor 125 and low side transistor 115 being in a conductive state simultaneously.

Figure 3:
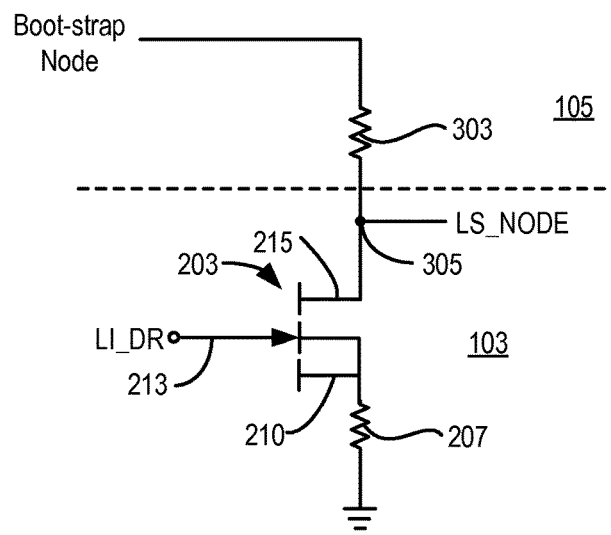
FIG. 3 is a schematic of the first level shift transistor illustrated in FIG. 1.

FIG. 3 illustrates one embodiment showing how first level shift transistor 203 may be electrically coupled to high side device 105. First level shift transistor 203, located on low side device 103, is illustrated along with a pull up resistor 303 that may be located on high side device 105 (see FIG. 1). In some embodiments, first level shift transistor 203 may operate as a pull down transistor in a resistor pull up inverter.

In further embodiments, when level shift driver circuit 217 (see FIG. 2) supplies a high gate signal (L1_DR) to first level shift transistor 203, a first level shift node 305 gets pulled low which is inverted by high side logic and control circuit 153 (see FIG. 1). The inverted signal appears as a high state signal that turns on high side transistor 137 (see FIG. 1) which then pulls the voltage at switch node (Vsw) 145 close to rail voltage 135.

Conversely, when level shift driver circuit 217 (see FIG. 2) supplies a low gate signal to first level shift transistor 203, a first level shift node 305 gets pulled to a high logic state which is inverted by high side logic and control circuit 153 (see FIG. 1). The inverted signal appears as a low logic state signal that turns off high side transistor 125. This scheme may result in a non-inverted gate signal to high side transistor 125. In further embodiments, first level shift transistor 203 may be designed large enough to be able to pull down on first level shift node 305, but not so large that its drain to source and drain to substrate (i.e., the semiconductor substrate) capacitances induce false triggering of high side logic and control circuit 153.

In some embodiments pull up resistor 303 may instead be an enhancement-mode transistor, a depletion-mode transistor or a reference current source element. In further embodiments pull up resistor 303 may be coupled between the drain and the positive terminal of a floating supply (e.g., a bootstrap capacitor, discussed in more detail below) that is referenced to a different voltage rail than ground. In yet further embodiments there may be a first capacitance between the first output terminal (LS_NODE) 305 and switch node (Vsw) 145 (see FIG. 1) and a second capacitance between the first output terminal and ground, where the first capacitance is greater than the second capacitance. The first capacitance may be designed such that in response to a high dv/dt signal at switch node (Vsw) 145 (see FIG. 1), a large portion of the C*dv/dt current is allowed to conduct through the first capacitance ensuring that the voltage at first output terminal 305 tracks the voltage at the switch node (Vsw). In some embodiments shield capacitor 160 (see FIG. 1) may be designed to act as the first capacitor as described above. In further embodiments shield capacitor 160 (see FIG. 1) may be used to create capacitance between first output terminal 305 and switch node (Vsw) 145 (see FIG. 1) in half bridge power conversion circuit 100. In yet further embodiments, shield capacitor 160 (see FIG. 1) may also be used to minimize a capacitance between first output terminal 305 and substrate (i.e., the semiconductor substrate). More specifically, in some embodiments shield capacitor 160 may be created by adding a conductive shield layer to the device and coupling the layer to switch node (Vsw) 145. This structure may effectively create two capacitors. One capacitor is coupled between output terminal 305 and switch node (Vsw) 145, and the other is coupled between the switch node and the substrate. The capacitance between output terminal 305 and the substrate is thereby practically eliminated. In further embodiments shield capacitor 160 (see FIG. 1) may be constructed on the low side chip 103.

Logic, control and level shifting circuit 150 (see FIG. 2) may have other functions and circuits such as, but not limited to, a level shift driver circuit 217, a low side transistor drive circuit 120, a blanking pulse generator 223, a bootstrap transistor drive circuit 225 and an under voltage lock out (UVLO) circuit 227, as explained in separate figures with more detail below.

Figure 4:
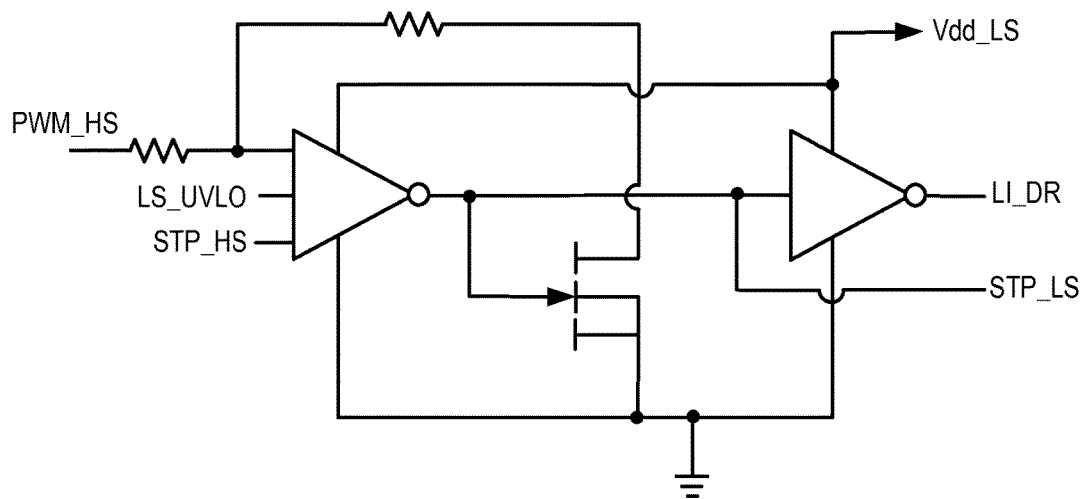
FIG. 4 is a schematic of the level shift driver circuit illustrated in FIG. 1.

Now referring to FIG. 4, level shift driver circuit 217 is shown in greater detail. In one embodiment level shift driver circuit 217 may include a first inverter 405 and a second inverter 410 in a sequential chain. In further embodiments, since level shift driver circuit 217 may be driving a small gate width first level shift transistor 203, there may be no need for a buffer stage.

In one embodiment, level shift driver circuit 217 is driven directly by the pulse-width modulated high side signal (PWM_HS) from the controller (not shown). In some embodiments the (PWM_HS) signal may be supplied by an external control circuit. In one embodiment the external control circuit may be an external controller that is in the same package with high side device 105, low side device 103, both devices, or packaged on its own. In further embodiments, level shift driver circuit 217 may also include logic that controls when the level shift driver circuit communicates with first level shift transistor 203 (see FIG. 3). In one embodiment an optional low side under voltage lock out signal (LS_UVLO) may be generated by an under voltage lock out circuit within level shift driver circuit 217. The low side under voltage lock out circuit can be used to turn off level shift driver circuit 217 if either (Vcc) or (Vdd) for the low side (Vdd_LS) go below a certain reference voltage, or a fraction of the reference voltage.

In further embodiments level shift driver circuit 217 may generate a shoot through protection signal for the low side transistor (STP_LS) that is used to prevent shoot through arising from overlapping gate signals on low side transistor 115 and high side transistor 125. The function of the (STP_LS) signal may be to ensure that low side driver circuit 120 (see FIG. 2) only communicates with the gate terminal of the low side transistor 115 when the gate signal to high side transistor 125 is low. In other embodiments, the output of first inverter 405 may be used to generate the shoot through protection signal (STP_LS) for the low side transistor 115.

In further embodiments, logic for UVLO and shoot-through protection may implemented by adding a multiple input NAND gate to first inverter 405, where the inputs to the NAND gate are the (PWM_HS), (LS_UVLO) and (STP_HS) signals. In yet further embodiments, first inverter 405 may only respond to the (PWM_HS) signal if both (STP_HS) and (LS_UVLO) signals are high. In further embodiments, the STP_HS signal may be generated from the low side gate driver block 120, as explained in separate figures with more detail.

Figure 5:
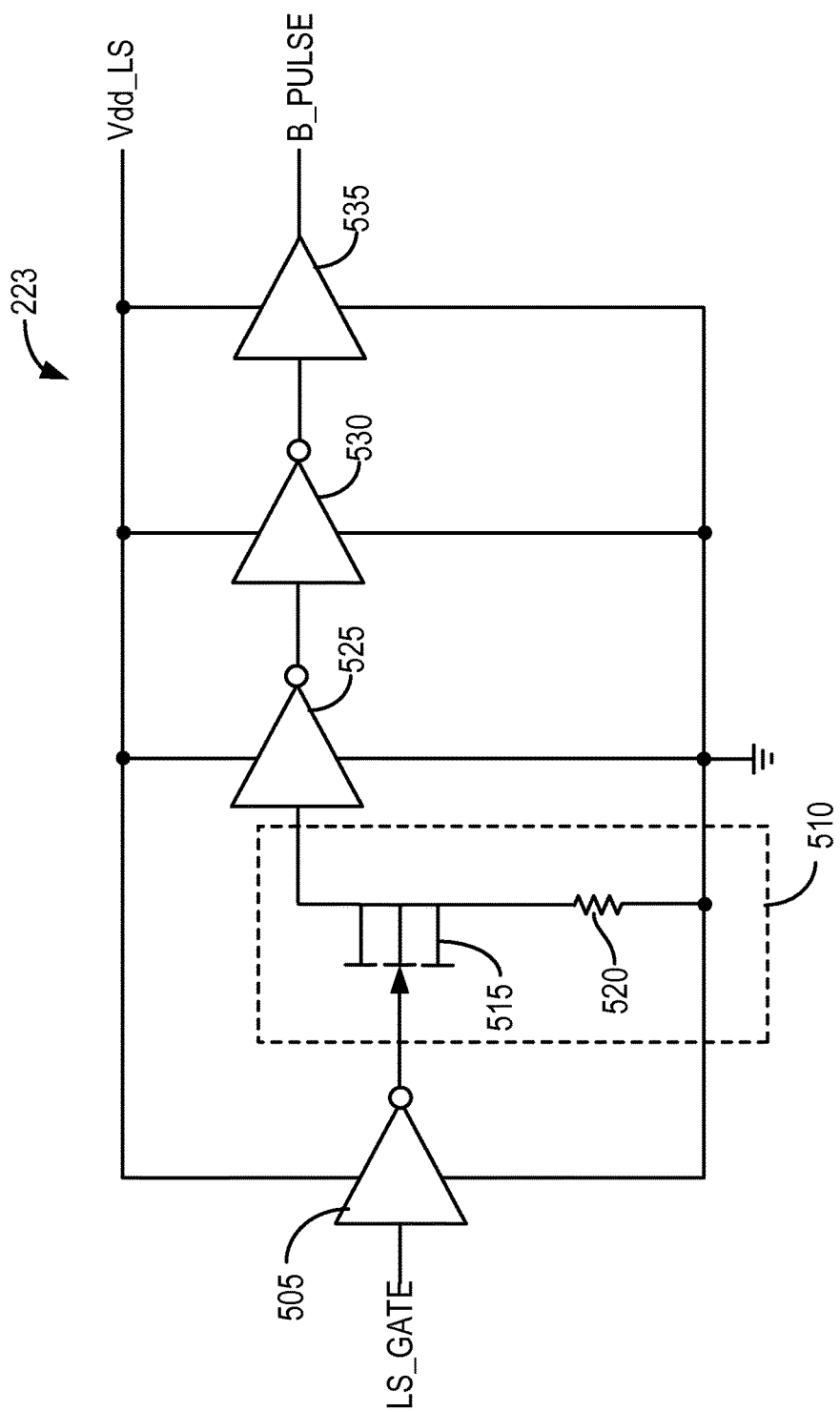
FIG. 5 is a schematic of the blanking pulse generator circuit illustrated in FIG. 1.

Now referring to FIG. 5, blanking pulse generator 223 may be used to generate a pulse signal that corresponds to the turn off transient of low side transistor 115. This pulse signal may then turn on second level shift transistor 205 for the duration of the pulse, which triggers a control circuit on high side device 105 (see FIG. 1) to prevent false pull down of first level shift node 305 voltage.

FIG. 5 illustrates a schematic of one embodiment of blanking pulse generator 223. In some embodiments a low side transistor 115 gate signal (LS_GATE) is fed as an input to blanking pulse generator 223. The (LS_GATE) signal is inverted by a first stage inverter 505, then sent through an RC pulse generator 510 to generate a positive pulse. In some embodiments an inverted signal may be needed because the pulse corresponds to the falling edge of the (LS_GATE) signal. A capacitor 515 in RC pulse generator 510 circuit may be used as a high pass filter allowing the dv/dt at its input to appear across resistor 520. Once the dv/dt vanishes at the input to the RC pulse generator 510, capacitor 515 may charge slowly through resistor 520, resulting in a slow decaying voltage waveform across the resistor. The pulse may then be sent through a second inverter 525, a third inverter 530 and a buffer 535 to generate a square wave pulse for the blanking pulse (B_PULSE) signal. The duration of the pulse may be determined by the value of capacitor 515 and resistor 520 in RC pulse generator 510. In some embodiments, capacitor 515 may be constructed using a drain to source shorted enhancement-mode GaN transistor.

Figure 6:
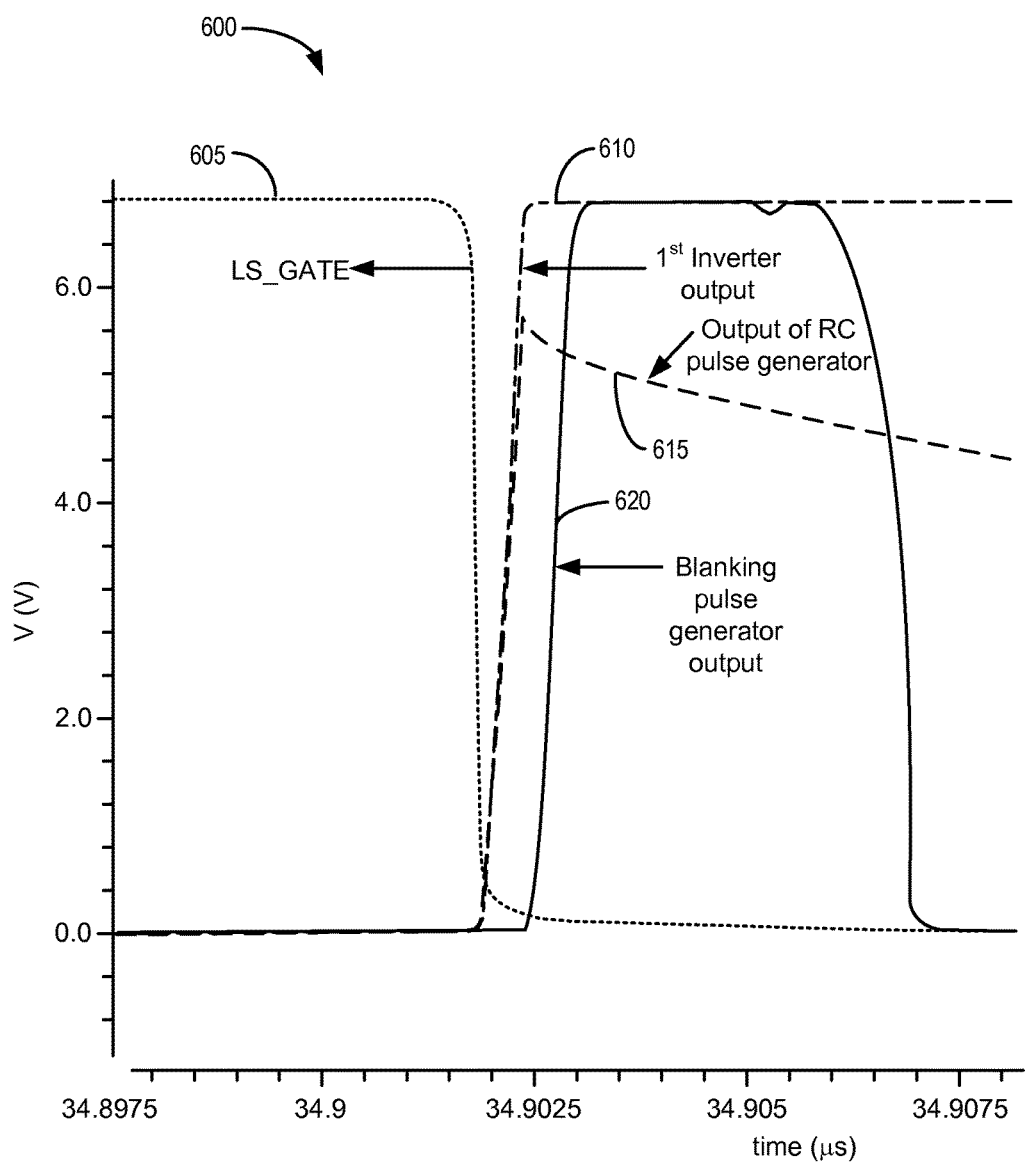
FIG. 6 is an example of waveforms within the blanking pulse generator illustrated in FIG. 5.

Now referring to FIG. 6, example waveforms 600 within blanking pulse generator 223 are illustrated for one embodiment. Trace 605 shows a falling edge of the low side gate pulse (LS_GATE). Trace 610 shows the rising edge of first stage inverter 505 output. Trace 615 shows the output of RC pulse generator 510 and trace 620 shows the resulting blanking pulse (B_PULSE) signal that is an output of blanking pulse generator 223.

Figure 7:
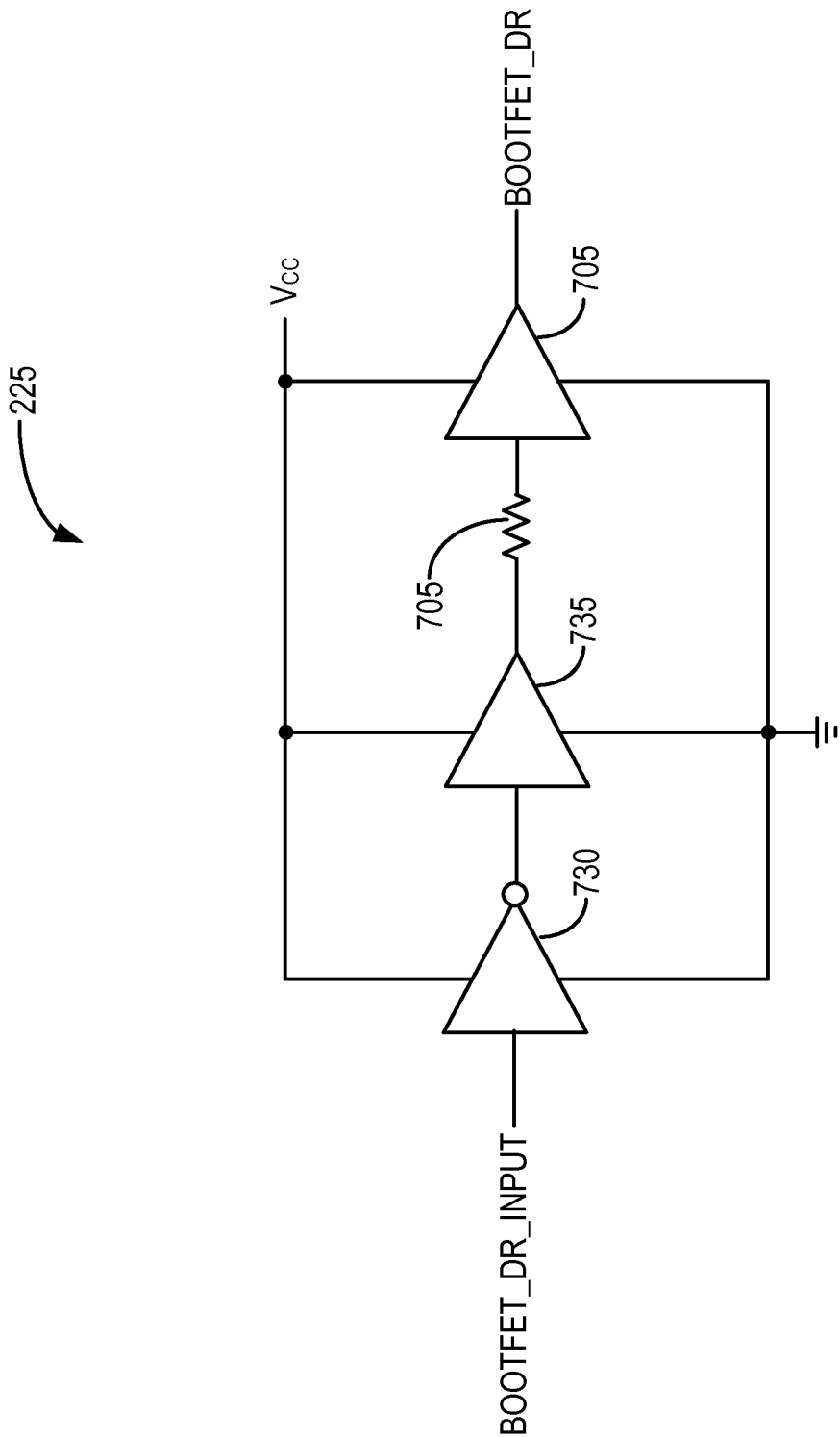
FIG. 7 is a schematic of the bootstrap transistor drive circuit illustrated in FIG. 1.

Now referring to FIG. 7, bootstrap transistor drive circuit 225 is illustrated in greater detail. Bootstrap transistor drive circuit 225 includes inverter 730, first buffer 735 and second buffer 745. Bootstrap transistor drive circuit 225 may receive the (BOOTFET_DR_IN) signal from low side driver circuit 120. The (BOOTFET_DR_IN) signal may be inverted with respect to the LS_GATE signal. Bootstrap transistor drive circuit 225 may be configured to provide a gate drive signal called (BOOTFET_DR) to a bootstrap transistor in bootstrap charging circuit 157 (see FIG. 1), discussed in more detail below. The (BOOTFET_DR) gate drive signal may be timed to turn on the bootstrap transistor when low side transistor 115 is turned on. Also, since bootstrap transistor drive circuit 225 is driven by (Vcc), the output of this circuit may have a voltage that goes from 0 volts in a low state to (Vcc)+6 volts in a high state. In one embodiment the bootstrap transistor is turned on after low side transistor 115 is turned on, and the bootstrap transistor is turned off before the low side transistor is turned off In some embodiments, the turn on transient of the (BOOTFET_DR) signal may be delayed by the introduction of a series delay resistor 705 to the input of second buffer 745, that may be a gate of a transistor in a final buffer stage. In further embodiments, the turn off transient of low side transistor 115 (see FIG. 1) may be delayed by the addition of a series resistor to a gate of a final pull down transistor in low side drive circuit 120. In one embodiment, one or more capacitors may be used in bootstrap transistor drive circuit 225, and support voltages of the order of (Vcc) which, for example, could be 20 volts, depending on the end user requirements and the design of the circuit. In some embodiments the one or more capacitors may be made with a field dielectric to GaN capacitor instead of a drain to source shorted enhancement-mode transistor.

Figure 8:
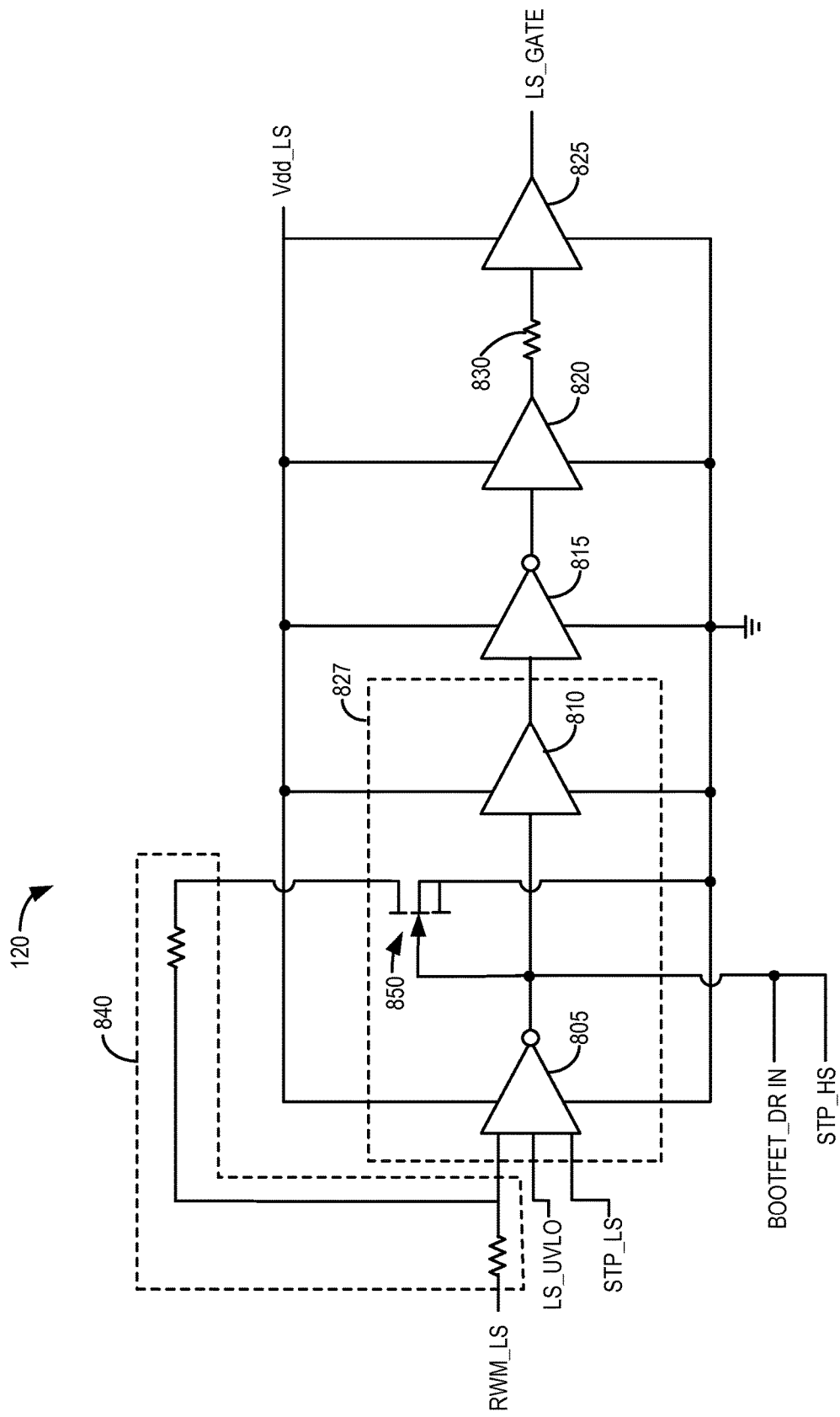
FIG. 8 is a block diagram for the low side transistor drive circuit illustrated in FIG. 1

Now referring to FIG. 8 a block diagram for low side transistor drive circuit 120 is illustrated. Low side transistor drive circuit 120 may have a first inverter 805, a buffer 810, a second inverter 815, a second buffer 820 and a third buffer 825. Third buffer 825 may provide the (LS_GATE) signal to low side transistor 115 (see FIG. 1). In some embodiments two inverter/buffer stages may be used because the input to the gate of low side transistor 115 (see FIG. 1) may be synchronous with (Vin). Thus, (Vin) in a high state may correspond to (Vgate) of low side transistor 115 in a high state and vice versa.

In further embodiments, certain portions of low side drive circuit 120 may have an asymmetric hysteresis. Some embodiments may include asymmetric hysteresis using a resistor divider 840 with a transistor pull down 850.

Further embodiments may have multiple input NAND gates for the (STP_LS) signal (shoot through protection on low side transistor 115). In one embodiment, low side drive circuit 120 may receive the shoot through protection signal (STP_LS) from level shift driver circuit 217. The purpose of the (STP_LS) signal may be similar to the (STP_HS) signal described previously. The (STP_LS) signal may ensure that low side transistor drive circuit 120 does not communicate with gate 117 (see FIG. 1) of low side transistor 115 when level shift driver circuit 217 output is at a high state. In other embodiments, the output of the first inverter stage 805 may be used as the (STP_HS) signal for level shift drive circuit 217 and the (BOOTFET_DR_IN) signal for bootstrap transistor drive circuit 225.

In some embodiments, low side transistor drive circuit 120 may employ multiple input NAND gates for the (LS_UVLO) signal received from UVLO circuit 227 (see FIG. 2). Further embodiments may employ a turn off delay resistor that may be in series with a gate of a final pull down transistor in final buffer stage 825. The delay resistor may be used in some embodiments to make sure the bootstrap transistor is turned off before low side transistor 115 turns off.

Figure 9:
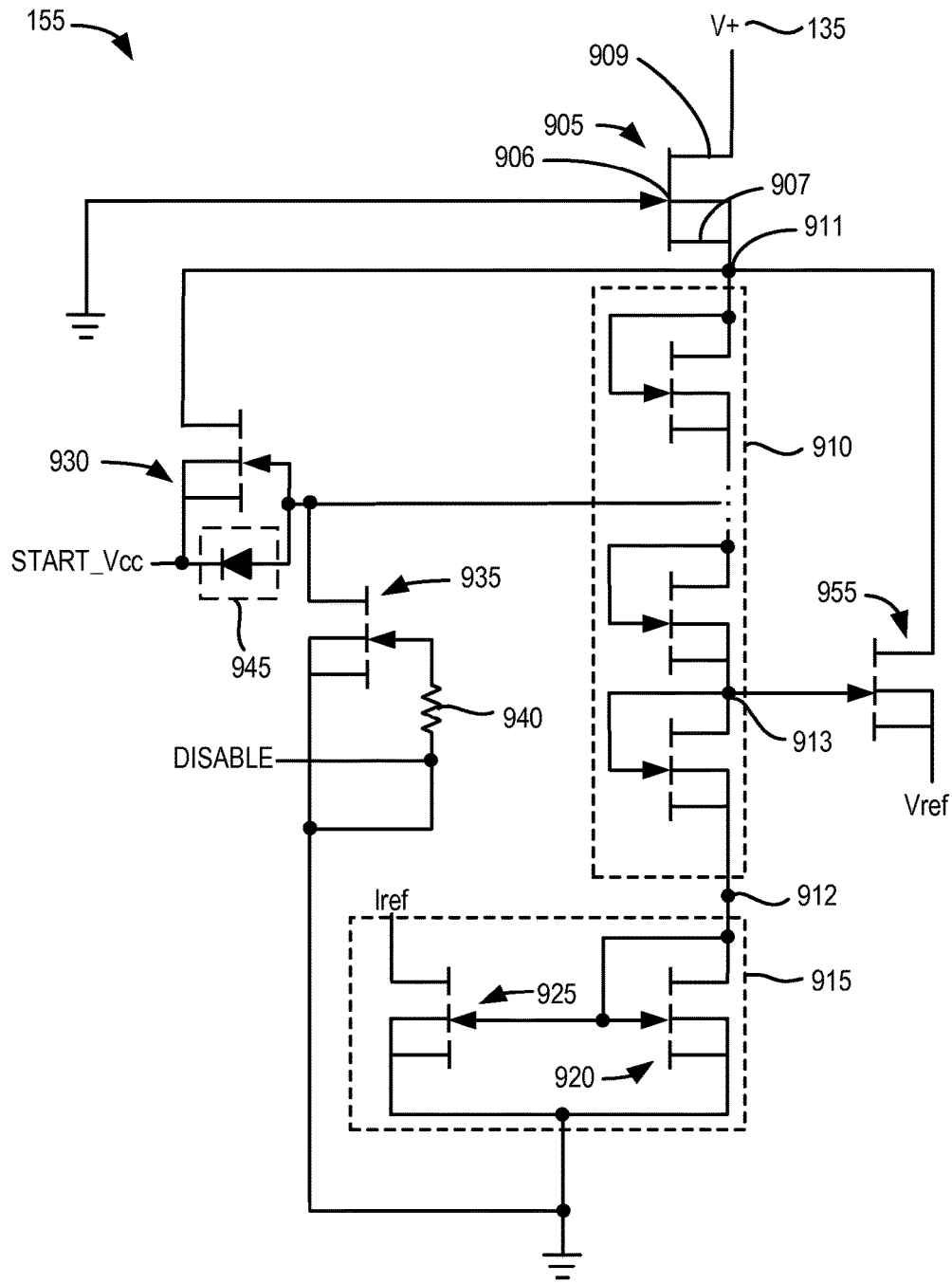
FIG. 9 is a schematic of the startup circuit illustrated in FIG. 1.

Now referring to FIG. 9, startup circuit 155 is illustrated in greater detail. Startup circuit 155 may be designed to have a multitude of functionalities as discussed in more detail below. Primarily, startup circuit 155 may be used to provide an internal voltage (in this case START_Vcc) and provide enough current to support the circuits that are being driven by (Vcc). This voltage may remain on to support the circuits until (Vcc) is charged up to the required voltage externally from rail voltage 135 (V+). Startup circuit 155 may also provide a reference voltage (Vref) that may be independent of the startup voltage, and a reference current sink (Iref).

In one embodiment, a depletion-mode transistor 905 may act as the primary current source in the circuit. In further embodiments depletion-mode transistor 905 may be formed by a metal layer disposed over a passivation layer. In some embodiments, depletion-mode transistor 905 may use a high voltage field plate (typically intrinsic to any high-voltage GaN technology) as the gate metal. In further embodiments a field dielectric may act as the gate insulator. The resultant gated transistor may be a depletion-mode device with a high channel pinch-off voltage (Vpinch) (i.e., pinch-off voltage is proportional to the field dielectric thickness). Depletion-mode transistor 905 may be designed to block relatively high voltages between its drain (connected to V+) and its source. Such a connection may be known as a source follower connection. Depletion-mode transistor 905 may have a gate 906 coupled to ground, a source 907 coupled to a first node 911 and a drain 909 coupled to voltage source 135.

In further embodiments a series of identical diode connected enhancement-mode low-voltage transistors 910 may be in series with depletion-mode transistor 905. Series of identical diode connected enhancement-mode low-voltage transistors 910 may be connected in series between a first node 911 and a second node 912. One or more intermediate nodes 913 may be disposed between each of series of identical diode connected enhancement-mode low-voltage transistors 910. The width to length ratio of the transistors may set the current drawn from (V+) as well as the voltage across each diode. To remove threshold voltage and process variation sensitivity, series of identical diode connected enhancement-mode low-voltage transistors 910 may be designed as large channel length devices. In some embodiments, series of identical diode connected enhancement-mode low-voltage transistors 910 may be replaced with one or more high value resistors.

In further embodiments, at the bottom end of series of identical diode connected enhancement-mode low-voltage transistors 910, a current mirror 915 may be constructed from two enhancement-mode low-voltage transistors and used to generate a reference current sink (Iref). First current mirror transistor 920 may be diode connected and second current mirror transistor 925 may have a gate connected to the gate of the first current mirror transistor. The sources of first and second current mirror transistors 920, 925, respectively may be coupled and tied to ground. A drain terminal of first current mirror transistor 920 may be coupled to second junction 912 and a source terminal of second current mirror transistor 925 may be used as a current sink terminal. This stack of current mirror 915 and series of identical diode connected enhancement-mode low-voltage transistors 910 may form what is known as a "source follower load" to depletion-mode transistor 905.

In other embodiments, when gate 906 of depletion-mode transistor 905 is tied to ground, source 907 of the depletion-mode transistor may assume a voltage close to (Vpinch) when current is supplied to the "source follower load". At the same time the voltage drop across diode connected transistor 920 in current mirror 915 may be close to the threshold voltage of the transistor (Vth). This condition implies that the voltage drop across each of series of identical diode connected enhancement-mode low-voltage transistors 910 may be equal to (Vpinch−Vth)/n where 'n' is the number of diode connected enhancement-mode transistors between current mirror 915 and depletion-mode transistor 905.

For example, if the gate of a startup transistor 930 is connected to the third identical diode connected enhancement-mode low-voltage transistor from the bottom, the gate voltage of the startup transistor may be 3*(Vpinch−Vth)/n+Vth. Therefore, the startup voltage may be 3*(Vpinch−Vth)/n+Vth−Vth=3*(Vpinch−Vth)/n. As a more specific example, in one embodiment where (Vpinch)=40 volts, (Vth)=2 volts where n=6 and (Vstartup)=19 volts.

In other embodiments, startup circuit 155 may generate a reference voltage signal (Vref). In one embodiment, the circuit that generates (Vref) may be similar to the startup voltage generation circuit discussed above. A reference voltage transistor 955 may be connected between two transistors in series of identical diode connected enhancement-mode low-voltage transistors 910. In one embodiment (Vref)=(Vpinch−Vth)/n.

Figure 10:
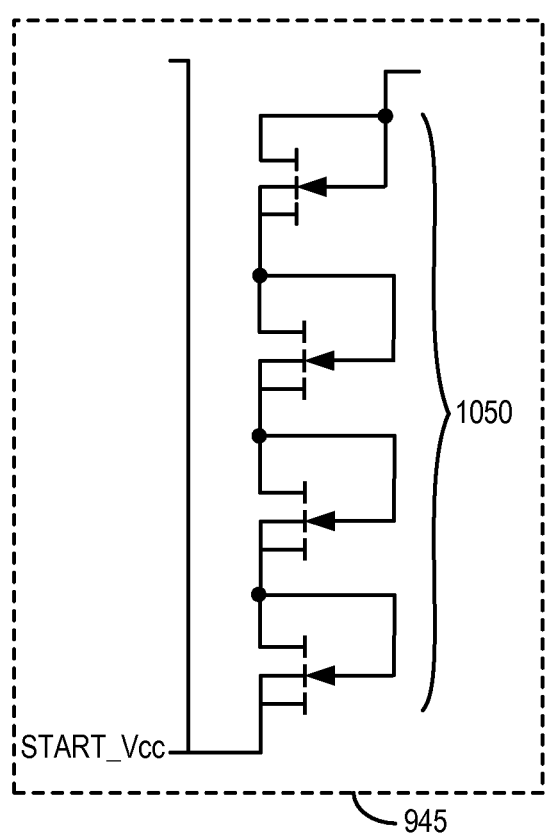
FIG. 10 is series of diode connected GaN-based enhancement-mode transistors that may be used as a diode clamp in the schematic of FIG. 9.

In further embodiments, a disable pull down transistor 935 may be connected across the gate to source of startup transistor 930. When the disable signal is high, startup transistor 930 will be disabled. A pull down resistor 940 may be connected to the gate of disable transistor 935 to prevent false turn on of the disable transistor. In other embodiments a diode clamp 945 may be connected between the gate and the source terminals of startup transistor 930 to ensure that the gate to source voltage capabilities of the startup transistor are not violated during circuit operation (i.e., configured as gate overvoltage protection devices). In some embodiments, diode clamp 945 may be made with a series of diode connected GaN-based enhancement-mode transistors 1050, as illustrated in FIG. 10.

Figure 11:
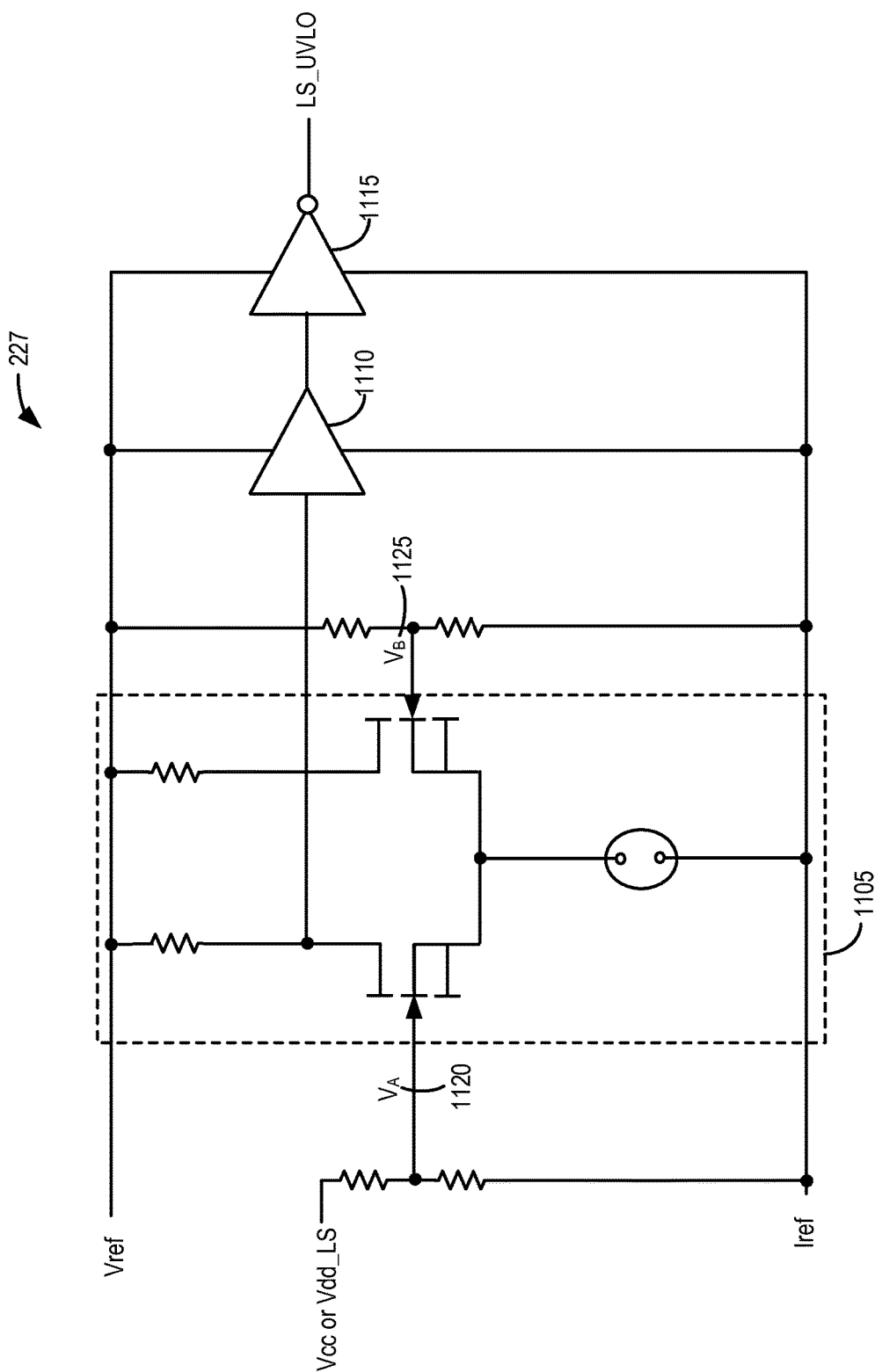
FIG. 11 is a schematic of the UVLO circuit illustrated in FIG. 1.

Now referring to FIG. 11, UVLO circuit 227 is illustrated in greater detail. In some embodiments, UVLO circuit 227 may have a differential comparator 1105, a down level shifter 1110 and an inverter 1115. In further embodiments, UVLO circuit 227 may use (Vref) and (Iref) generated by startup circuit 155 (see FIG. 9) in a differential comparator/down level shifter circuit to generate the (LS_UVLO) signal that feeds into level shift driver circuit 217 (see FIG. 2) and low side transistor driver circuit 120. In some embodiments UVLO circuit 227 can also be designed to have asymmetric hysteresis. In further embodiments the output of UVLO circuit 227 may be independent of threshold voltage. This may be accomplished by choosing a differential comparator with a relatively high gain. In one embodiment the gain can be increased by increasing the value of the current source and the pull up resistors in the differential comparator. In some embodiments the limit on the current and resistor may be set by (Vref).

In other embodiments voltages (VA) and (VB), 1120 and 1125, respectively, may be proportional to (Vcc) or (Vdd_LS) and (Vref) as dictated by the resistor divider ratio on each input. When (VA) 1120>(VB) 1125 the output of the inverting terminal goes to a low state. In one specific embodiment, the low state=(Vth) since the current source creates a source follower configuration. Similarly when (VA) 1120<(VB) 1125 the output goes to a high state (Vref). In some embodiments down level shifter 1110 may be needed because the low voltage needs to be shifted down by one threshold voltage to ensure that the low input to the next stage is below (Vth). The down shifted output may be inverted by a simple resistor pull up inverter 1115. The output of inverter 1115 is the (LS_UVLO) signal.

Figure 12:
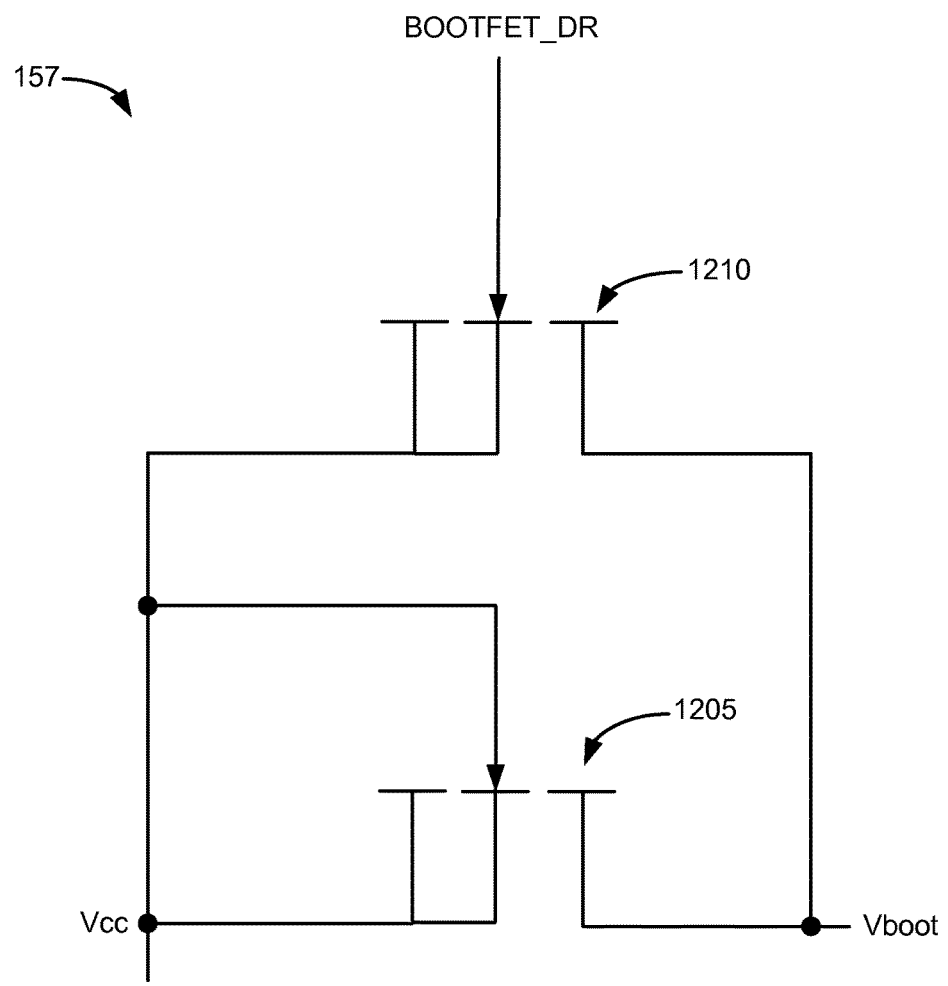
FIG. 12 is a schematic of the bootstrap capacitor charging circuit illustrated in FIG. 1.

Now referring to FIG. 12, bootstrap capacitor charging circuit 157 is illustrated in greater detail. In one embodiment, bootstrap diode and transistor circuit 157 may include a parallel connection of a high voltage diode connected enhancement-mode transistor 1205 and a high voltage bootstrap transistor 1210. In further embodiments, high voltage diode connected enhancement-mode transistor 1205 and high voltage bootstrap transistor 1210 can be designed to share the same drain finger. In some embodiments the (BOOTFET_DR) signal may be derived from bootstrap transistor drive circuit 225 (see FIG. 2). As discussed above, high voltage bootstrap transistor 1210 may be turned on coincident with the turn on of low side transistor 115 (see FIG. 1).

Figure 13:
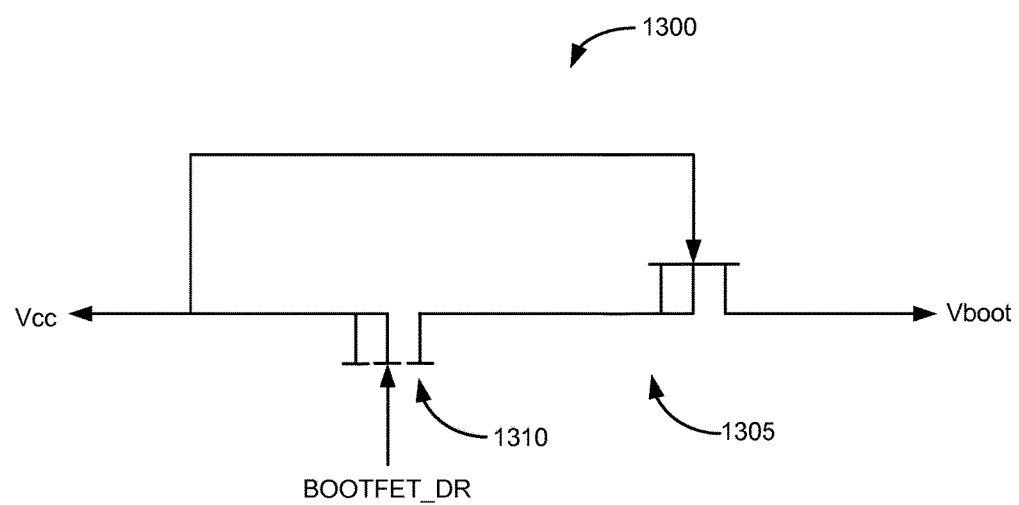
FIG. 13 is a schematic of an alternative bootstrap capacitor charging circuit as compared to the circuit illustrated in FIG. 12.

Now referring to FIG. 13, an alternative bootstrap diode and transistor circuit 1300 may be used in place of bootstrap diode and transistor circuit 157 discussed above in FIG. 12. In the embodiment illustrated in FIG. 13, a depletion-mode device 1305 cascoded by an enhancement-mode low voltage GaN device 1310 may be connected as illustrated in schematic 1300. In another embodiment, a gate of depletion-mode device 1305 can be connected to ground to reduce the voltage stress on cascoded enhancement-mode device 1310, depending upon the pinch-off voltage of the depletion-mode device.

High Side Device

Figure 14:
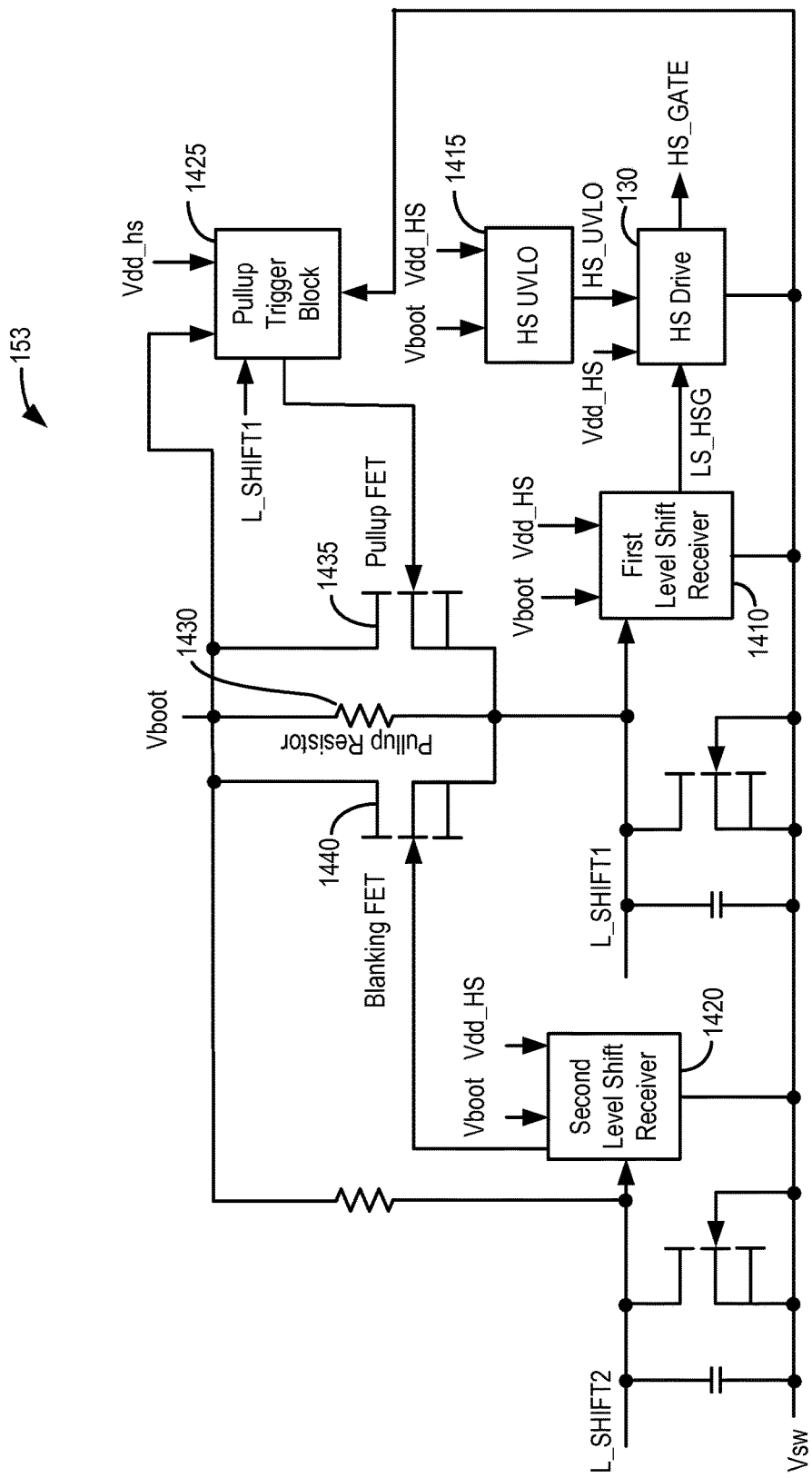
FIG. 14 is a schematic of the high side logic and control circuit illustrated in FIG. 1.

Now referring to FIG. 14, high side logic and control circuit 153 is illustrated in greater detail. In one embodiment, high side driver 130 receives inputs from first level shift receiver 1410 and high side UVLO circuit 1415 and sends a (HS_GATE) signal to high side transistor 125 (see FIG. 1). In yet further embodiments, a pull up trigger circuit 1425 is configured to receive the (LSHIFT_1) signal and control pull up transistor 1435. In some embodiments, second level shift receiver circuit 1420 is configured to control blanking transistor 1440. Both the pull up transistor 1435 and blanking transistor 1440 may be connected in parallel with pull up resistor 1430. Each circuit within high side logic and control circuit 153 is discussed below, and in some cases is shown in more detail in FIGS. 16-20.

Figure 15:
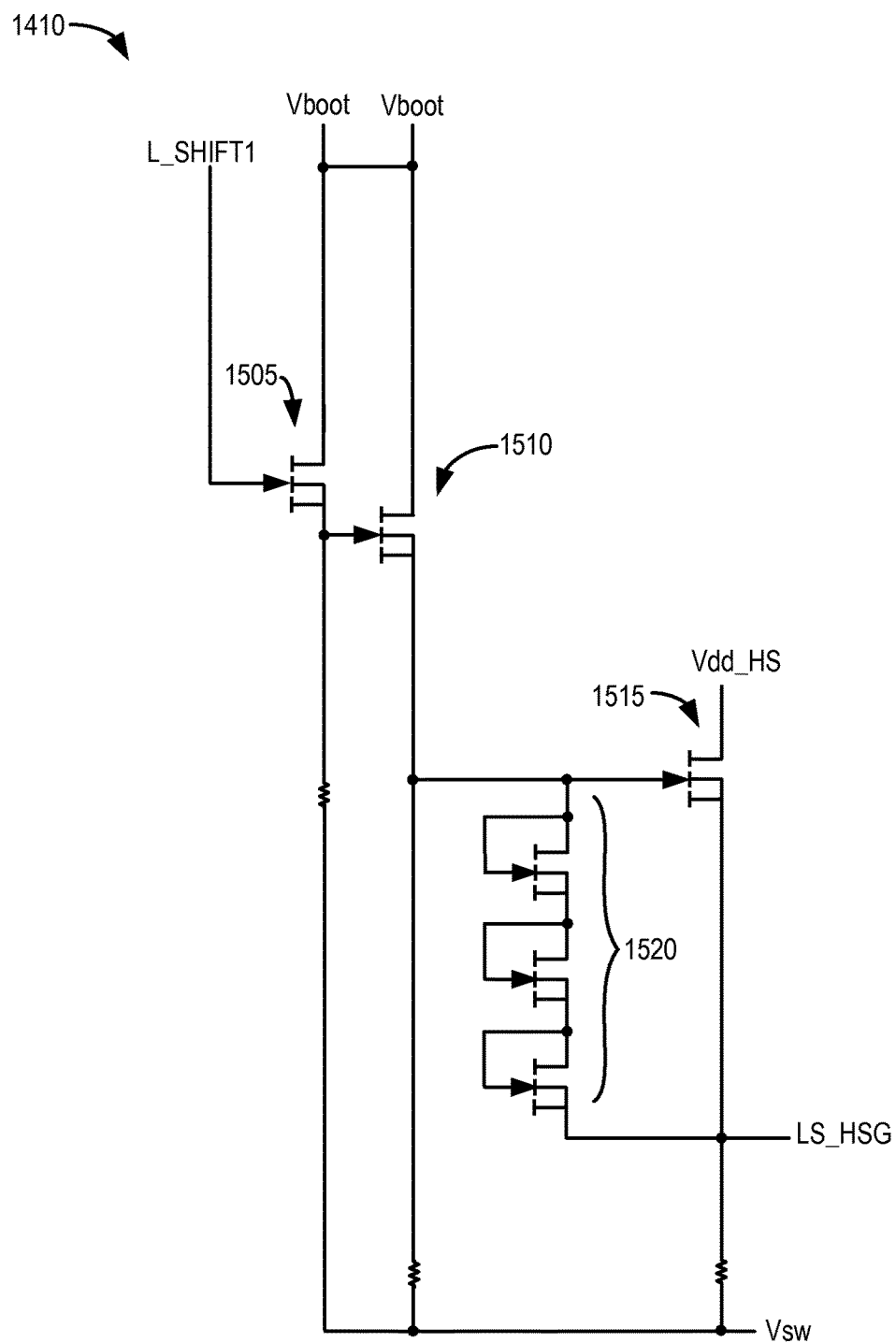
FIG. 15 is a schematic of the first level shift receiver circuit illustrated in FIG. 14.

Now referring to FIG. 15, first level shift receiver 1410 is illustrated in greater detail. In some embodiments, first level shift receiver 1410 may convert the (L_SHIFT1) signal to an (LS_HSG) signal that can be processed by high side transistor driver 130 (see FIG. 14) to drive high side transistor 125 (see FIG. 1). In further embodiments, first level shift receiver 1410 may have three enhancement-mode transistors 1505, 1510, 1515 employed in a multiple level down shifter and a plurality of diode connected transistors 1520 acting as a diode clamp, as discussed in more detail below.

In one embodiment, first level shift receiver 1410 may down shift the (L_SHIFT1) signal by 3*Vth (e.g., each enhancement-mode transistor 1505, 1510, 1515 may have a gate to source voltage close to Vth). In some embodiments the last source follower transistor (e.g., in this case transistor 1515) may have a three diode connected transistor clamp 1520 across its gate to source. In further embodiments this arrangement may be used because its source voltage can only be as high as (Vdd_HS) (i.e., because its drain is connected to Vdd_HS) while its gate voltage can be as high as V (L_SHIFT1)–2*Vth. Thus, in some embodiments the maximum gate to source voltage on last source follower transistor 1515 may be greater than the maximum rated gate to source voltage of the device technology. The output of final source follower transistor 1515 is the input to high side transistor drive 130 (see FIG. 1), (i.e., the output is the LS_HSG signal). In further embodiments fewer or more than three source follower transistors may be used. In yet further embodiments, fewer or more than three diode connected transistors may be used in clamp 1520.

Figure 16:
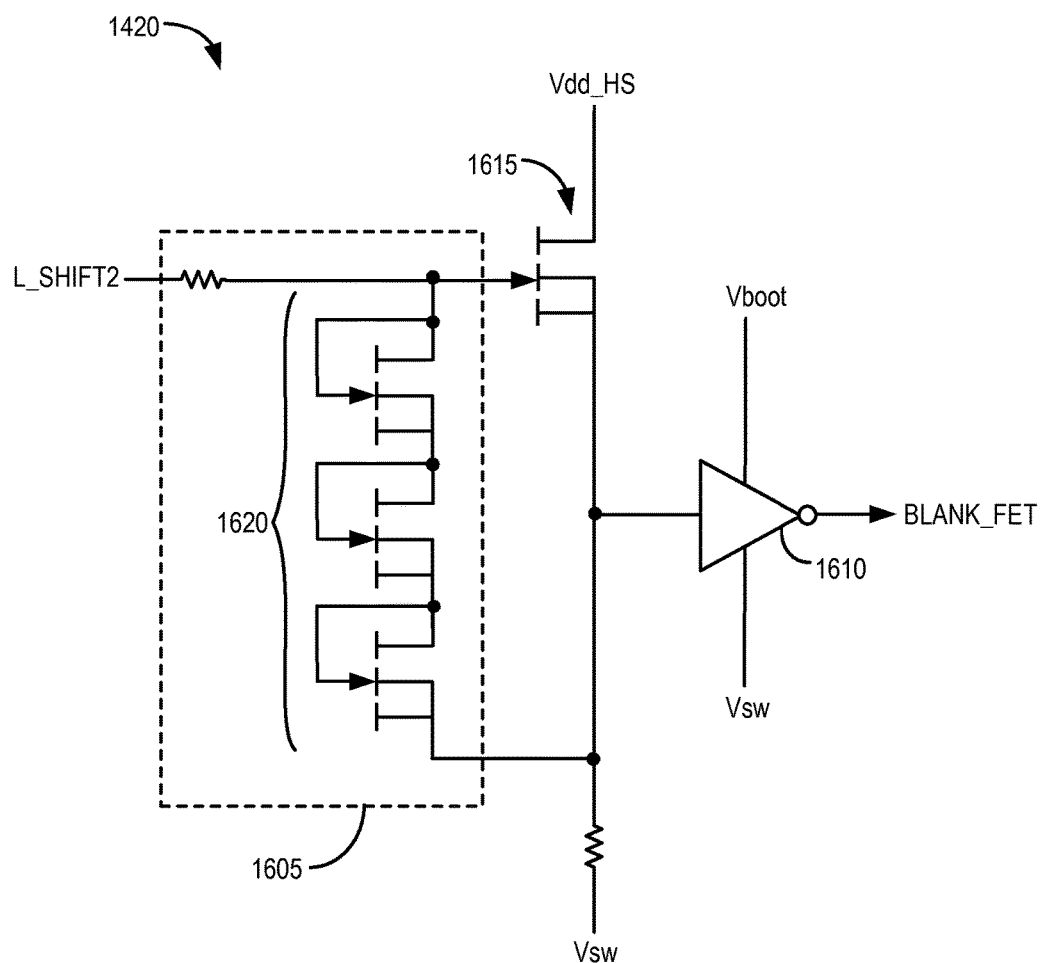
FIG. 16 is a schematic of the second level shift receiver circuit illustrated in FIG. 14.

Now referring to FIG. 16, second level shift receiver 1420 is illustrated in greater detail. In one embodiment, second level shift receiver 1420 may have a down level shift circuit 1605 and an inverter circuit 1610. In some embodiments second level shift receiver 1420 may be constructed in a similar manner as first level shift receiver 1410 (see FIG. 15), except the second level shift receiver may have only one down level shifting circuit (e.g., enhancement-mode transistor 1615) and a follow on inverter circuit 1610. In one embodiment, down level shift circuit 1605 may receive the (L_SHIFT2) signal from second level shift transistor 205 (see FIG. 2). In one embodiment, inverter circuit 1610 may be driven by the (Vboot) signal, and the gate voltage of the pull up transistor of the inverter may be used as the (BLANK_FET) signal driving blanking transistor 1440 (see FIG. 14). In some embodiments the voltage may go from 0 volts in a low state to (Vboot+0.5*(Vboot–Vth)) in a high state. Similar to first level shift receiver 1410, second level shift receiver 1420 may have a diode connected transistor clamp 1620 across the gate to source of source follower transistor 1615. In other embodiments, clamp 1620 may include fewer or more than three diode connected transistors.

Figure 17:
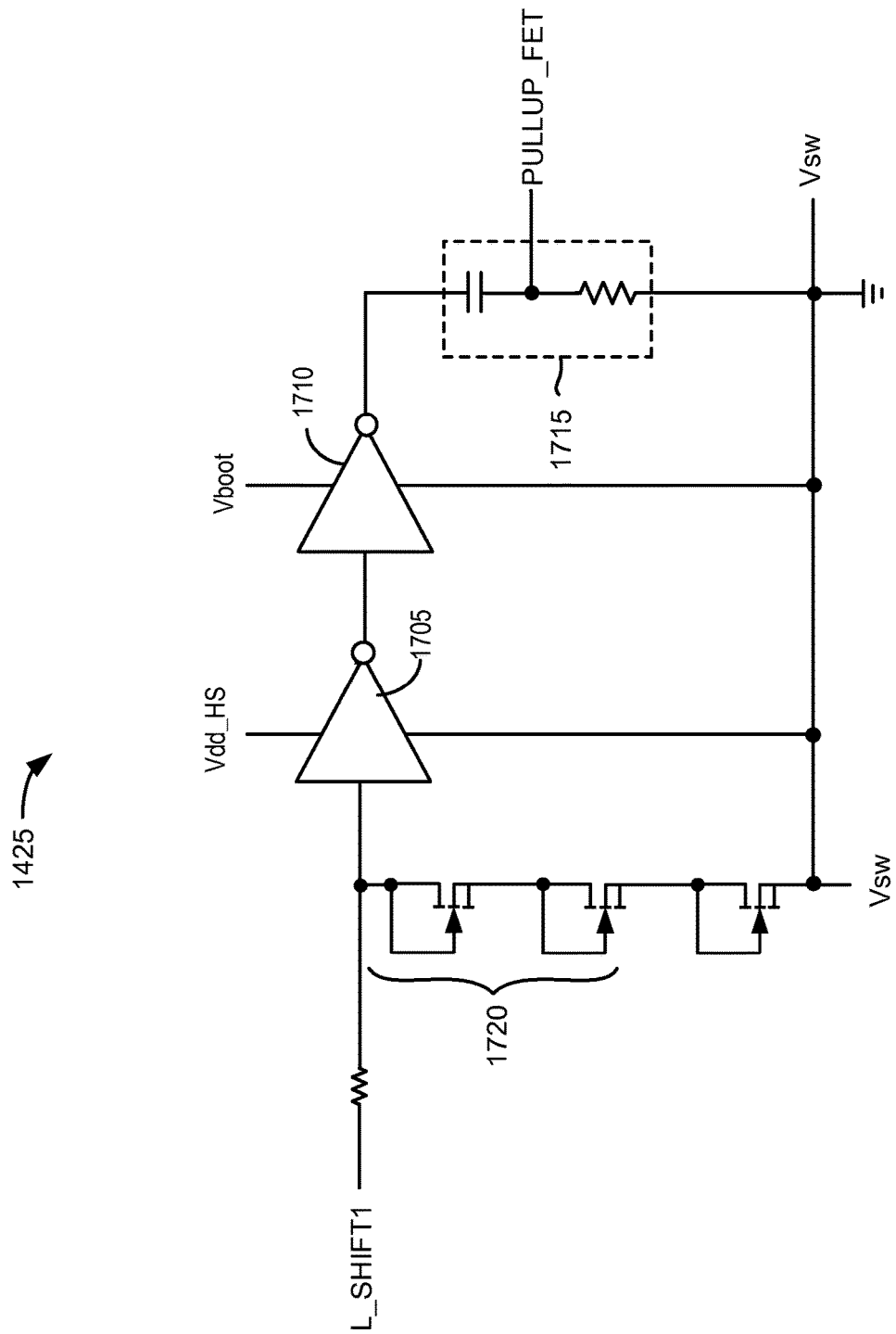
FIG. 17 is a schematic of the pull up trigger circuit illustrated in FIG. 14.

Now referring to FIG. 17, pull up trigger circuit 1425 is illustrated in greater detail. In one embodiment, pull up trigger circuit 1425 may have a first inverter 1705, a second inverter 1710, an RC pulse generator 1715 and a gate to source clamp 1720. In some embodiments pull up trigger circuit 1425 may receive the (L_SHIFT1) signal as an input, and in response, generate a pulse as soon as the (L_SHIFT1) voltage transitions to approximately the input threshold of first inverter 1705. The generated pulse may be used as the (PULLUP_FET) signal that drives pull up transistor 1435 (see FIG. 14). Second inverter 1710 may be driven by (Vboot) instead of (Vdd_HS) because pull up transistor 1435 gate voltage may need to be larger than the (L_SHIFT1) signal voltage.

Figure 18:
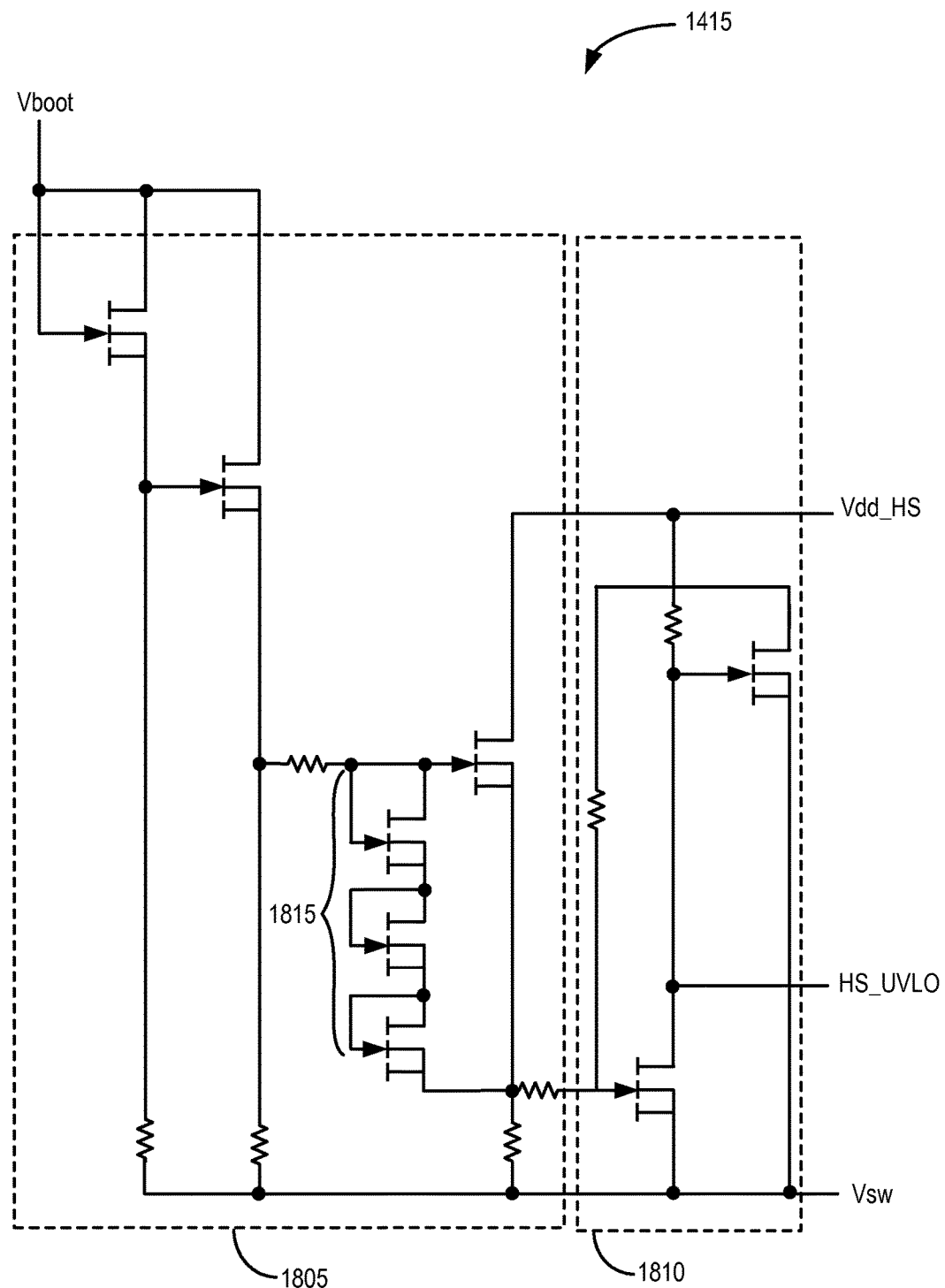
FIG. 18 is a schematic of the high side UVLO circuit illustrated in FIG. 14.

Now referring to FIG. 18, high side UVLO circuit 1415 is illustrated in greater detail. In one embodiment, high side UVLO circuit 1415 may have down level shifter 1805, a resistor pull up inverter with asymmetric hysteresis 1810 and a gate to source clamp 1815. In further embodiments, the (HS_UVLO) signal generated by high side UVLO circuit 1415 may aid in preventing circuit failure by turning off the (HS_GATE) signal generated by high side drive circuit 130 (see FIG. 14) when bootstrap capacitor 110 voltage goes below a certain threshold. In some embodiments, bootstrap capacitor 110 voltage (Vboot) (i.e., a floating power supply voltage) is measured, and in response, a logic signal is generated and combined with the output signal (LS_HSG) from first level shift receiver 1410 which is then used as the input to the high side gate drive circuit 130. More specifically, in this embodiment, for example, the UVLO circuit is designed to engage when (Vboot) reduces to less than 4*Vth above switch node (Vsw) 145 voltage. In other embodiments a different threshold level may be used.

In further embodiments, high side UVLO circuit 1415 may down shift (Vboot) in down level shifter 1805 and transfer the signal to inverter with asymmetric hysteresis 1810. The output of inverter with asymmetric hysteresis 1810 may generate the (HS_UVLO) signal which is logically combined with the output from the first level shift receiver 1410 to turn off high side transistor 125 (see FIG. 1). In some embodiments the hysteresis may be used to reduce the number of self-triggered turn on and turn off events of high side transistor 125 (see FIG. 1), that may be detrimental to the overall performance of half bridge circuit 100.

Figure 19:
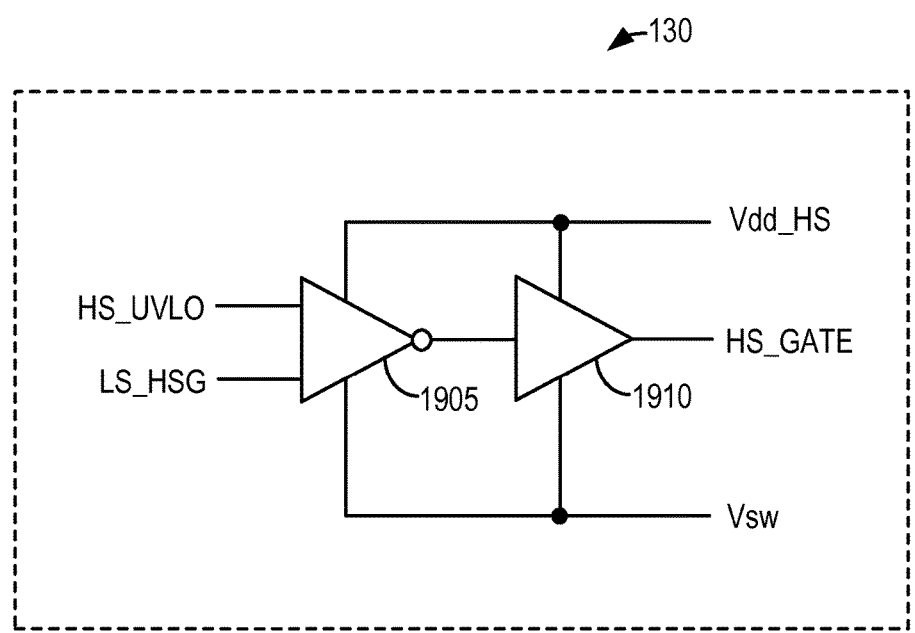
FIG. 19 is a schematic of the high side transistor driver circuit illustrated in FIG. 14.

Now referring to FIG. 19, high side transistor driver 130 is illustrated in greater detail. High side transistor driver 130 may have a first inverter stage 1905 followed by a high side drive stage 1910. First inverter stage 1905 may invert the down shifted (LS_HSG) signal received from level shift 1 receiver 1410 (see FIG. 15). The downshifted signal may then be sent through high side drive stage 1910. High side drive stage 1910 may generate the (HS_GATE) signal to drive high side transistor 125 (see FIG. 1). In further embodiments first inverter stage 1905 may contain a two input NOR gate that may ensure high side transistor 125 (see FIG. 1) is turned off when the (HS_UVLO) signal is in a high state.

Figure 20:
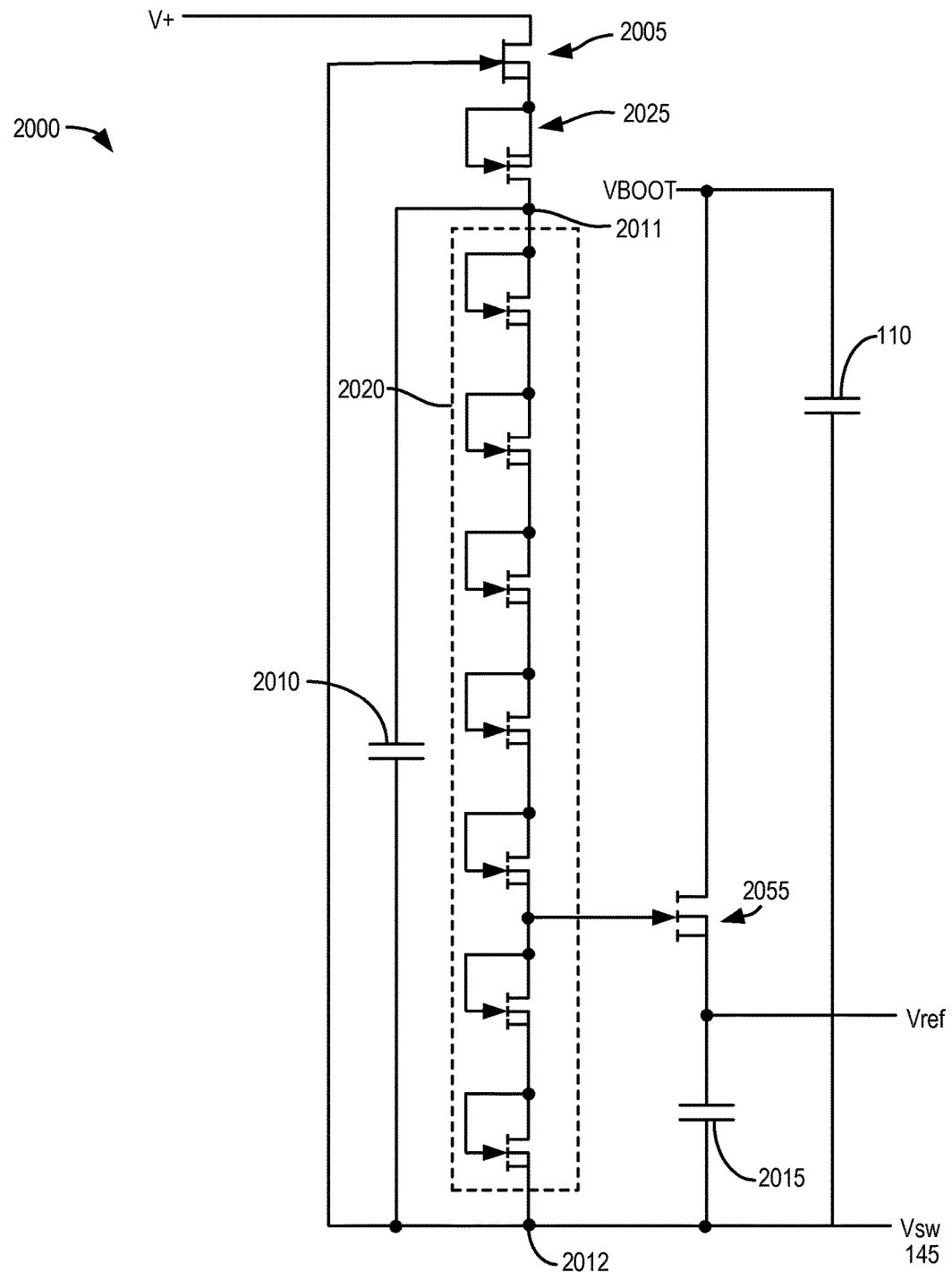

Now referring to FIG. 20, a reference voltage generation circuit 2000 may be used, to generate a high side reference voltage from a supply rail. Such a circuit maybe placed on the high side GaN device 105 for generating internal power supplies which are referenced to the switch node voltage 145. In some embodiments, circuit 2000 may be similar to startup circuit 155 in FIG. 9. One difference in circuit 2000 may be the addition of a source follower capacitor 2010 connected between first node 2011 and second node 2012. In some embodiments, source follower capacitor 2010 may be needed to ensure that a well regulated voltage, which does not fluctuate with dv/dt appearing at the switch node (Vsw) 145, develops between the first node 2011 and the second node 2012. In other embodiments a reference voltage capacitor 2015 may be connected between a source of reference voltage transistor 2055 and second node 2012. In some embodiments the drain of the reference voltage transistor 2055 may be connected to the (Vboot) node. In some embodiments, reference voltage capacitor 2015 may be needed to ensure that (Vref) is well regulated and does not respond to high dv/dt conditions at switch node (Vsw) 145 (see FIG. 1). In yet further embodiments, another difference in circuit 2000 may be that second node 2012 may be coupled to a constantly varying voltage, such as switch node (Vsw) 145 (see FIG. 1), rather than a ground connection through a current sink circuit 915 (see FIG. 9). In yet further embodiments (Vref) can be used as (Vdd_HS) in the half bridge circuit 100.

Figure 21:
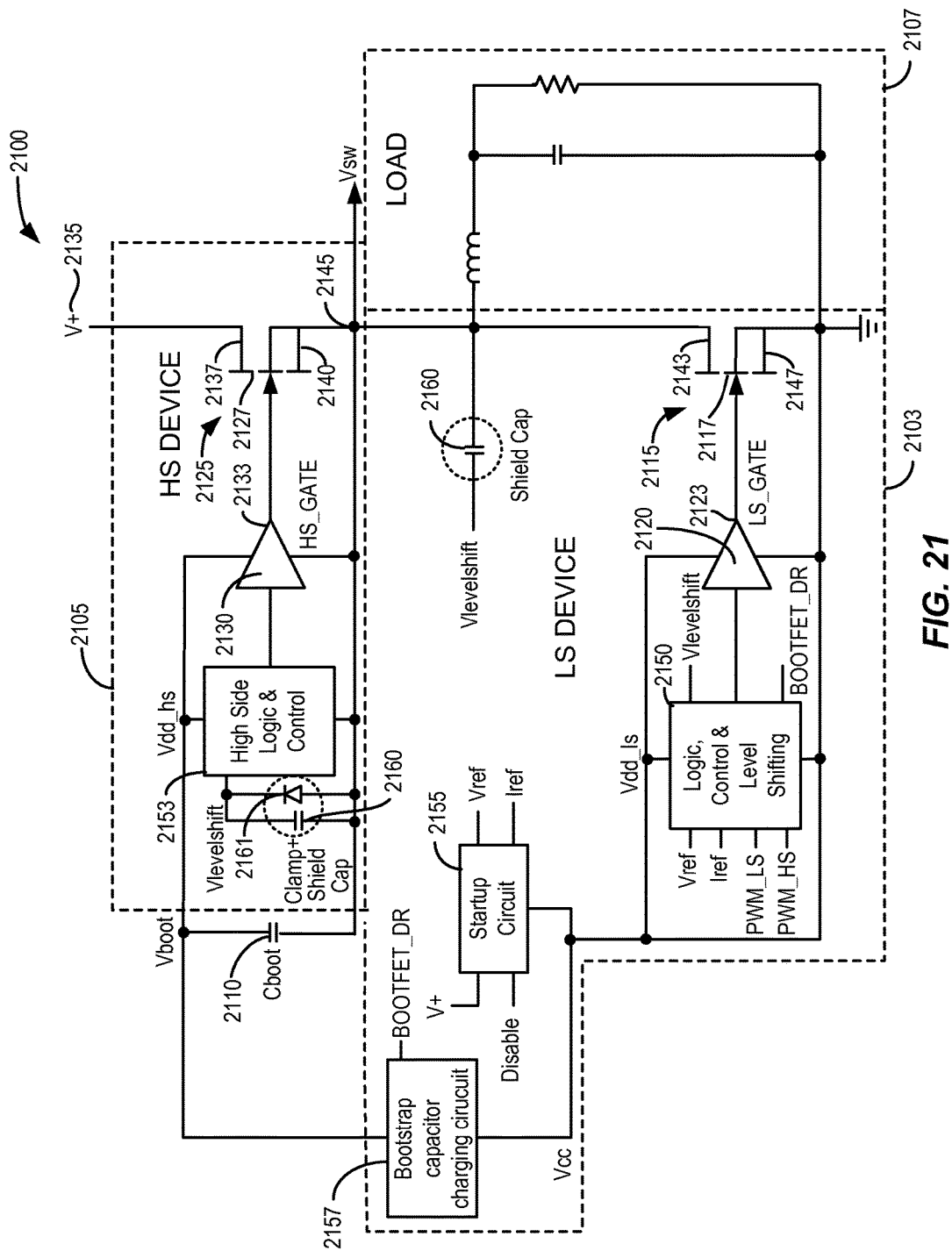
FIG. 21 is a simplified schematic of a half bridge power conversion circuit according to another embodiment of the invention.

Another difference in circuit 2000 may be the addition of a high-voltage diode connected transistor 2025 (i.e., the gate of the transistor is coupled to the source of the transistor) coupled between depletion-mode transistor 2005 and series of identical diode connected enhancement-mode low-voltage transistors 2020. More specifically, high-voltage diode connected transistor 2025 may have source coupled to the source of depletion-mode transistor 2005, a drain coupled to first node 2011 and a gate coupled to its source. High-voltage diode connected transistor 2025 may be used to ensure that source follower capacitor 2010 does not discharge when the voltage at the top plate of the source follower capacitor rises above (V+). In further embodiments source follower capacitor 2010 may be relatively small and may be integrated on a semiconductor substrate or within an electronic package. Also shown in FIG. 21 is bootstrap capacitor 110 that may be added externally in a half bridge circuit.

In some embodiments, shield capacitor 160 (see FIG. 1) may be connected from first level shift node 305 (see FIG. 3) and second level shift node (not shown) to switch node 145 to assist in reducing the false triggering discussed above. In some embodiments, the larger the value of shield capacitor 160, the more immune the circuit will be to false triggering effects due to the parasitic capacitance to ground. However, during high side transistor 125 turn off, shield capacitor 160 may be discharged through pull up resistor 303 (see FIG. 3) connected to first level shift node 305. This may significantly slow down high side transistor 125 turn off process. In some embodiments this consideration may be used to set an upper limit on the value of shield capacitor 160. In further embodiments, an overvoltage condition on first level shift node 305 (see FIG. 3) may be prevented by the use of a clamp circuit 161 (see FIG. 1) between the first level shift node and switch node 145. In some embodiments, clamp circuit 161 maybe composed of a diode connected transistor where a drain of the transistor is connected to first level shift node 305 (see FIG. 3) and a gate and a source are connected to switch node (Vsw) 145 (see FIG. 1). In further embodiments, a second shield capacitor and a second clamp circuit may be placed between the second level shift node and switch node (Vsw) 145 (see FIG. 1).

Half Bridge Circuit #1 Operation

The following operation sequence for half-bridge circuit 100 is for example only and other sequences may be used without departing from the invention. Reference will now be made simultaneously to FIGS. 1, 2 and 14.

In one embodiment, when the (PWM_LS) signal from the controller is high, low side logic, control and level shift circuit 150 sends a high signal to low side transistor driver 120. Low side transistor driver 120 then communicates through the (LS_GATE) signal to low side transistor 115 to turn it on. This will set the switch node voltage (Vsw) 145 close to 0 volts. When low side transistor 115 turns on, it provides a path for bootstrap capacitor 110 to become charged through bootstrap charging circuit 157 which may be connected between (Vcc) and (Vboot). The charging path has a parallel combination of a high voltage bootstrap diode 1205 (see FIG. 12) and transistor 1210. The (BOOT-FET_DR) signal provides a drive signal to bootstrap transistor 1210 (see FIG. 12) that provides a low resistance path for charging bootstrap capacitor 110.

Bootstrap diode 1205 (see FIG. 12) may be used to ensure that there is a path for charging bootstrap capacitor 110 during startup when there is no low side transistor 115 gate drive signal (LS_GATE). During this time the (PWM_HS) signal should be low. If the (PWM_HS) signal is inadvertently turned on (i.e., in a high state) during this time the (STP_HS) signal generated from low side transistor driver 120 will prevent high side transistor 125 from turning on. If the (PWM_LS) signal is turned on while the (PWM_HS) signal is on, the (STP_LS) signal generated from level shift driver circuit 217 will prevent low side transistor 115 from turning on. Also, in some embodiments the (LS_UVLO) signal may prevent low side transistor 115 and high side transistor 125 from turning on when either (Vcc) or (Vdd_LS) goes below a preset threshold voltage level.

In further embodiments, when the (PWM_LS) signal is low, low side gate signal (LS_GATE) to low side transistor 115 is also low. During the dead time between the (PWM_LS) signal low state to the (PWM_HS) high state transition, an inductive load will force either high side transistor 125 or low side transistor 115 to turn on in the synchronous rectifier mode, depending on direction of power flow. If high side transistor 125 turns on during the dead time (e.g., during boost mode operation), switch node (Vsw) 145 voltage may rise close to (V+) 135 (rail voltage).

In some embodiments, a dv/dt condition on switch node 145 (Vsw) may tend to pull first level shift node (LSHIFT_1) 305 (see FIG. 3) to a low state relative to switch node (Vsw) 145, due to capacitive coupling to ground. This may turn on high side gate drive circuit 130 causing unintended triggering of high side transistor 125. In one embodiment, this may result in no dead time which may harm half bridge circuit 100 with a shoot through condition. In further embodiments, to prevent this condition from occurring, blanking pulse generator 223 may sense the turn off transient of low side transistor 115 and send a pulse to turn on second level shift transistor 205. This may pull the (L_SHIFT2) signal voltage to a low state which then communicates with second level shift receiver 1420 to generate a blanking pulse signal (B_PULSE) to drive blanking transistor 1440. Blanking transistor 1440 may then act as a pull up to prevent first level shift node (LSHIFT_1) 305 (see FIG. 3) from going to a low state relative to switch node (Vsw) 145.

In further embodiments, after the dead time, when the (PWM_HS) signal goes to a high state, level shift driver circuit 217 may send a high signal to the gate of first level shift transistor 203 (via the L1_DR signal from level shift driver circuit 217). The high signal will pull first level shift node (LSHIFT_1) 305 (see FIG. 3) low relative to switch node (Vsw) 145 which will result in a high signal at the input of high side transistor 125, turning on high side transistor 125. Switch node voltage (Vsw) 145 will remain close to (V+) 135. In one embodiment, during this time, bootstrap capacitor 110 may discharge through first level shift transistor 203 (which is in an on state during this time).

If high side transistor 125 stays on for a relatively long time (i.e., a large duty cycle) bootstrap capacitor 110 voltage will go down to a low enough voltage that it will prevent high side transistor 125 from turning off when the (PWM_HS) signal goes low. In some embodiments this may occur because the maximum voltage the (L_SHIFT1) signal can reach is (Vboot) which may be too low to turn off high side transistor 125. In some embodiments, this situation may be prevented by high side UVLO circuit 1415 that forcibly turns off high side transistor 125 by sending a high input to high side gate drive circuit 130 when (Vboot) goes below a certain level.

In yet further embodiments, when the (PWM_HS) signal goes low, first level shift transistor 203 will also turn off (via the L1_DR signal from the level shift driver circuit 217). This will pull first level shift node (LSHIFT_1) 305 (see FIG. 3) to a high state. However, in some embodiments this process may be relatively slow because the high value pull up resistor 303 (see FIG. 3) (used to reduce power consumption in some embodiments) needs to charge all the capacitances attached to first level shift node (L_SHIFT1) 305 (see FIG. 3) including the output capacitance (Coss) of first level shift transistor 213 and shield capacitor 160. This may increase the turn off delay of high side transistor 125. In order to reduce high side transistor 125 turn off delay, pull up trigger circuit 1425 may be used to sense when first level shift node (L_SHIFT1) 305 (see FIG. 3) goes above (Vth). This condition may generate a (PULLUP_FET) signal that is applied to pull up transistor 1435 which, acting in parallel with pull up resistor 1430, may considerably speed up the pull up of first level shift node (L_SHIFT1) 305 (see FIG. 3) voltage, hastening the turn off process.

Half Bridge Circuit #2

Now referring to FIG. 21, a second embodiment of a half bridge circuit 2100 is disclosed. Half bridge circuit 2100 may have the same block diagram as circuit 100 illustrated in FIG. 1, however the level shift transistors in circuit 2100 may operate with pulsed inputs, rather than a continuous signal, as described in more detail below. In some embodiments, pulsed inputs may result in lower power dissipation, reduced stress on the level shift transistors and reduced switching time, as discussed in more detail below.

Continuing to refer to FIG. 21, one embodiment includes an integrated half bridge power conversion circuit 2100 employing a low side GaN device 2103, a high side GaN device 2105, a load 2107, a bootstrap capacitor 2110 and other circuit elements, as discussed in more detail below. Some embodiments may also have an external controller (not shown in FIG. 21) providing one or more inputs to circuit 2100 to regulate the operation of the circuit. Circuit 2100 is for illustrative purposes only and other variants and configurations are within the scope of this disclosure.

As further illustrated in FIG. 21, in one embodiment, integrated half bridge power conversion circuit 2100 may include a low side circuit disposed on low side GaN device 2103 that includes a low side transistor 2115 having a low side control gate 2117. The low side circuit may further include an integrated low side transistor driver 2120 having an output 2123 connected to a low side transistor control gate 2117. In another embodiment there may be a high side circuit disposed on high side GaN device 2105 that includes a high side transistor 2125 having a high side control gate 2127. The high side circuit may further include an integrated high side transistor driver 2130 having an output 2133 connected to high side transistor control gate 2127.

High side transistor 2125 may be used to control the power input into power conversion circuit 2100 and have a voltage source (V+) 2135 (sometimes called a rail voltage) connected to a drain 2137 of the high side transistor. High side transistor 2125 may further have a source 2140 that is coupled to a drain 2143 of low side transistor 2115, forming a switch node (Vsw) 2145. Low side transistor 2115 may have a source 2147 connected to ground. In one embodiment, low side transistor 2115 and high side transistor 2125 may be enhancement-mode field-effect transistors. In other embodiments low side transistor 2115 and high side transistor 2125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 2105 and low side device 2103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN Low Side Device Low side device 2103 may have numerous circuits used for the control and operation of the low side device and high side device 2105. In some embodiments, low side device 2103 may include a low side logic, control and level shift circuit (low side control circuit) 2150 that controls the switching of low side transistor 2115 and high side transistor 2125 along with other functions, as discussed in more detail below. Low side device 2103 may also include a startup circuit 2155, a bootstrap capacitor charging circuit 2157 and a shield capacitor 2160, as also discussed in more detail below.

Figure 22:
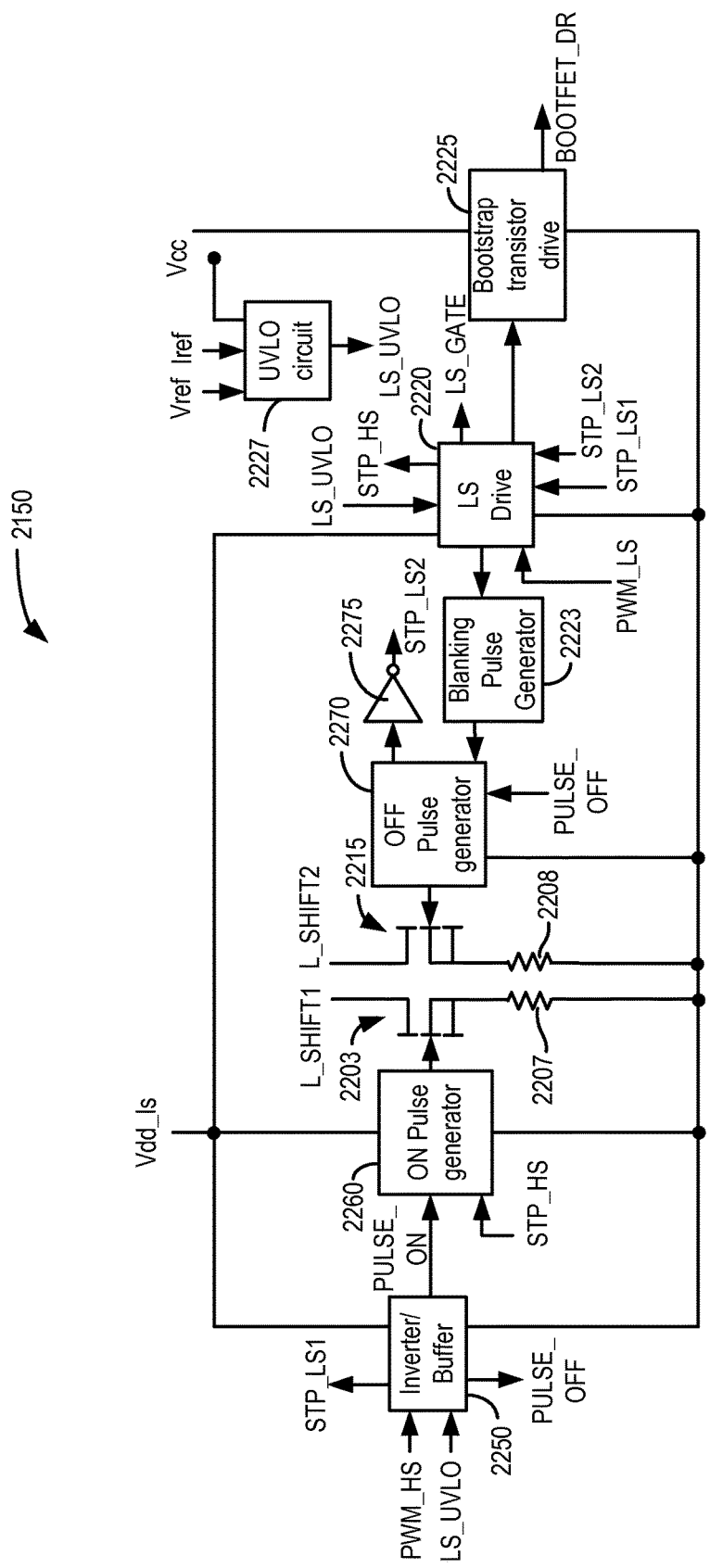
FIG. 22 is a simplified schematic of the circuits within the low side control circuit illustrated in FIG. 21.

Now referring to FIG. 22, the circuits within low side control circuit 2150 are functionally illustrated. Each circuit within low side control circuit 2150 is discussed below, and in some cases is shown in more detail in FIGS. 23-28. In one embodiment the primary function of low side control circuit 2150 may be to receive one or more input signals, such as a PWM signal from a controller, and control the operation of low side transistor 2115, and high side transistor 2125.

First level shift transistor 2203, may be an "on" pulse level shift transistor, while second level shift transistor 2215 may be an "off" pulse level shift transistor. In one embodiment, a pulse width modulated high side (PWM_HS) signal from a controller (not shown) may be processed by inverter/buffer 2250 and sent on to an on pulse generator 2260 and an off pulse generator 2270. On pulse generator 2260 may generate a pulse that corresponds to a low state to high state transient of the (PWM_HS) signal, thus turning on first level shift transistor 2203 during the duration of the pulse. Off pulse generator 2270 may similarly generate a pulse that corresponds to the high state to low state transition of the (PWM_HS) signal, thus turning on second level shift transistor 2205 for the duration of the off pulse.

First and second level shift transistors 2203, 2205, respectively, may operate as pull down transistors in resistor pull up inverter circuits. More specifically, turning on may mean the respective level shift node voltages get pulled low relative to switch node (Vsw) 2145 voltage, and turning off may result in the respective level shift nodes assuming the (Vboot) voltage. Since first and second level shift transistors 2203, 2215, respectively, are "on" only for the duration of the pulse, the power dissipation and stress level on these two devices may be less than half bridge circuit 100 illustrated in FIG. 1.

First and second resistors 2207, 2208, respectively, may be added in series with the sources of first and second level shift transistors 2203, 2215, respectively to limit the gate to source voltage and consequently the maximum current through the transistors. First and second resistors 2207, 2208, respectively, could be smaller than the source follower resistors in half bridge circuit 100 illustrated in FIG. 1, which may help make the pull down action of first and second level shift transistors 2203, 2215 faster, reducing the propagation delays to high side transistor 2125.

In further embodiments, first and second resistors 2207, 2208, respectively, could be replaced by any form of a current sink. One embodiment may connect the source of first and second level shift transistors 2203, 2205, respectively to a gate to source shorted depletion-mode device. One embodiment of a depletion-mode transistor formed in a high-voltage GaN technology may be to replace the enhancement-mode gate stack with one of the high-voltage field plate metals superimposed on top of the field dielectric layers. The thickness of the field dielectric and the work function of the metal may control the pinch-off voltage of the stack.

In further embodiments, first and second resistors 2207, 2208, respectively may be replaced by a current sink. In one embodiment a reference current (Iref) that is generated by startup circuit 2155 (see FIG. 21) may be used. Both the depletion-mode transistor and current sink embodiments may result in a significant die area reduction compared to the resistor option (i.e., because a small depletion transistor would suffice and Iref is already available).

Bootstrap transistor drive circuit 2225 may be similar to bootstrap transistor drive circuit 225 illustrated in FIG. 2 above. Bootstrap transistor drive circuit 2225 may receive input from low side drive circuit 2220 (see FIG. 22) and provide a gate drive signal called (BOOTFET_DR) to the bootstrap transistor in bootstrap capacitor charging circuit 2157 (see FIG. 21), as discussed in more detail above.

Figure 23:
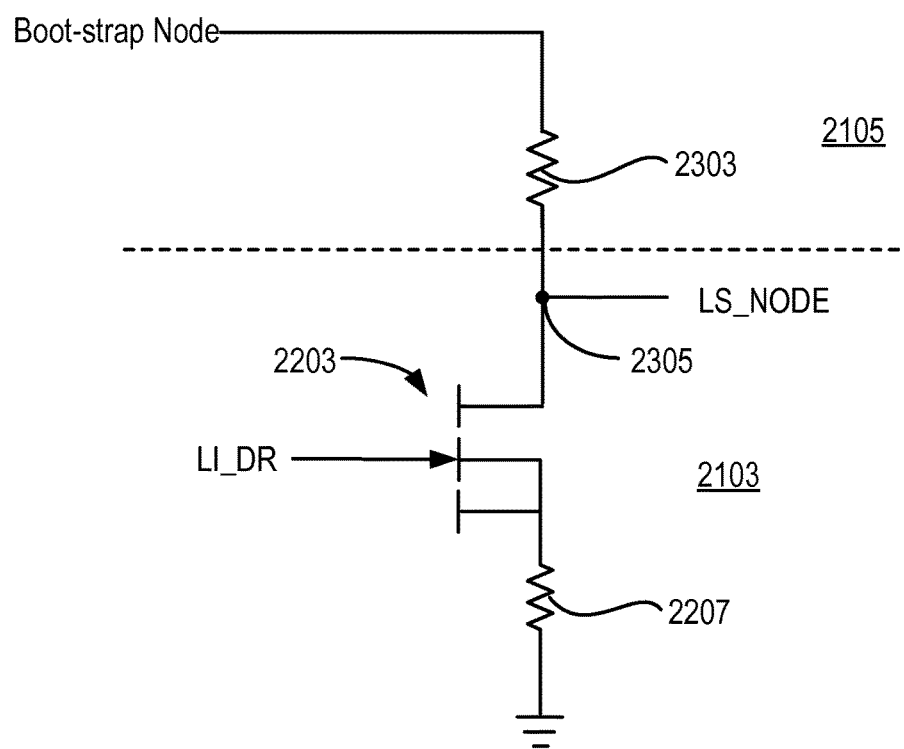
FIG. 23 is a schematic of the first level shift transistor illustrated in FIG. 22.

Now referring to FIG. 23, first level shift transistor 2203 is illustrated along with a pull up resistor 2303 that may be located in high side device 2105. In some embodiments, first level shift transistor 2203 may operate as a pull down transistor in a resistor pull up inverter similar to first level shift transistor 203 illustrated in FIG. 3. As discussed above, pull up resistor 2303 may be disposed in high side device 2105 (see FIG. 21). Second level shift transistor 2215 may have a similar configuration. In some embodiments there may be a first capacitance between the first output terminal (LS_NODE) 2305 and switch node (Vsw) 2145 (see FIG. 21), and a second capacitance between a first output terminal 2305 and ground, where the first capacitance is greater than the second capacitance. The first capacitance may be designed such that in response to a high dv/dt signal at the switch node (Vsw) 2145 (see FIG. 21), a large portion of the C*dv/dt current is allowed to conduct through the first capacitance ensuring that the voltage at first output terminal 2305 tracks the voltage at the switch node (Vsw). A shield capacitor 2160 (see FIG. 21) may be configured to act as the first capacitor as described above. In further embodiments shield capacitor 2160 (see FIG. 21) may be used to create capacitance between first output terminal 2305 and switch node (Vsw) 2145 (see FIG. 21) in the half bridge power conversion circuit 2100. Shield capacitor 2160 may also be used to minimize the capacitance between first output terminal 2305 and a substrate of the semiconductor device. In further embodiments shield capacitor 2160 may be constructed on low side GaN device 2103.

Now referring to FIG. 24, inverter/buffer circuit 2250 is illustrated in greater detail. In one embodiment inverter/buffer circuit 2250 may have a first inverter stage 2405 and a first buffer stage 2410. In further embodiments, inverter/buffer circuit 2250 may be driven directly by the (PWM_HS) signal from the controller (not shown). The output of first inverter stage 2405 may be the input signal (PULSE_ON) to on pulse generator 2260 (see FIG. 22) while the output of first buffer stage 2410 may be an input signal (PULSE_OFF) to off pulse generator 2270.

In some embodiments, an optional (LS_UVLO) signal may be generated by sending a signal generated by UVLO circuit 2227 (see FIG. 22) in to a NAND gate disposed in first inverter stage 2405. This circuit may be used to turn off the level shift operation if either (Vcc) or (Vdd_LS) go below a certain reference voltage (or a fraction of the reference voltage). In further embodiments, inverter/buffer circuit 2250 may also generate a shoot through protection signal (STP_LS1) for low side transistor 2115 (see FIG. 21) that may be applied to low side transistor gate drive circuit 2120. This may turn off low side transistor gate drive circuit 2120 (see FIG. 21) when the (PWM_HS) signal is high, preventing shoot through.

Now referring to FIG. 25, on pulse generator 2260 is illustrated in greater detail. In one embodiment on pulse generator 2260 may have a first inverter stage 2505, a first buffer stage 2510, an RC pulse generator 2515, a second inverter stage 2520 a third inverter stage 2525 and a third buffer stage 2530. In further embodiments the (PULSE_ON) signal input from inverter/buffer circuit 2250 (see FIG. 22) may be first inverted and then transformed into an on pulse by RC pulse generator 2515 and a square wave generator. The result of this operation is the gate drive signal (LI_DR) that is transmitted to first level shift transistor 2203 (see FIG. 22).

In further embodiments, on pulse generator 2260 may comprise one or more logic functions, such as for example, a binary or combinatorial function. In one embodiment, on pulse generator 2260 may have a multiple input NOR gate for the (STP_HS) signal. The (STP_HS) signal may have the same polarity as the (LS_GATE) signal. Therefore, if the (STP_HS) signal is high (corresponding to LS_GATE signal being high) the on pulse may not be generated because first inverter circuit 2505 in FIG. 25 will be pulled low which will deactivate pulse generator 2515.

In further embodiments, RC pulse generator 2515 may include a clamp diode (not shown). The clamp diode may be added to ensure that RC pulse generator 2515 works for very small duty cycles for the (PWM_LS) signal. In some embodiments, on pulse generator 2260 may be configured to receive input pulses in a range of 2 nanoseconds to 20 microseconds and to transmit pulses of substantially constant duration within the range. In one embodiment the clamp diode may turn on and short out a resistor in RC pulse generator 2515 (providing a very small capacitor discharge time) if the voltage across the clamp diode becomes larger than (Vth). This may significantly improve the maximum duty cycle of operation (with respect to the PWM_HS signal) of pulse generator circuit 2260.

Figure 26:
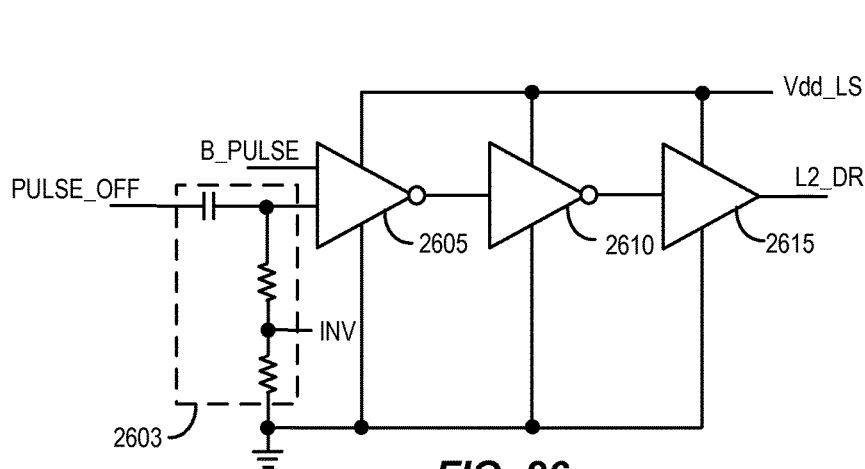
FIG. 26 is a schematic of the off pulse generator circuit illustrated in FIG. 22.

Now referring to FIG. 26, off pulse generator 2270 is illustrated in greater detail. In one embodiment off pulse generator 2270 may have an RC pulse generator 2603, a first inverter stage 2605, a second inverter stage 2610 and a first buffer stage 2615. In further embodiments, off pulse generator 2270 may receive an input signal (PULSE_OFF) from inverter/buffer circuit 2250 (see FIG. 22) that may be subsequently communicated to RC pulse generator 2603.

In further embodiments the pulse from RC pulse generator 2603 is sent through first inverter stage 2605, second inverter stage 2610 and buffer stage 2615. The pulse may then be sent as the (L2_DR) signal to second level shift transistor 2215 (see FIG. 22). A clamp diode may also be included in off pulse generator 2270. In some embodiments, the operating principle may be similar to the operating principle discussed above with regard to on pulse generator 2260 (see FIG. 25). Such operating principles may ensure that off pulse generator 2270 operates for very low on times of high side transistor 2125 (see FIG. 21) (i.e. the circuit will operate for relatively small duty cycles). In some embodiments, off pulse generator 2270 may be configured to receive input pulses in a range of 2 nanoseconds to 20 microseconds and to transmit pulses of substantially constant duration within the range. In further embodiments an off level shift pulse can be shortened by an on input pulse to enable an off time of less than 50 nanoseconds on high side transistor 2125.

In some embodiments, RC pulse generator 2603 may include a capacitor connected with a resistor divider network. The output from the resistor may be a signal (INV) that is sent to an inverter 2275 (see FIG. 22) that generates a shoot through protection signal (STP_LS2) transmitted to low side driver circuit 2220. In further embodiments, off pulse generator 2270 may comprise one or more logic functions, such as for example, a binary or combinatorial function. In one embodiment the (STP_LS2) signal is sent to a NAND logic circuit within low side driver circuit 2220, similar to the (STP_LS1) signal. In some embodiments, these signals may be used to ensure that during the duration of the off pulse signal (PULSE_OFF), low side transistor 2115 (see FIG. 21) does not turn on (i.e., because high side transistor 2125 turns off during the off pulse). In some embodiments this methodology may be useful to compensate for a turn off propagation delay (i.e., the PULSE_OFF signal may enable shoot through protection), ensuring that low side transistor 2115 will only turn on after high side transistor 2125 gate completely turns off.

In further embodiments, a blanking pulse can be level shifted to high side device 2105 using second level shift transistor 2215. To accomplish this, a blanking pulse may be sent into a NOR input into first inverter stage 2605. The blanking pulse may be used to inhibit false triggering due to high dv/dt conditions at switch node Vsw 2145 (see FIG. 20). In some embodiments no blanking pulse may be used to filter dv/dt induced or other unwanted level shift output pulses.

Figure 27:
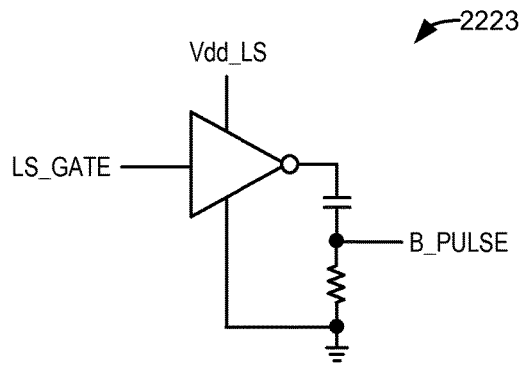
FIG. 27 is a schematic of the blanking pulse generator circuit illustrated in FIG. 22.

Now referring to FIG. 27, blanking pulse generator 2223 is illustrated in greater detail. In one embodiment, blanking pulse generator 2223 may be a more simple design than used in half bridge circuit 100 illustrated in FIG. 1 because the square wave pulse generator is already part of off pulse generator 2270. In one embodiment the (LS_GATE) signal is fed as the input to blanking pulse generator 2223 from low side gate drive circuit 2220 (see FIG. 22). This signal may be inverted and then sent through an RC pulse generator to generate a positive going pulse. In some embodiments, an inverted signal may be used because the pulse needs to correspond to the falling edge of the (LS_GATE) signal. The output of this may be used as the blanking pulse input (B_PULSE) to off pulse generator 2270.

Figure 28:
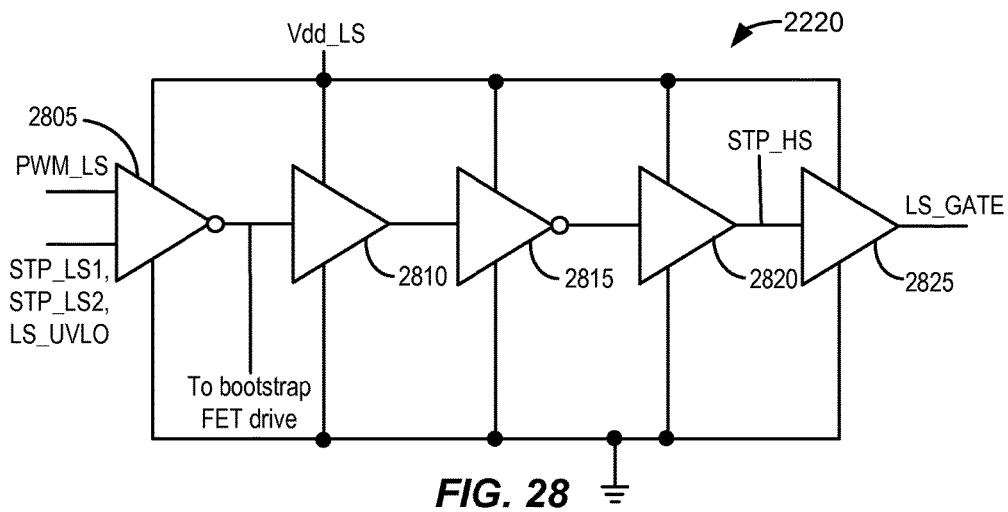
FIG. 28 is a schematic of the low side transistor drive circuit illustrated in FIG. 22.

Now referring to FIG. 28, low side transistor drive circuit 2220 is illustrated in greater detail. In one embodiment low side transistor drive circuit 2220 may have a first inverter stage 2805, a first buffer stage 2810, a second inverter stage 2815, a second buffer stage 2820 and a third buffer stage 2825. In some embodiments two inverter/buffer stages may be used because the input to the gate of low side transistor 2115 is synchronous with the (PWM_LS) signal. Thus, in some embodiments a (PWM_LS) high state may correspond to a (LS_GATE) high state and vice versa.

In further embodiments, low side transistor drive circuit 2220 may also include an asymmetric hysteresis using a resistor divider with a transistor pull down similar to the scheme described in 120 (see FIG. 8). In one embodiment low side transistor drive circuit 2220 includes multiple input NAND gates for the (STP_LS1) and (STP_LS2) (shoot through prevention on low side transistor 2115) signals. The (STP_LS1) and (STP_LS2) signals may ensure that low side transistor drive circuit 2220 (see FIG. 22) does not communicate with low side transistor 2115 (see FIG. 21) when high side transistor 2125 is on. This technique may be used to avoid the possibility of shoot-through. Other embodiments may include NAND gates (similar to the ones employed above in FIG. 28) for the (LS_UVLO) signal. One embodiment may include a turn off delay resistor in series with the gate of the final pull down transistor. This may be used to ensure the bootstrap transistor is turned off before low side transistor 2115 turns off.

In further embodiments, low side device 2103 (see FIG. 21) may also include a startup circuit 2155, bootstrap capacitor charging circuit 2157, a shield capacitor 2160, and a UVLO circuit 2227 that may be similar to startup circuit 155, bootstrap capacitor charging circuit 157, shield capacitor 160 and UVLO circuit 227, respectively, as discussed above.

High Side Device

Figure 29:
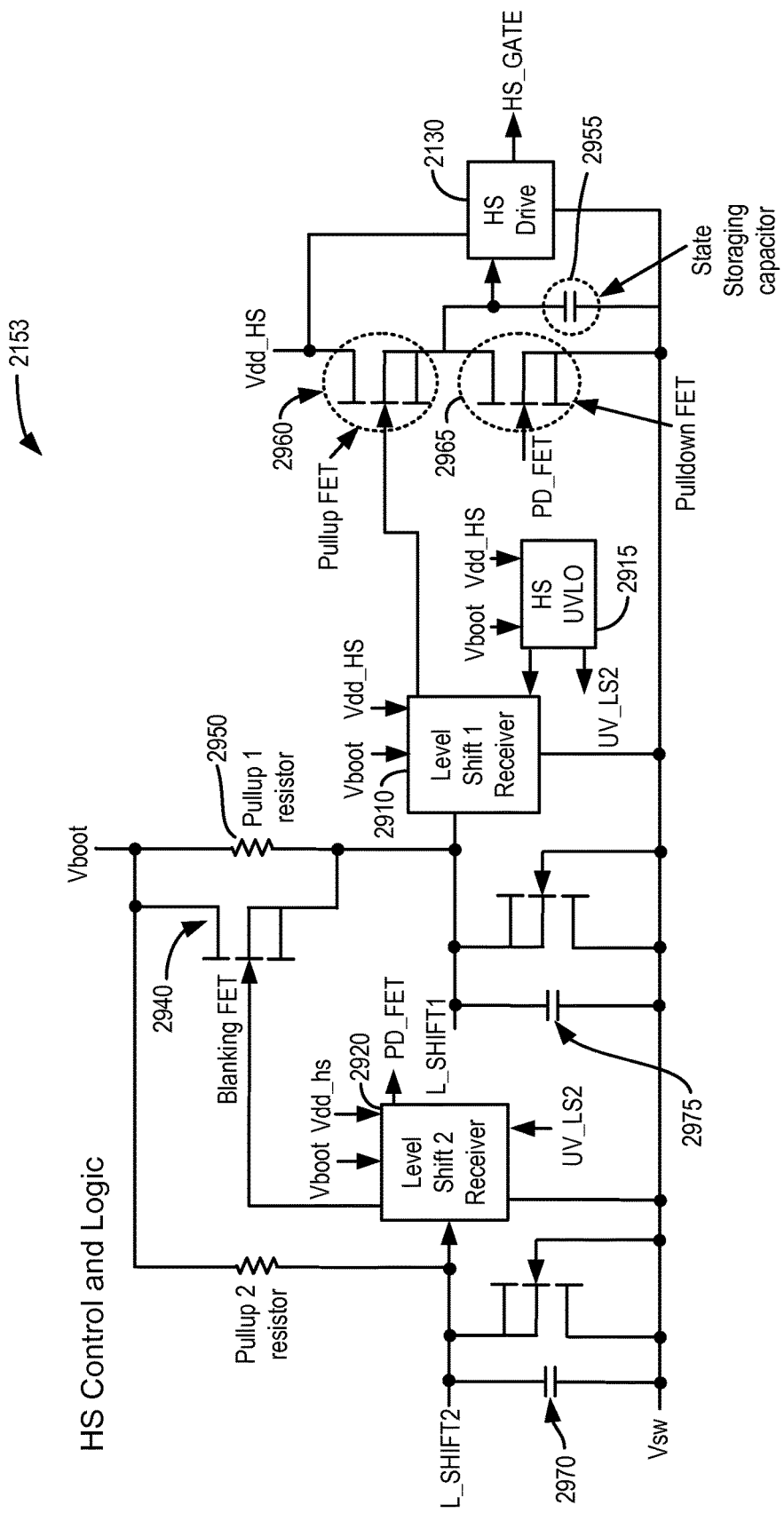
FIG. 29 is a simplified schematic of the circuits within the high side control circuit illustrated in FIG. 21.

Now referring to FIG. 29, high side logic and control circuit 2153 and how it interacts with high side transistor driver 2130 is illustrated in greater detail. In some embodiments, high side logic and control circuit 2153 may operate in similar ways as high side logic and control circuit 153, discussed above in FIG. 15. In further embodiments, high side logic and control circuit 2153 may operate in different ways, as discussed in more detail below.

In one embodiment, level shift 1 receiver circuit 2910 receives an (L_SHIFT1) signal from first level shift transistor 2203 (see FIG. 22) that receives an on pulse at the low state to high state transition of the (PWM_HS) signal, as discussed above. In response, level shift 1 receiver circuit 2910 drives a gate of pull up transistor 2960 (e.g., in some embodiments a low-voltage enhancement-mode GaN transistor). In further embodiments, pull up transistor 2960 may then pull up a state storing capacitor 2955 voltage to a value close to (Vdd_HS) with respect to switch node (Vsw) 2145 voltage. The voltage on a state storing capacitor 2955 may then be transferred to high side transistor driver 2130 and on to the gate of high side transistor gate 2127 (see FIG. 21) to turn on high side transistor 2125. In some embodiments state storing capacitor 2955 may be a latching storage logic circuit configured to change state in response to a first pulsed input signal and to change state in response to a second pulsed input signal. In further embodiments, state storing capacitor 2955 may be replaced by any type of a latching circuit such as, but not limited to an RS flip-flop.

In further embodiments, during this time, level shift 2 receiver circuit 2920 may maintain pull down transistor 2965 (e.g., in some embodiments a low-voltage enhancement-mode GaN transistor) in an off state. This may cut off any discharge path for state storing capacitor 2955. Thus, in some embodiments, state storing capacitor 2955 may have a relatively small charging time constant and a relatively large discharge time constant.

Similarly, level shift 2 receiver 2920 may receive an (L_SHIFT2) signal from second level shift transistor 2215 (see FIG. 22) that receives an off pulse at the high state to low state transition of the (PWM_HS) signal, as discussed above. In response, level shift 2 receiver circuit 2920 drives a gate of pull down transistor 2965 (e.g., in some embodiments a low-voltage enhancement-mode GaN transistor). In further embodiments, pull down transistor 2965 may then pull down (i.e., discharge) state storing capacitor 2955 voltage to a value close to switch node (Vsw) 2145, that may consequently turn off high side transistor 2125 through high side transistor driver 2130.

Continuing to refer to FIG. 29, first and second shield capacitors 2970, 2975, respectively, may be connected from (L_SHIFT1) and (L_SHIFT2) nodes to help prevent false triggering during high dv/dt conditions at switch node (Vsw) 2145 (see FIG. 21). In further embodiments there may also be a clamp diode between the (L_SHIFT1) and (L_SHIFT2) nodes and the switch node (Vsw) 2145 (see FIG. 21). This may ensure that the potential difference between switch node (Vsw) 2145 (see FIG. 21) and the (L_SHIFT1) and (L_SHIFT2) nodes never goes above (Vth). This may be used to create a relatively fast turn on and turn off for high side transistor 2125 (see FIG. 21).

Figure 30:
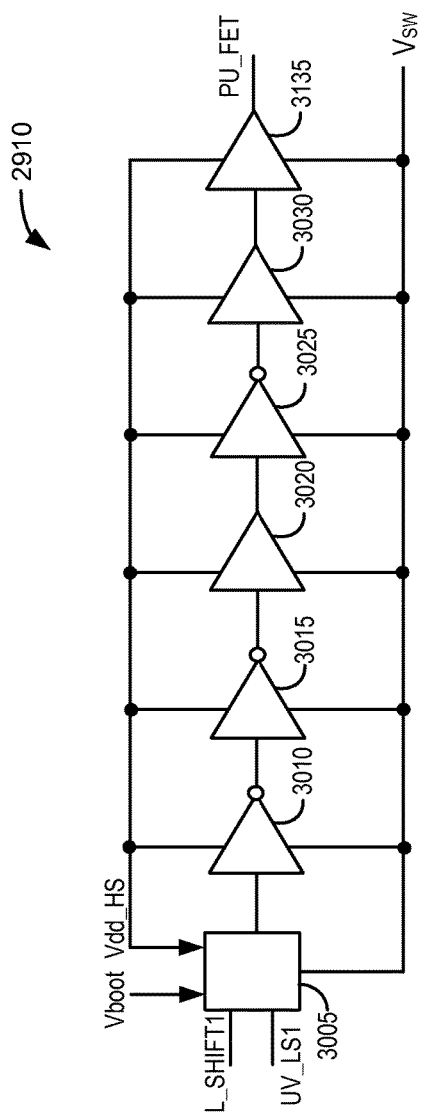
FIG. 30 is a schematic of the level shift 1 receiver circuit illustrated in FIG. 29.

Now referring to FIG. 30, level shift 1 receiver 2910 is illustrated in greater detail. In one embodiment level shift 1 receiver 2910 may include a down level shifter 3005, a first inverter 3010, a second inverter 3015, a first buffer 3020, a third inverter 3025, a second buffer 3030 and a third buffer 3135. In some embodiments, level shift 1 receiver 2910 down shifts (i.e., modulates) the (L_SHIFT1) signal by a voltage of 3*Vth (e.g., using three enhancement-mode transistors where each may have a gate to source voltage close to Vth). In other embodiments a fewer or more downshift transistors may be used.

In further embodiments, the last source follower transistor may have a three diode connected transistor clamp across its gate to its source. In some embodiments this configuration may be used because its source voltage can only be as high as (Vdd_HS) (i.e., because its drain is connected to Vdd_HS) while its gate voltage can be as high as V (L_SHIFT1)–2*Vth. Thus, in some embodiments the maximum gate to source voltage on the final source follower transistor can be greater than the maximum rated gate to source voltage in the technology.

In further embodiments, first inverter 3010 may also have a NOR Gate for the high side under voltage lock out using the (UV_LS1) signal generated by high side UVLO circuit 2915. In one embodiment, an output of level shift 1 receiver 2910 (see FIG. 29) may be a (PU_FET) signal that is communicated to a gate of pull up transistor 2960 (see FIG. 29). This signal may have a voltage that goes from 0 volts in a low state to (Vdd_HS)+(Vdd_HS–Vth) in a high state. This voltage may remain on for the duration of the on pulse.

Figure 31:
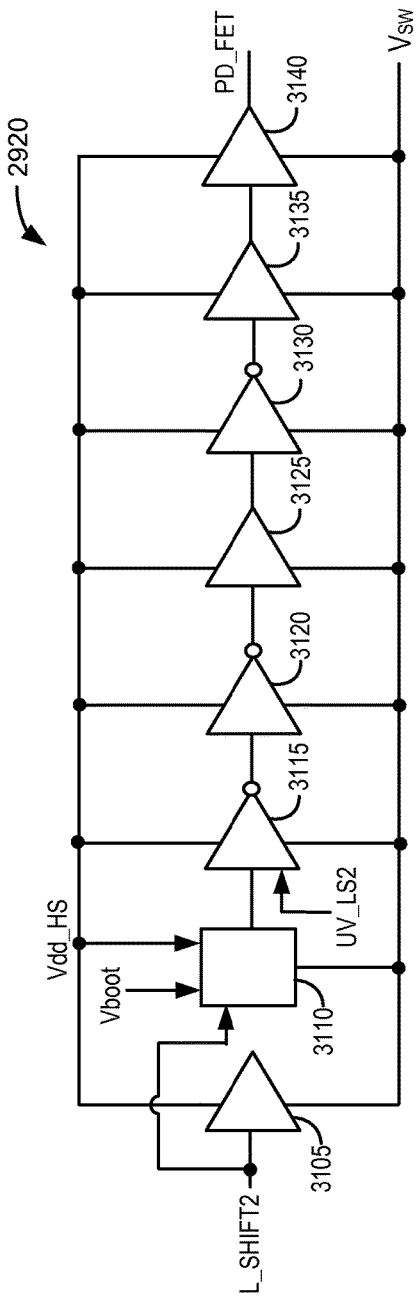
FIG. 31 is a schematic of level shift 2 receiver circuit illustrated in FIG. 29.

Now referring to FIG. 31, level shift 2 receiver 2920 is illustrated in greater detail. In one embodiment level shift 2 receiver 2920 may be similar to level shift 1 receiver 2910 discussed above. In further embodiments level shift 2 receiver 2920 may include a blanking pulse generator 3105, a down level shifter 3110, a first inverter 3115, a second inverter 3120, a first buffer 3125, an third inverter 3130, a second buffer 3135 and a third buffer 3140. In one embodiment, blanking pulse generator 3105 may be used in addition to a 3*Vth down level shifter 3110 and multiple inverter/buffer stages.

In other embodiments different configurations may be used. In some embodiments, this particular configuration may be useful when level shift 2 receiver 2920 doubles as a high side transistor 2125 (see FIG. 21) turn off as well as a blanking transistor 2940 (see FIG. 29) drive for better dv/dt immunity. In some embodiments, blanking pulse generator 3105 may be identical to level shift 2 receiver 1520 illustrated in FIG. 17. In one embodiment level shift 2 receiver 2920 (see FIG. 29) may receive (L_SHIFT2) and (UV_LS2) signals and in response, transmit a (PD_FET) signal to pull down transistor 2965. In further embodiments, first inverter 3115 may have a two input NAND gate for the (UV_LS2) signal from high side UVLO circuit 2915 (see FIG. 29).

Figure 32:
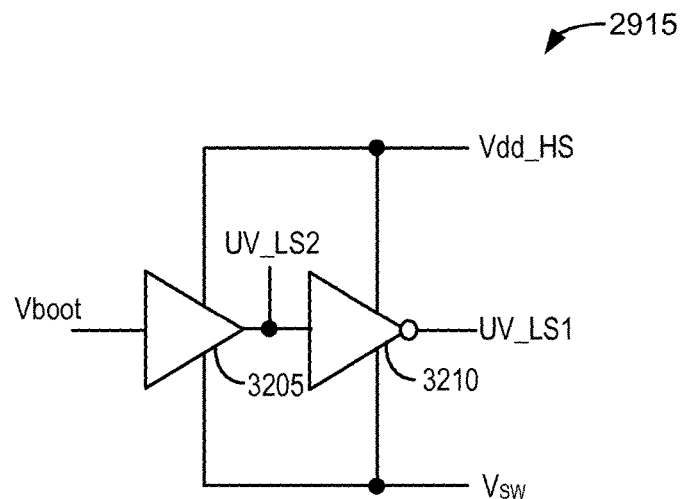
FIG. 32 is a schematic of the high side UVLO circuit illustrated in FIG. 29.

Now referring to FIG. 32, high side UVLO circuit 2915 is illustrated in greater detail. In one embodiment high side UVLO circuit 2915 may include a down level shifter 3205 and a resistor pull up inverter stage 3210. In some embodiments, high side UVLO circuit 2915 may be configured to prevent circuit failure by turning off the (HS_GATE) signal to high side transistor 2125 (see FIG. 21) when bootstrap capacitor 2110 voltage goes below a certain threshold. In one example embodiment high side UVLO circuit 2915 is designed to engage when (Vboot) reduces to a value less than 4*Vth below switch node (Vsw) 2145 voltage. In another embodiment the output of down level shifter 3205 may be a (UV_LS2) signal transmitted to second level shift receiver 2920 and the output of resistor pull up inverter stage 3210 may be an (UV_LS1) signal that is transmitted to first level shift receiver 2910.

As discussed below, in some embodiments high side UVLO circuit 2915 may be different from high side UVLO circuit 1415 for half bridge circuit 100 discussed above in FIGS. 14 and 18, respectively. In one embodiment, the (Vboot) signal may be down shifted by 3*Vth and transferred to resistor pull up inverter stage 3210. In further embodiments, since level shift 2 receiver circuit 2920 (see FIG. 29) controls the turn off process based on high side transistor 2125 (see FIG. 21), directly applying a 3*Vth down shifted output to the NAND gate at the input of level shift 2 receiver circuit 2920 will engage the under voltage lock out.

However, in some embodiments, because the bootstrap voltage may be too low this may also keep pull up transistor 2960 (see FIG. 29) on. In some embodiments, this may result in a conflict. While level shift 2 receiver circuit 2920 (see FIG. 29) tries to keep high side transistor 2125 (see FIG. 21) off, level shift 1 receiver circuit 2910 may try to turn the high side transistor on. In order to avoid this situation, some embodiments may invert the output of the 3*Vth down shifted signal from high side UVLO circuit 2915 (see FIG. 29) and send it to a NOR input on level shift 1 receiver circuit 2910. This may ensure that level shift 1 receiver circuit 2910 does not interfere with the UVLO induced turn off process.

Figure 33:
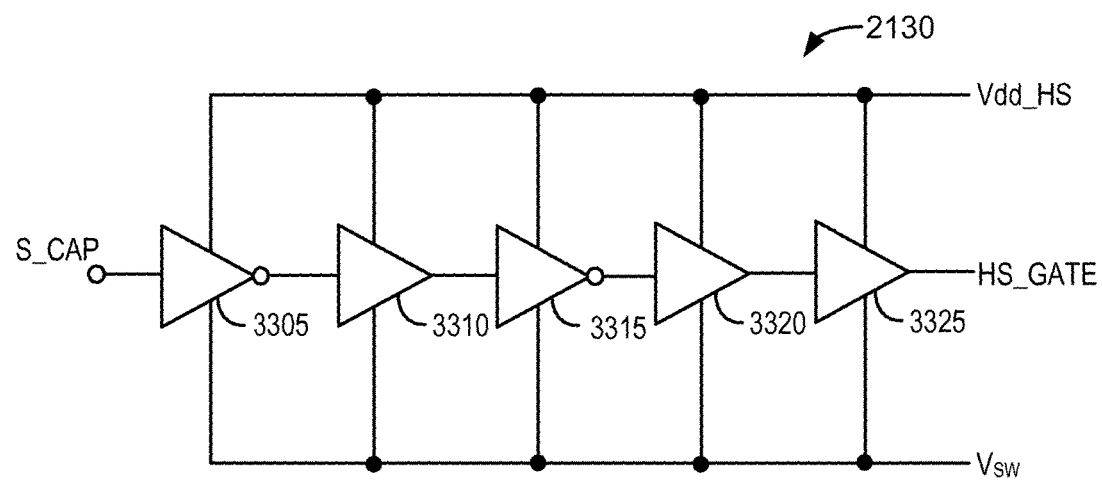
FIG. 33 is a schematic of the high side transistor driver circuit illustrated in FIG. 29.

Now referring to FIG. 33, high side transistor driver 2130 is illustrated in greater detail. In one embodiment high side transistor driver 2130 may include a first inverter 3305, a first buffer 3310, a second inverter 3315, a second buffer 3320 and a third buffer 3325. In some embodiments high side transistor driver 2130 may be a more basic design than high side transistor driver 130 employed in half bridge circuit 100 illustrated in FIG. 1. In one embodiment, high side transistor driver 2130 receives an (S_CAP) signal from state storing capacitor 2955 (see FIG. 29) and delivers a corresponding drive (HS_GATE) signal to high side transistor 2125 (see FIG. 21). More specifically, when the (S_CAP) signal is in a high state, the (HS_GATE) signal is in a high state and vise versa.

Half Bridge Circuit #2 Operation

The following operation sequence for half-bridge circuit 2100 (see FIG. 21) is for example only and other sequences may be used without departing from the invention. Reference will now be made simultaneously to FIGS. 21, 22 and 29.

In one embodiment, when the (PWM_LS) signal is in a high state, low side logic, control and level shift circuit 2150 may send a high signal to low side transistor driver 2120 which then communicates that signal to low side transistor 2115 to turn it on. This may set switch node (Vsw) 2145 voltage close to 0 volts. In further embodiments, when low side transistor 2115 turns on it may provide a path for bootstrap capacitor 2110 to charge. The charging path may have a parallel combination of a high-voltage bootstrap diode and transistor.

In some embodiments, bootstrap transistor drive circuit 2225 may provide a drive signal (BOOTFET_DR) to the bootstrap transistor that provides a low resistance path for charging bootstrap capacitor 2110. In one embodiment, the bootstrap diode may ensure that there is a path for charging bootstrap capacitor 2110 during startup when there is no low side gate drive signal (LS_GATE). During this time the (PWM_HS) signal should be in a low state. If the (PWM_HS) signal is inadvertently turned on during this time, the (STP_HS) signal generated from low side driver circuit 2220 may prevent high side transistor 2125 from turning on. If the (PWM_LS) signal is turned on while the (PWM_HS) signal is on, then the (STP_LS1) and (STP_LS2) signals generated from inverter/buffer 2250 and inverter 2275, respectively will prevent low side transistor 2115 from turning on. In addition, in some embodiments the (LS_UVLO) signal may prevent low side gate 2117 and high side gate 2127 from turning on when either (Vcc) or (Vdd_LS) go below a predetermined voltage level.

Conversely, in some embodiments when the (PWM_LS) signal is in a low state, the (LS_GATE) signal to low side transistor 2115 may also be in a low state. In some embodiments, during the dead time between the (PWM_LS) low signal and the (PWM_HS) high signal transition, the inductive load may force either high side transistor 2125 or low side transistor 2115 to turn on in the synchronous rectifier mode, depending on the direction of power flow. If high side transistor 2125 turns on during the dead time (e.g., in a boost mode), switch node (Vsw) 2145 voltage may rise close to (V+) 2135 (i.e., the rail voltage). This dv/dt condition on switch node (Vsw) 2145 may tend to pull the (L_SHIFT1) node to a low state relative to the switch node (i.e., because of capacitive coupling to ground) which may turn on high side transistor driver 2130 causing unintended conduction of high side transistor 2125. This condition may negate the dead time, causing shoot through.

In some embodiments this condition may be prevented by using blanking pulse generator 2223 to sense the turn off transient of low side transistor 2115 and send a pulse to turn on second level shift transistor 2205. This may pull the (L_SHIFT2) signal to a low state which may then communicate with level shift 2 receiver circuit 2920 to generate a blanking pulse to drive blanking transistor 2940. In one embodiment, blanking transistor 2940 may act as a pull up to prevent the (L_SHIFT1) signal from going to a low state relative to switch node (Vsw) 2145.

In further embodiments, after the dead time when the (PWM_HS) signal transitions from a low state to a high state, an on pulse may be generated by on pulse generator 2260. This may pull the (L_SHIFT1) node voltage low for a brief period of time. In further embodiments this signal may be inverted by level shift 1 receiver circuit 2910 and a brief high signal will be sent to pull up transistor 2960 that will charge state storage capacitor 2955 to a high state. This may result in a corresponding high signal at the input of high side transistor driver 2130 which will turn on high side transistor 2125. Switch node (Vsw) 2145 voltage may remain close to (V+) 2135 (i.e., the rail voltage). State storing capacitor 2955 voltage may remain at a high state during this time because there is no discharge path.

In yet further embodiments, during the on pulse, bootstrap capacitor 2110 may discharge through first level shift transistor 2203. However, since the time period is relatively short, bootstrap capacitor 2110 may not discharge as much as it would if first level shift transistor 2203 was on during the entire duration of the (PWM_HS) signal (as was the case in half bridge circuit 100 in FIG. 1). More specifically, in some embodiments this may result in the switching frequency at which the UVLO engages to be a relatively lower value than in half bridge circuit 100 in FIG. 1.

In some embodiments, when the (PWM_HS) signal transitions from a high state to a low state, an off pulse may be generated by off pulse generator 2270. This may pull the (L_SHIFT2) node voltage low for a brief period of time. This signal may be inverted by level shift 2 receiver circuit 2920 and a brief high state signal may be sent to pull down transistor 2965 that will discharge state storing capacitor 2955 to a low state. This will result in a low signal at the input of high side transistor driver 2130 that will turn off high side transistor 2125. In further embodiments, state storing capacitor 2955 voltage may remain at a low state during this time because it has no discharge path.

In one embodiment, since the turn off process in circuit 2100 does not involve charging level shift node capacitors through a high value pull up resistor, the turn off times may be relatively shorter than in half bridge circuit 100 in FIG. 1. In further embodiments, high side transistor 2125 turn on and turn off processes may be controlled by the turn on of substantially similar level shift transistors 2203, 2205, therefore the turn on and turn off propagation delays may be substantially similar. This may result in embodiments that have no need for a pull up trigger circuit and/or a pull up transistor as were both used in half bridge circuit 100 in FIG. 1.

ESD Circuits

Figure 34:
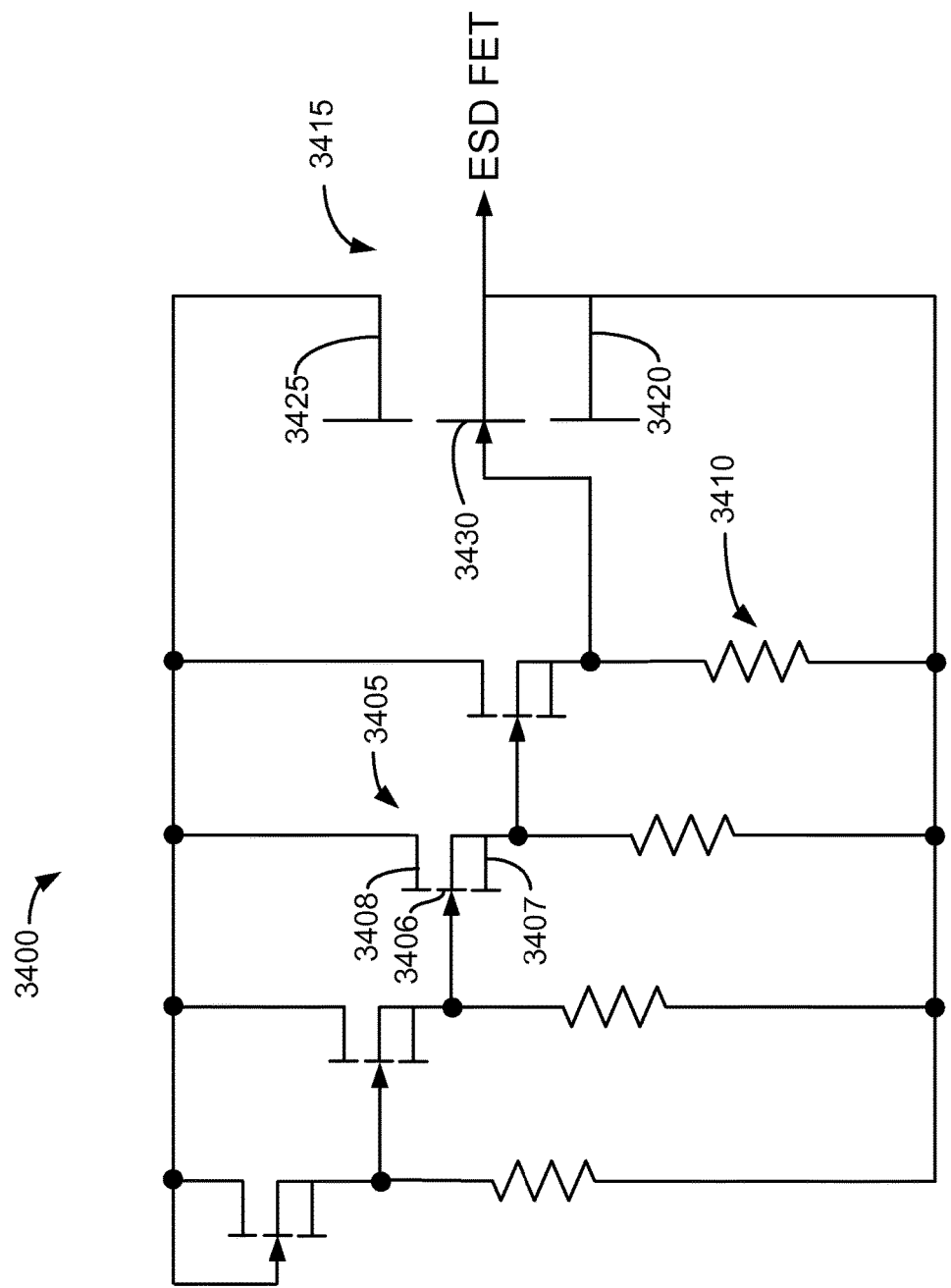
FIG. 34 is a schematic of an electro-static discharge (ESD) clamp circuit according to an embodiment of the invention.

Now referring to FIG. 34, in some embodiments, one or more pins (i.e., connections from a semiconductor device within an electronic package to an external terminal on the electronic package) may employ an electro-static discharge (ESD) clamp circuit to protect the circuit. The following embodiments illustrate ESD clamp circuits that may be used on one or more pins in one or more embodiments disclosed herein, as well as other embodiments that may require ESD protection. In further embodiments, the ESD clamp circuits disclosed herein may be employed on GaN-based devices.

One embodiment of an electro-static discharge (ESD) clamp circuit 3400 is illustrated. ESD clamp circuit 3400 may have a configuration employing one or more source follower stages 3405 made from enhancement-mode transistors. Each source follower stage 3405 may have a gate 3406 connected to a source 3407 of an adjacent source follower stage. In the embodiment illustrated in FIG. 34, four source follower stages 3405 are employed, however in other embodiments fewer or more may be used. Resistors 3410 are coupled to sources 3407 of source follower stages 3405.

An ESD transistor 3415 is coupled to one or more source follower stages 3405 and may be configured to conduct a current greater than 500 mA when exposed to an overvoltage pulse, as discussed below. Resistors 3410 are disposed between source 3420 of ESD transistor 3415 and each source 3407 of source follower stages 3405. Drains 3408 of source follower stages 3405 are connected to drain 3425 of ESD transistor 3415. Source 3407 of the last source follower stage is coupled to gate 3430 of ESD transistor 3415.

In one embodiment, a turn on voltage of ESD clamp circuit 3400 can be set by the total number of source follower stages 3405. However, since the last source follower stage is a transistor with a certain drain 3408 to source 3407 voltage and gate 3406 to source voltage the current through the final resistor 3410 may be relatively large and may result in a larger gate 3430 to source 3420 voltage across ESD transistor 3415. This condition may result in a relatively large ESD current capability and in some embodiments an improved leakage performance compared to other ESD circuit configurations.

In further embodiments, ESD clamp circuit 3400 may have a plurality of degrees of freedom with regard to transistor sizes and resistor values. In some embodiments ESD clamp circuit 3400 may be able to be made smaller than other ESD circuit configurations. In other embodiments, the performance of ESD clamp circuit 3400 may be improved by incrementally increasing the size of source follower stages 3405 as they get closer to ESD transistor 3415. In further embodiments, resistors 3410 can be replaced by depletion-mode transistors, reference current sinks or reference current sources, for example.

Figure 35:
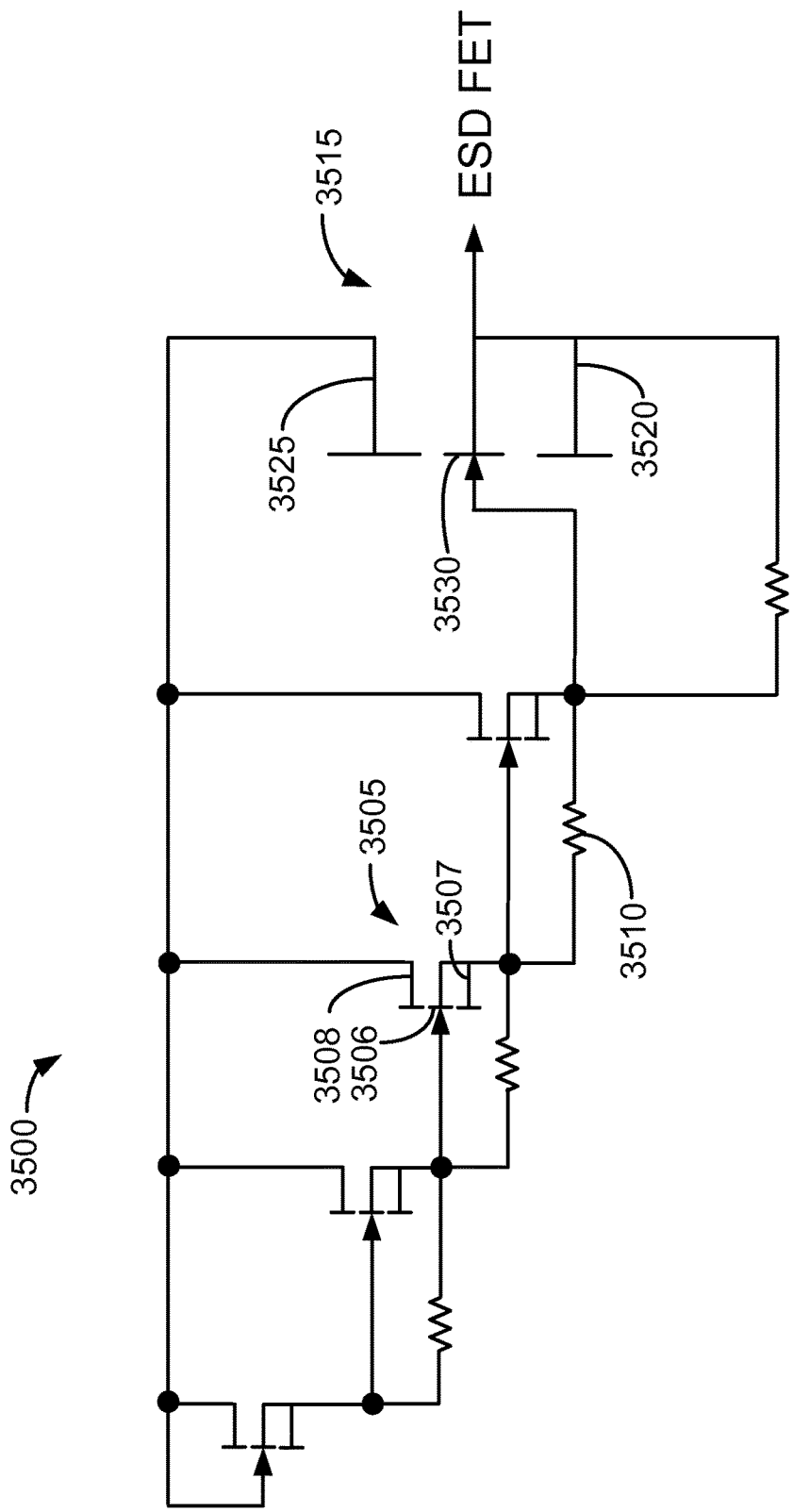
FIG. 35 is a schematic of an electro-static discharge (ESD) clamp circuit according to an embodiment of the invention.

Now referring to FIG. 35 an embodiment similar to ESD clamp circuit 3400 in FIG. 34 is illustrated, however ESD clamp circuit 3500 may have resistors in a different configuration, as discussed in more detail below. ESD clamp circuit 3500 may have a configuration employing one or more source follower stages 3505 made from one or more enhancement-mode transistors. Each source follower stage 3505 may have a gate 3506 connected to a source 3507 of an adjacent source follower stage. In the embodiment illustrated in FIG. 35, four source follower stages 3505 are employed, however in other embodiments fewer or more may be used. Resistors 3510 are coupled between sources 3507 of adjacent source follower stages 3505. An ESD transistor 3515 is coupled to source follower stages 3505 with resistor 3510 disposed between source 3520 of ESD transistor 3515 and source 3507 of a source follower stage 3505. Drains 3508 of source follower stages 3505 may be coupled together and to drain 3525 of ESD transistor 3515.

Electronic Packaging

Figure 36:
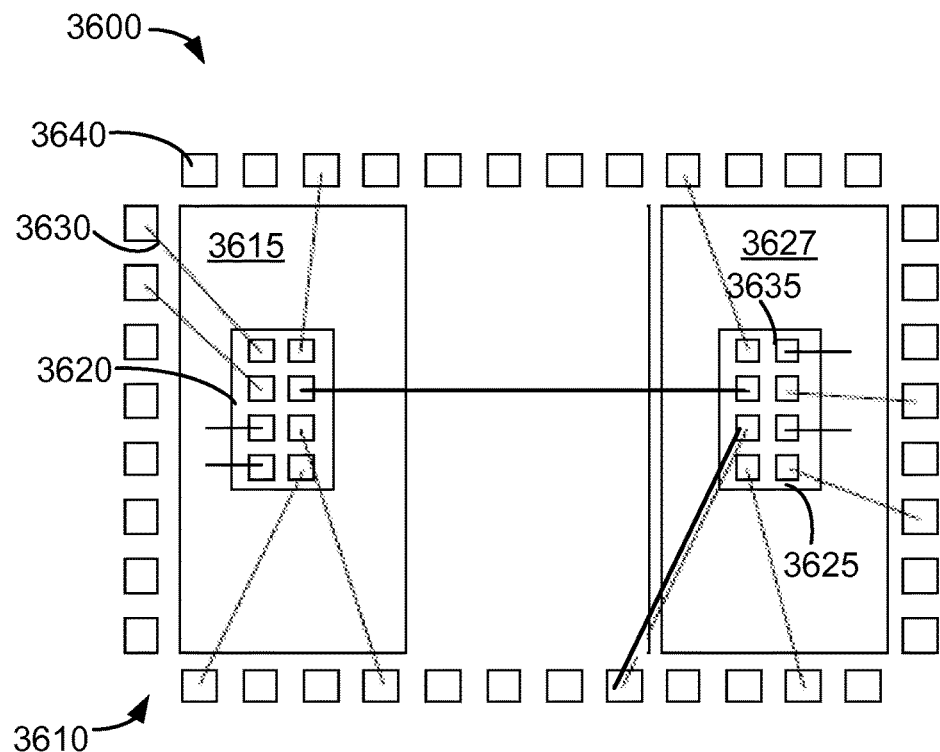
FIG. 36 is an illustration of a portion of an electronic package according to an embodiment of the invention.
Figure 37:
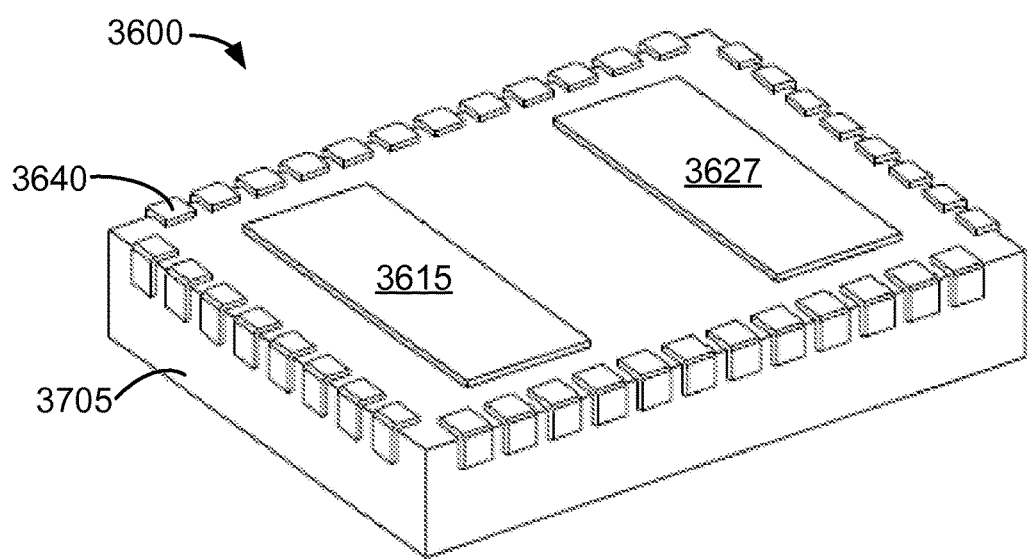
FIG. 37 is an illustration of the electronic package of FIG. 36.

Now referring to FIGS. 36 and 37, in some embodiments, one or more semiconductor devices may be disposed in one or more electronic packages. Myriad packaging configurations and types of electronic packages are available and are within the scope of this disclosure. FIG. 36 illustrates one example of what is known as a quad-flat no-lead electronic package with two semiconductor devices within it.

Electronic package 3600 may have a package base 3610 that has one or more die pads 3615 surrounded by one or more terminals 3620. In some embodiments package base 3610 may comprise a leadframe while in other embodiments it may comprise an organic printed circuit board, a ceramic circuit or another material.

In the embodiment depicted in FIG. 36, a first device 3620 is mounted to a first die pad 3615 and a second device 3625 is mounted to a second die pad 3627. In another embodiment one or more of first and second devices 3620, 3625, respectively may be mounted on an insulator (not shown) that is mounted to package base 3610. In one embodiment the insulator may be a ceramic or other non-electrically conductive material. First and second devices 3620, 3625, respectively are electrically coupled to terminals 3640 with wire bonds 3630 or any other type of electrical interconnect such as, for example, flip-chip bumps or columns that may be used in a flip-chip application. Wirebonds 3630 may extend between device bond pads 3635 to terminals 3640, and in some cases to die pads 3615, 3627 and in other cases to device bond pads 3635 on an adjacent device.

Now referring to FIG. 37, an isometric view of electronic package 3600 is shown. Terminals 3640 and die attach pads 3615 and 3627 may be disposed on an external surface and configured to attach to a printed circuit board or other device. In further embodiments, terminals 3640 and die attach pads 3615 and 3627 may only be accessible within the inside of electronic package 3600 and other connections may be disposed on the outside of the electronic package. More specifically, some embodiments may have internal electrical routing and there may not be a one to one correlation between internal and external connections.

In further embodiments first and second devices 3620, 3625, respectively (see FIG. 36) and a top surface of package base 3610 may be encapsulated by a non-electrically conductive material, such as for example, a molding compound. Myriad other electronic packages may be used such as, but not limited to, SOIC's, DIPS, MCM's and others. Further, in some embodiments each device may be in a separate electronic package while other embodiments may have two or more electronic devices within a single package. Other embodiments may have one or more passive devices within one or more electronic packages.

Most manufacturable GaN technologies come with just one type of GaN transistor, either enhancement or depletion mode. Having both categories of FETs within a given technology introduces tremendous process complexities. As a result, control circuitry for manufacturing in an enhancement mode GaN FET only process is desirable. Desirable characteristics of the control circuitry include integratability, rail to rail drive capability, and pull-up devices and pull-down devices not being simultaneously conductive, which would otherwise cause shoot through current.

The high side transistor driver 130 or in the low side transistor driver 120 of FIG. 1 may include such control circuitry for driving power devices 125 and 115.

Figure 38:
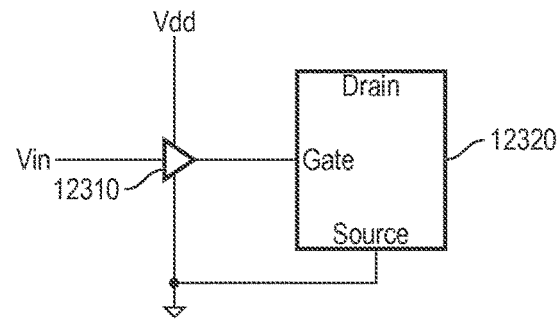
FIG. 38 is a schematic circuit diagram illustrating a non-inverting rail to rail driver driving a power switch device.

FIG. 38 is a schematic circuit diagram illustrating a non-inverting rail to rail driver 12310 driving a power switch device 12320, which may be similar to power device 115 of FIG. 1. In this embodiment, the buffer 12310 is formed with GaN FETs integrated on the same GaN substrate, has rail to rail drive capability, and is configured to prevent shoot through current. Driver 12310 may include features of the logic gates discussed elsewhere herein.

Figure 39:
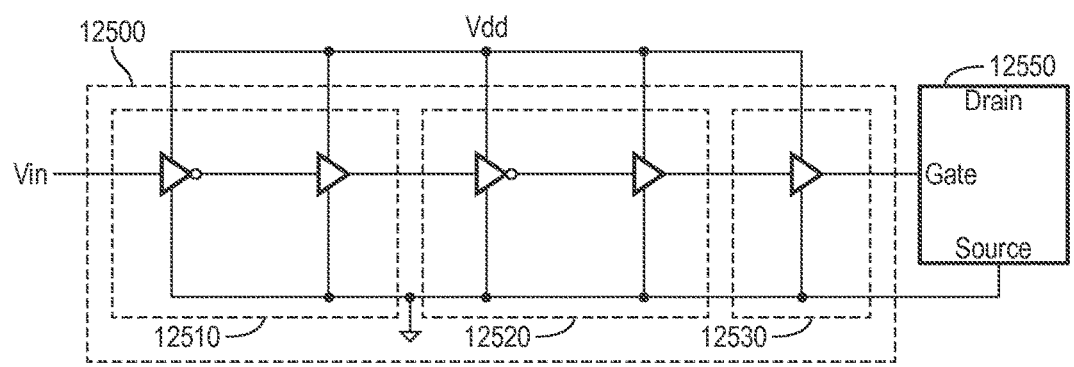
FIG. 39 is a schematic circuit diagram illustrating a non-inverting rail to rail driver.

FIG. 39 is a schematic circuit diagram illustrating a non-inverting rail to rail driver 12500 driving a power switch device 12550, which may be similar to power device 115 of FIG. 1. In this embodiment, the driver 12500 is formed with GaN FETs integrated on the same GaN substrate, has rail to rail drive capability, and is configured to prevent shoot through current.

Driver 12500 includes first stage 12510, second stage 12520, and buffer stage 12530. In this embodiment first and second stages 12510 and 12520 are inverting, and each include an inverter and a buffer. Buffer stage 12530 has pull-up and pull-down FETs. The inverters, buffers, and buffer stage 12530 of driver 12500 may include features of the logic gates discussed elsewhere herein.

Figure 40:
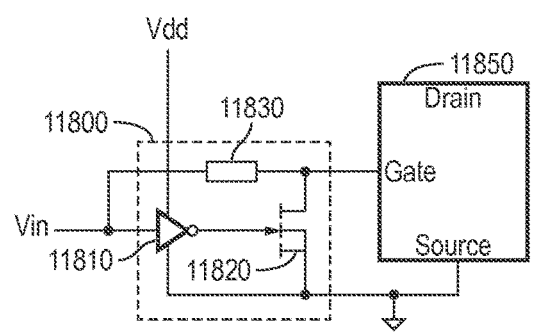
FIG. 40 is a schematic diagram of a driving circuit configured to drive a power switch device.

FIG. 40 is a schematic diagram of a driving circuit 11800 configured to a drive power switch device 11850, which may be similar to power device 115 of FIG. 1. Driving circuit 11800 includes inverter 11810, pull-down FET 11820, and resistor 11830. In some embodiments, driving circuit 11800 and power device 11850 are integrated in a single GaN device. For example, driving circuit 11800 and power device 11850 may be formed on the same GaN substrate. The driving circuit 11800 is connected to power supply Vdd and the power device 11850 may be connected to Vdd or to a separate power supply.

The Inverter 11810 may have features of one or more of the logic gates discussed elsewhere herein.

In this circuit, the inverter 11810 inverts the input and drives the gate of pull-down FET 11820. The input is also connected, through series connected delay element 11830, to the drain of the pull-down FET 11820 and to the gate of the drive power device 11850.

The delay element 11830 and inverter 11810 may be configured such that the input signal is applied to the gate of the power device 11850 after the inverted input signal is applied to the gate of the pull-down FET 11820. In some embodiments, the delay element may be configured such that high to low transitions of the input is applied to the gate of the power device 11850 after the turn on of the pull-down FET 11820. In some embodiments, delay element 11830 may be configured to delay low to high transitions in the inverted input signal such that they are applied to the gate of the power device 11850 after the gate of a power pull-up device (not shown) is turned off. In some embodiments, the driving circuit 11800 may be configured to prevent dv/dt induced undesired turn on of the power device 11850 during its turn off transient. In some other embodiments, the driving circuit 11800 may be configured to increase the turn off speed of the power device 11850.

In some embodiments, the delay element 11830 includes a series resistor. In some embodiments, the delay element 11830 includes a digital buffer.

Figure 41:
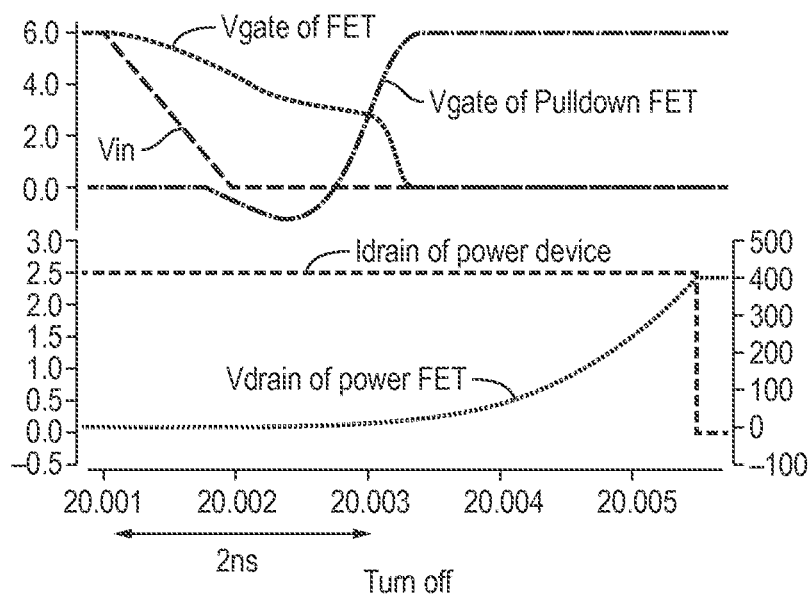
FIGS. 41 and 42 are waveform diagrams illustrating simulated waveforms of the drive circuit of FIG. 40.
Figure 42:
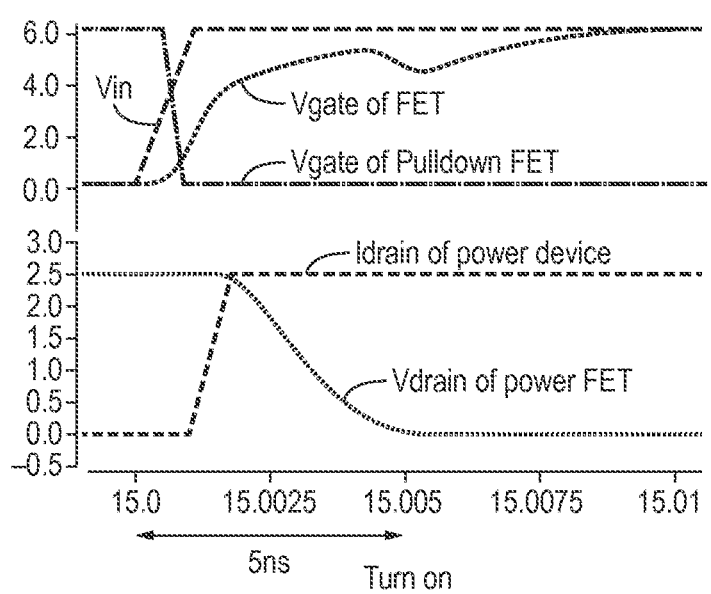

FIGS. 41 and 42 are waveform diagrams illustrating simulated waveforms of the drive circuit 11800.

Figure 43:
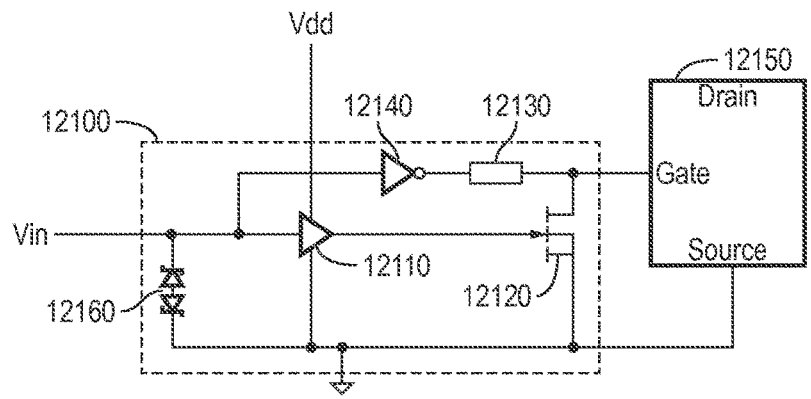
FIG. 43 is a schematic diagram of a driver configured to drive power switch device.

FIG. 43 is a schematic diagram of a driver 12100 configured to drive power switch device 12150, which may be similar to power device 115 of FIG. 1. Driving circuit 12100 includes buffer 12110, pull-down FET 12120, delay element 12130, inverter 12140, and ESD clamp 12160. In some embodiments, driving circuit 12100 and drive power device 12150 are integrated in a single GaN device. For example, driving circuit 12100 and drive power device 12150 may each include GaN FETs formed on the same GaN substrate. The driving circuit 12100 is connected to power supply Vdd and the power device 12150 may be connected to Vdd or to a separate power supply.

The buffer 12110 may have features of one or more of the logic gates discussed elsewhere herein.

In this circuit, the buffer 12110 drives the gate of pull-down FET 12120. The input is also connected to inverter 12140, whose output is connected, through series connected delay element 12130, to the drain of the pull-down FET 12120 and to the gate of the power device 12150.

The delay element 12130, the inverter 12140, and the buffer 12110 may be configured such that the inverted input signal is applied to the gate of the power device 12150 after the input signal is applied to the gate of the pull-down FET 12120. In some embodiments, the delay element and inverter may be configured such that high to low transitions of the inverted input signal is applied to the gate of the power device 12150 after the turn on of the pull-down FET 12120. In some embodiments, delay element 12130 may be configured to delay low to high transitions in the inverted input signal such that they are applied to the gate of the power device 12150 after the gate of a power pull-up device (not shown) is turned off. In some embodiments, the driving circuit 12100 may be configured to prevent dv/dt induced undesired turn on of the power device 12150 during its turn off transient. In some embodiments, the driving circuit 12100 may be configured to increase the turn off speed of the power device 12150.

In some embodiments, the delay element 12130 includes a series resistor. In some embodiments, the delay element 12130 includes a digital buffer, a current sink, or a depletion mode FET.

Figure 44:
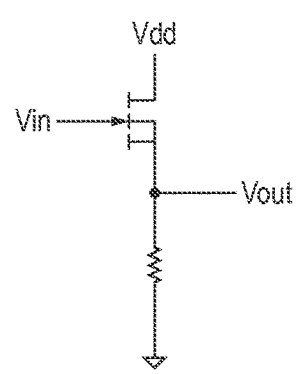
FIG. 44 is a schematic diagram of a source follower circuit.

In some embodiments, the buffer 12110 includes a series of an even number of inverters (or inverter/buffers). In some embodiments, buffer 12110 includes a source follower circuit, such as that shown in FIG. 44.

In some embodiments, electrostatic discharge (ESD) clamp 12160 is configured to conduct if the voltage difference between its terminals is greater than a minimum threshold. In some embodiments, ESD clamp 12160 is configured to conduct in response to a fast rising (e.g. ~1 ns rise time) voltage or current pulses appearing across its terminals.

Figure 45:
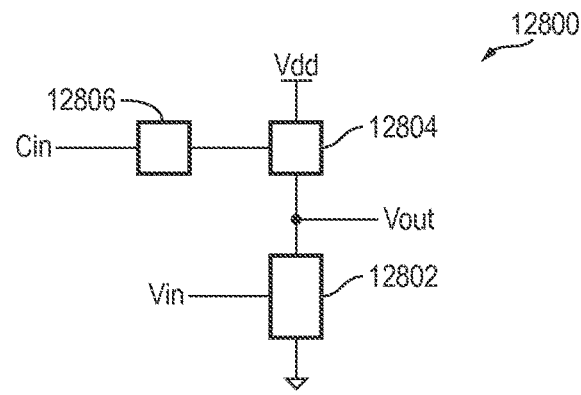
FIG. 45 is a schematic block diagram of a logic gate.

FIG. 45 is a schematic block diagram of a logic gate 12800 according to some embodiments. In some embodiments, logic gate 12800 may be used, for example, in or as one or more of the drivers 12310, 12500, and 12100 of FIGS. 38, 39, and 43, respectively.

Logic gate 12800 includes pull-down device 12802, pull-up device 12804, and control circuitry 12806. Logic gate 12800 is configured to generate a voltage at output node Vout based on one or more voltage inputs at input Vin.

Pull-down device 12802 is configured to conditionally conduct current from output node Vout to Ground according to one or more Ground referenced voltages at input Vin. In some embodiments, pull-down device 12802 can be switched on in less than 100 nanoseconds. In addition, Pull-up device 12804 is configured to conditionally conduct current from Ground referenced supply voltage Vdd to output node Vout according to a control input from control circuitry 12806. Control circuitry 12806 is configured to generate the control input based at least in part on the one or more voltage inputs at Vin.

In some embodiments, the voltage of Vdd is different from, for example, greater or less than, the voltage of a power supply providing current to, for example, the control circuitry or to a previous logic gate.

Figure 46:
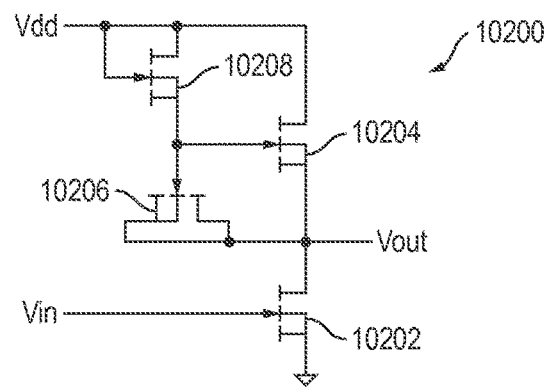
FIG. 46 is a schematic circuit diagram of an embodiment of an inverter.

FIG. 46 is a schematic circuit diagram of an embodiment of an inverter 10200, which is an implementation of logic gate 12800. As shown, inverter 10200 includes pull-down FET 10202, which receives an input to the inverter 10200 at its gate. In addition, inverter 10200 includes pull-up FET 10204. Furthermore, inverter 10200 includes control circuitry comprising capacitor FET 10206 and diode connected FET 10208. The output node of the inverter 10200 is connected to pull-down FET 10202, pull-up FET 10204, and capacitor FET 10206.

In the inverter 10200, when Vin is ramped up to a voltage greater than the threshold voltage (Vth) of the pull-down FET 10202 the pull-down FET 10202 turns on. This causes the output voltage to be driven to ground, and charges the capacitor FET 10206 through the diode connected FET to a voltage equal to Vdd−Vth. The voltage at the gate of the pull-up FET 10204 is equal to Vdd−Vth, which is enough to just turn on the pull-up FET 10204, but the pull-up FET 10204 is sized so that it does not pull the output high with pull-down FET 10202 conducting. This corresponds to the High to Low transient of Vout, shown in FIG. 47.

When Vin is ramped below Vth the pull-down FET 10202 is turned off. This causes the output voltage to rise towards the maximum voltage Vdd, since the pull-up FET 10204 is still conducting. This will cause a positive going dv/dt at the bottom plate of the capacitor FET 10206. As a result of charge injection or capacitive coupling, dv/dt at the top plate of the capacitor FET 10206 will also occur. If the capacitor FET 10206 has sufficiently large capacitance as compared with the other capacitances at the top plate, the dv/dt at the top plate of the capacitor FET 10206 will be similar to the dv/dt at the bottom plate of the capacitor FET 10206. The positive going dv/dt at the top plate of the capacitor FET 10206 increases the gate voltage of the pull-up FET 10204, for example, to a voltage at least greater than a threshold voltage above Vdd. In some embodiments, the gate voltage of the pull-up FET 10204 is increased to approximately 2*Vdd−Vth. This results in the positive going dv/dt at the output node. The output voltage is ramped up to a voltage close to or equal to the maximum voltage Vdd. The diode connected FET 10208 is reverse biased during this period and will not allow discharge of the capacitor voltage. This corresponds to the Low to High transient of Vout, shown in FIG. 48.

When Vin is ramped below Vth with a dv/dt which is slow, the pull-down FET 10202 is slowly turned off. This causes the output voltage to rise towards Vdd slowly. This will cause a slow positive going dv/dt at the bottom plate of the capacitor FET 10206. As a result of the slow dv/dt at the bottom plate, the dv/dt at the top plate of the capacitor FET 10206 will also be slow at least because of charge leakage. The slow positive going dv/dt at the top plate of the capacitor FET 10206 may not substantially increase the gate voltage of the pull-up FET 10204. This results in the gate voltage of the pull-up FET 10204 substantially remaining at Vdd-Vt. The output voltage is therefore ramped up to a voltage close to or equal to Vdd−2Vt.

Accordingly, because of the capacitive coupling, the high output of inverter 10200 is dependent on the input slew rate of high to low voltage transitions. For transitions greater than a threshold, the gate voltage of the pull-up FET 10204 is increased as discussed above, for example, to approximately 2*Vdd−Vth. As a result, the high output of inverter 10200 is substantially equal to Vdd. However, for transitions less than the threshold, the high output of inverter 10200 is less than Vdd because for slower transitions, the gate voltage of the pull-up FET 10204 is not sufficiently increased by the capacitive coupling. For transitions less than a second threshold, the high output of inverter 10200 is substantially equal to Vdd−2Vth. The thresholds are dependent on capacitances and threshold voltages of the devices of inverter 10200.

In some embodiments, a Schottky diode or another diode is used instead of diode connected FET 10208. In some embodiments, the diode connected FET 10208 includes multiple diode connected FETs, or multiple Schottky or other diodes.

Because both High to Low and Low to High transients are caused by FETs that are conductive, the propagation delay of inverter 10200 can be greatly reduced compared to a simple resistor pull-up configuration. In some embodiments, the transients may be more symmetric.

Figure 47:
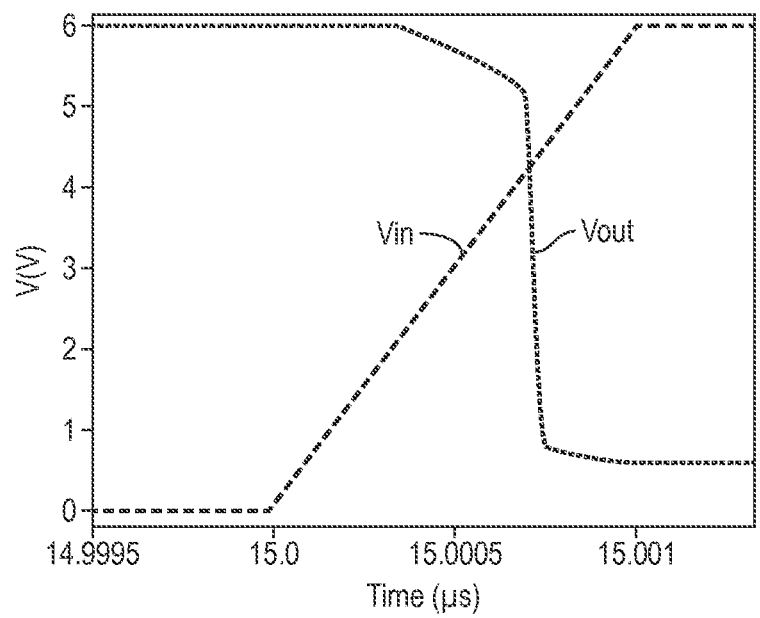
FIGS. 47 and 48 are waveform diagrams of the inverter of FIG. 46.
Figure 48:
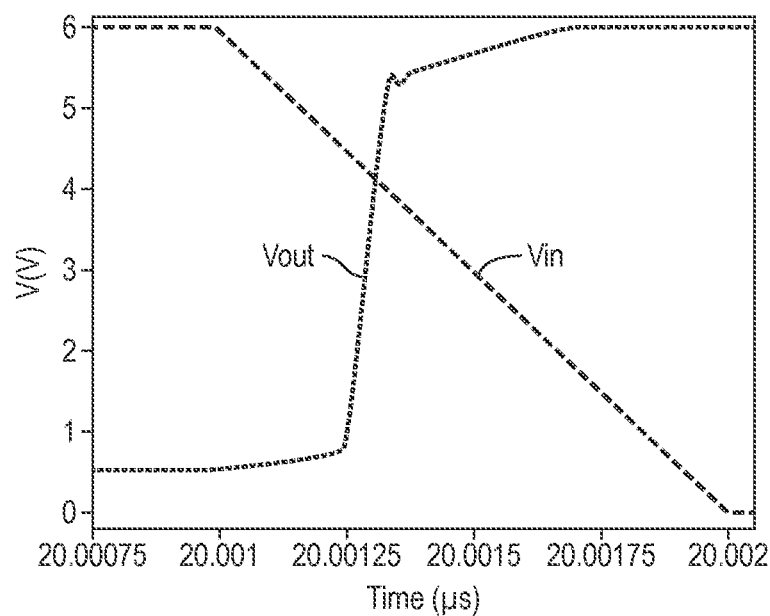

In some embodiments, the voltages across the drain to source of the pull-up and pull-down FETs 10202 and 10204 are about 6-12V. Accordingly, pull-up and pull-down FETs 10202 and 10204 can be constructed with a much smaller footprint than that of higher voltage FETs. The capacitor FET 10206 and the diode connected FET 10208 also experience relatively low voltages, and can, therefore, be constructed with a much smaller footprint than higher voltage FETs. The Low Voltage (LV) FETs can be reliably manufactured in the same process flow as the higher voltage FETs with just a layout change. The switching transients are shown in FIGS. 47 and 48.

One drawback of inverter 10200 is that when the pull-down FET 10202 is on, the pull-up FET 10204 may also be on (depending on the voltage across the capacitor). This will result in shoot through current having a magnitude partly dependent on the sizes of pull-up and pull-down FETs 10202 and 10204. Therefore, if the inverter 10200 is to drive a large load, relatively large FET sizes will be used, and the current drawn from the power supply (Vdd) may be significant.

Figure 49:
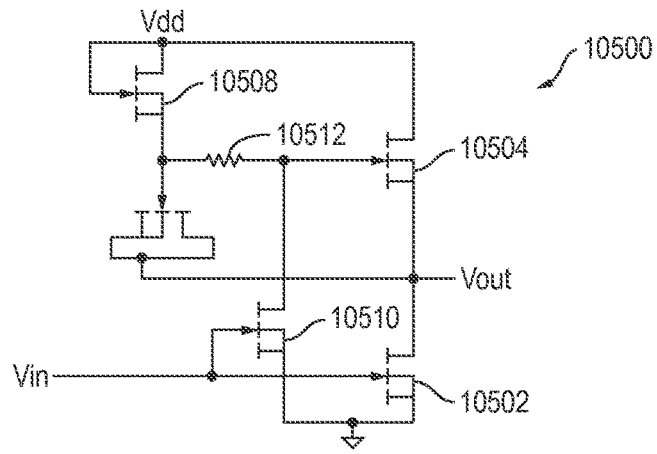
FIG. 49 is a schematic circuit diagram of an embodiment of an inverter.

FIG. 49 is a schematic circuit diagram of an embodiment of an inverter 10500, which is an implementation of logic gate 12800. Inverter 10500 includes pull-down FET 10510 and current limiting resistor 10512.

In the embodiment of FIG. 49, the pull-down FET 10510 receives the input voltage at its gate along with the pull-down FET 10502. The pull-down FET 10510 is, accordingly, turned on with the pull-down FET 10502. This ensures that the gate of the pull-up FET 10504 never goes above Vth while the pull-down FET 10502 is turned on. In addition, turning on of pull-up FET 10504 is triggered by the same signal which turns off the pull-down FET 10502. This ensures that there is no situation when both the pull-up FET 10504 and the pull-down FET 10502 are simultaneously on. The resistor 10512 is in series with the pull-down FET 10502 and ensures that current drawn from Vdd is limited. This embodiment results in a much better optimization between current drawn from Vdd and inverter performance.

Alternative embodiments include a pull-down FET and do not include a limiting resistor. In such embodiments, the diode connected FET 10508 may have relatively reduced size to limit its current.

Figure 50:
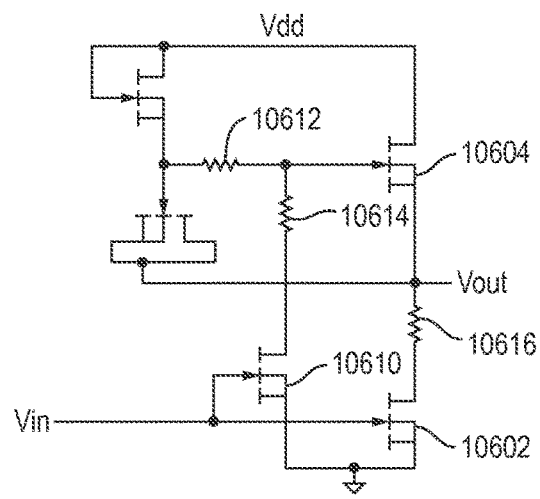
FIG. 50 is a schematic circuit diagram of an embodiment of an inverter.

FIG. 50 is a schematic circuit diagram of an embodiment of an inverter 10600, which is an implementation of logic gate 12800. Inverter 10600 includes resistors 10612 and 10614 in series with the pull-down FET 10610. Sizes and relative sizes of the resistors 10612 and 10614 may be determined so as to optimize tradeoffs between current and switching speed.

Alternative embodiments include a pull-down FET and do not include resistor 10612.

Inverter 10600 also includes optional resistor 10616, which may be sized, for example, to manage dv/dt of High to Low output voltage transitions, for example, to match dv/dt of Low to High output voltage transitions.

In some embodiments, one or more diodes may be placed between the pull-up FET 10104 and the inverter output node. This results in an inverter High output that is level shifted down by one or more diode drops. The diodes may be, for example, Schottky diodes or diode connected FETs. The High level shifted output voltage may, for example, be equal to Vdd (supply voltage)−V (Diode).

In some embodiments, one or more diodes may be placed between the pull-down FET 10602 and the inverter output node. This results in an inverter Low output that is level shifted up by one or more diode drops. The diodes may be, for example, Schottky diodes or diode connected FETs. The level shifted Low output voltage may, for example, be equal to V (Diode).

In some embodiments, one or more diodes may be placed between the pull-up FET and the inverter output node, and one or more diodes may be placed between the pull-down FET and the inverter output node. For example, such embodiments may have an output voltage that swings from Vdd-V(diode) to V(diode).

Figure 51:
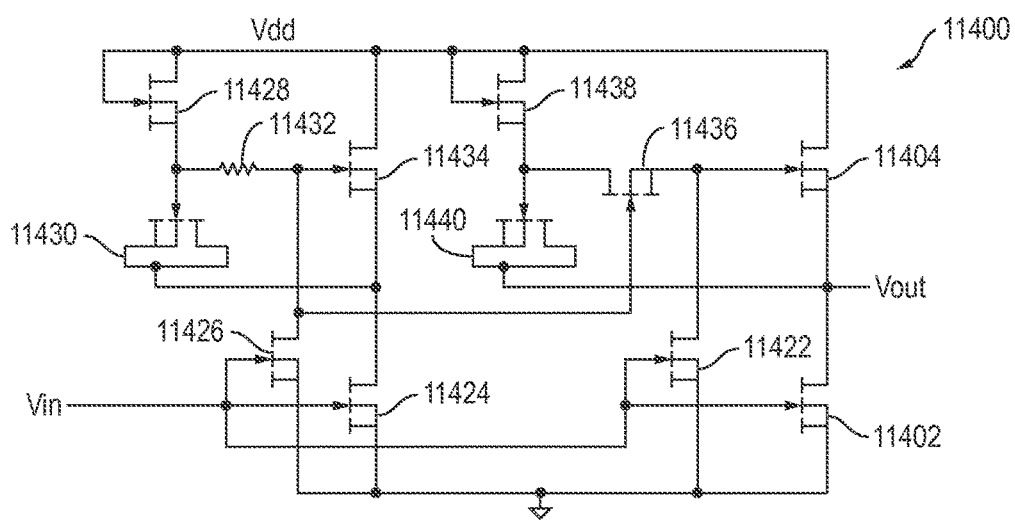
FIG. 51 is a schematic circuit diagram of an embodiment of an inverter.

FIG. 51 is a schematic circuit diagram of an embodiment of an inverter 11400, which is an implementation of logic gate 12800. Inverter 11400 includes pull-down device 11402, pull-up device 11404, and control circuitry which includes pull-down FETs 11422, 11424, and 11426, capacitor FETs 11430 and 11440, diode FETs 11428 and 11438, resistor 11432, pull-up FET 11434, and pass FET 11436.

In the embodiment of FIG. 51, the pull-down FET 11402 receives the input voltage at its gate along with pull-down FET 11422. In response to a high input, pull-down FET 11402 is turned on and the output is pulled to ground. In addition, pull-down FET 11422 is turned on and pass FET 11436 is turned off by pull-down FET 11426 so that the gate of the pull-up FET 11404 is pulled to ground to prevent shoot through current.

In response to a low input, pull-down FETs 11402 and 11422 are turned off. In addition, the pass FET 11436 is turned on by the capacitive coupling pull-up of the gate of pull-up FET 11434. Additionally, the drain voltage of the pass FET 11436 is pulled up by capacitive coupling, as discussed elsewhere. In addition, the gate of pull-up device 11404 is driven by the control circuitry according to principles discussed elsewhere with reference to similar circuits. The result is that pull-up FET 11404 drives the output to Vdd.

In this embodiment, an actively controlled transistor (pass FET 11436) is used to selectively connect the gate of the pull-up FET 11404 to the top plate of capacitor FET 11440. As a result, the capacitor FET 11440 can drive a larger capacitive load than would be the case if, for example, a resistor were used instead of the actively controlled transistor. Consequently, pull-up FET 11404 can be larger to provide more current to the output Vout. Therefore, for positive transitions, the pass FET 11436 acts as a low capacitance input to a buffer, which is driven by an inverter, and which has a current driving capacity based on pull-up FET 11404, where the current driving capacity of the pull-up FET 11404 is greater than the current driving capacity of the driving inverter.

In the illustrated embodiment, the control circuitry includes features similar or identical to inverter 10500 of FIG. 49. In some embodiments, the control circuitry includes features similar or identical to a different inverter configuration.

Figure 52:
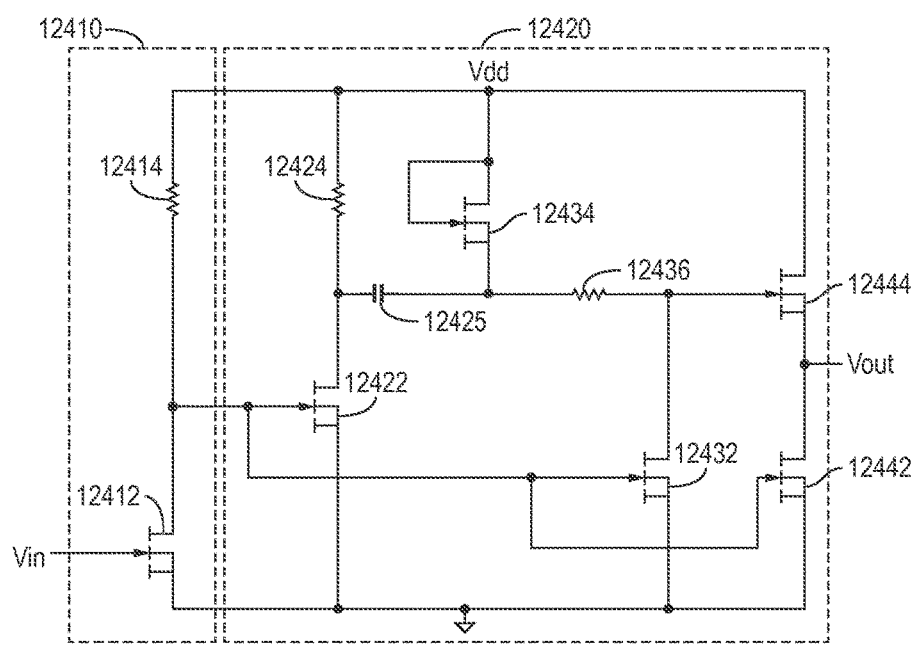
FIG. 52 is a schematic circuit diagram of an embodiment of a buffer.

FIG. 52 is a schematic circuit diagram of an embodiment of a buffer 12400, which is an implementation of logic gate 12800. Buffer 12400 provides a non-inverting rail to rail output and includes first inverter 12410 and second inverter 12420.

First inverter 12410 includes FET 12412 and resistor 12414. In some embodiments, other inverting logic gates may be used.

Second inverter 12420 includes pull-down device FET 12442, pull-up device FET 12444, and control circuitry comprising FET 12422, resistor 12424, capacitor 12425, diode connected FET 12434, resistor 12436, and FET 12432.

In response to Vin being Low, the output of the first inverter 12410 is High, which turns on pull-down device FET 12442, causing output to go Low. Also, the output of the first inverter 12410 being High causes FET 12432 to pull the gate of pull-up device FET 12444 low, which turns off FET 12444. Furthermore, with Vin Low, the FET 12422 and diode connected FET 12434 cause the capacitor to be charged to Vdd-Vth.

In response to Vin transitioning High, the output of the first inverter 12410 transitions Low, turning off pull-down device FET 12442 and FET 12432, respectively allowing the output and the gate of pull-up device FET 12444 to go High. In addition, FET 12422 turns off, allowing the voltage at its drain to go High. This causes the capacitor 12425 to inject charge onto the gate of pull-up device FET 12444 through resistor 12436, thereby causing the gate of pull-up device FET 12444 to go above Vdd (e.g. approximately 2*Vdd–Vth). In response to its gate voltage, pull-up device FET 12444 drives the output to Vdd.

In some embodiments, the resistor 12436 is replaced by one or more depletion mode FETs to increase circuit response speed.

Figure 53:
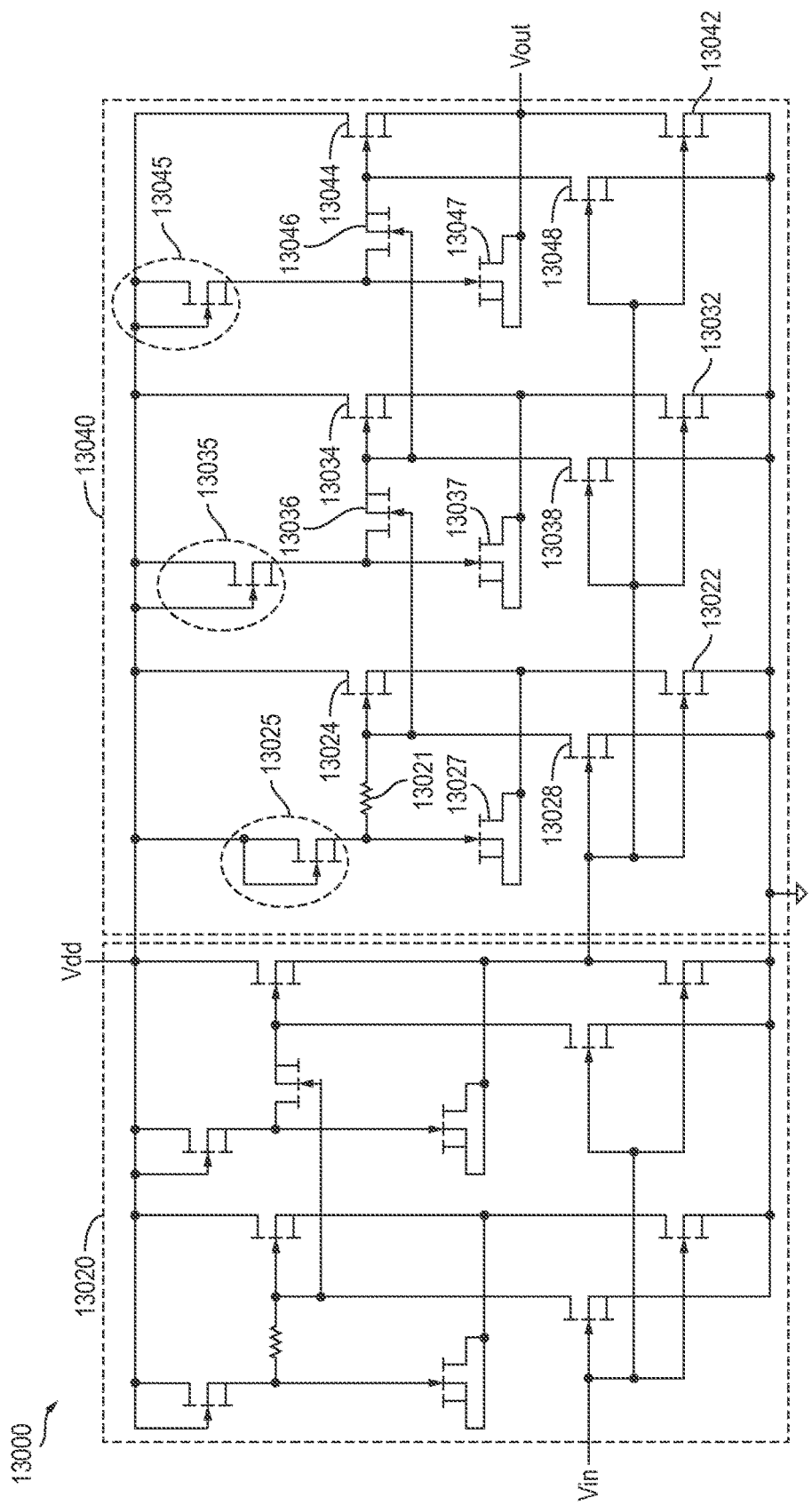
FIG. 53 is a schematic circuit diagram of an embodiment of a buffer.

FIG. 53 is a schematic circuit diagram of an embodiment of a buffer 13000, which is an implementation of logic gate 12800. Buffer 13000 is also an implementation of buffer 12500 of FIG. 39. Buffer 13000 provides a non-inverting rail to rail output and includes first inverter 13020 and second inverter 13040.

First inverter 13020 is similar to inverter 11400 of FIG. 51. In alternative embodiments, other inverters, for example, those discussed elsewhere herein may be used in buffer 13000 as the first inverter.

Second inverter 13040 includes pull-down device 13042, pull-up device 13044, and control circuitry which includes pull-down FETs 13038, 13032, 13028, and 13022, pull-up FETs 13034 and 13024, pass FETs 13046 and 13036, diode FETs 13045, 13035, and 13025, capacitors 13047, 13037, and 13027, and resistor 13021.

In this embodiment, the pull-down FET 13042 receives the input voltage at its gate along with pull-down FET 13048. In response to a high input, pull-down FET 13042 is turned on and the output is pulled to ground. In addition, pull-down FET 13048 is turned on and pull-up FET 13044 is turned off by pull-down FET 13048 to prevent shoot through current.

In response to a low input, pull-down FETs 13042 and 13048 are turned off. In addition, the gate of pull-up device 13044 is driven by the control circuitry according to principles discussed elsewhere with reference to similar circuits. The result is that pull-up FET 13044 drives the output to Vdd.

In some embodiments, the capacitor sizes may be scaled with the size of the other elements of the control circuitry.

In some embodiments a diode (or a stack of diodes) can be placed be placed between pull-up FET 13044 and pull-down FET 10342 on the output stage to create level shifted voltages as needed, for example, as discussed above.

In alternative embodiments, other inverters, for example, those discussed elsewhere herein may be used in buffer 13000 as the second inverter.

As shown, buffer 13000 has diode connected emode FETs 13045, 13035, and 13025, which respectively supply current to charge the capacitor FETs 13047, 13037, and 13027 when the respective pull-down FETs 13042, 13032, and 13022 are on. When the capacitor FETs 13047, 13037, and 13027 respectively inject charge onto the gates of pull-up FETs 13044, 13034, and 13024, diode connected emode FETs

13045, 13035, and 13025 respectively present high impedance paths from the capacitor FETs 13047, 13037, and 13027 to Vdd as a result of being reverse biased. Consequently current does not flow from the capacitor FETs 13047, 13037, and 13027 to Vdd and the capacitor FETs 13047, 13037, and 13027 substantially maintain their charge.

Figure 54:
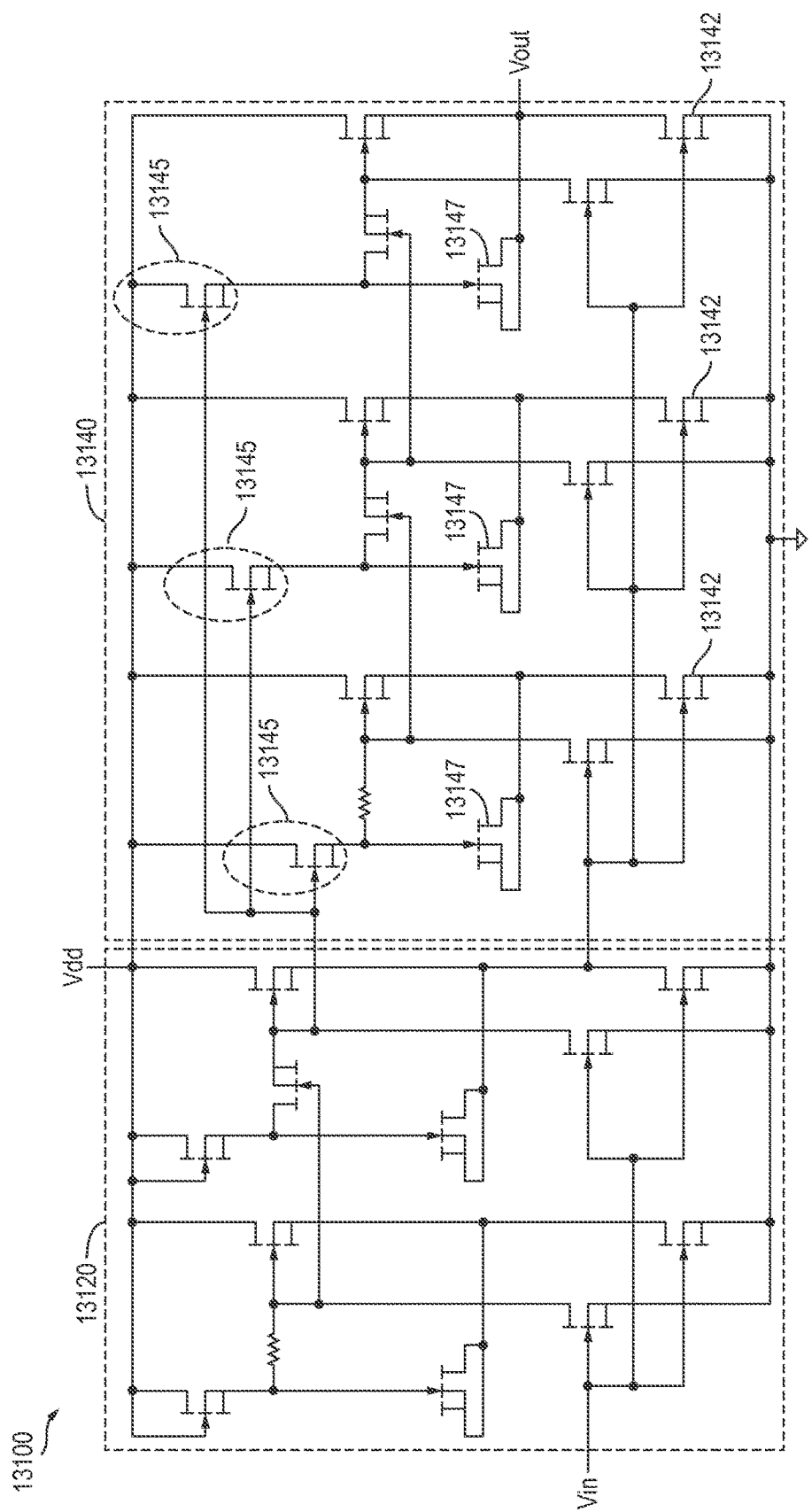
FIG. 54 is a schematic circuit diagram of an embodiment of a buffer.

FIG. 54 is a schematic circuit diagram of an embodiment of a buffer 13100, which is an implementation of logic gate 12800. Buffer 13100 is also an implementation of buffer 12500 of FIG. 39 and is similar to buffer 13000 of FIG. 53. Buffer 13100 provides a non-inverting rail to rail output and includes first inverter 13120 and second inverter 13140, which are respectively similar to first and second inverters 13020 and 13040 of FIG. 53.

Instead of diode connected FETs 13045, 13035, and 13025 of buffer 13000, buffer 13100 has pull-up FETs 13145. As shown, the gates of pull-up FETs 13145 are driven by inverter 13120. As discussed elsewhere herein, the output of inverter 13120 driving pull-up FETs 13145 may be driven to a voltage which is significantly higher than Vdd, for example, at least greater than Vdd+Vth, such as 2*Vdd−Vth. Therefore, with their gates at voltages greater than Vdd+Vth and with pull-down FETs 13142 being on, pull-up FETs 13145 charge the capacitor FETs 13147 to Vdd. As a result, the gate voltages of pull-up FETs 13144 are charged to approximately 2*Vdd by the capacitor FETs 13147 when the buffer 13100 output is high.

In some embodiments, the voltage of a power supply for the pull-up device of a logic gate is different from, for example, greater than or less than the voltage of a power supply of the control circuitry or to a previous logic gate.

Figure 55:
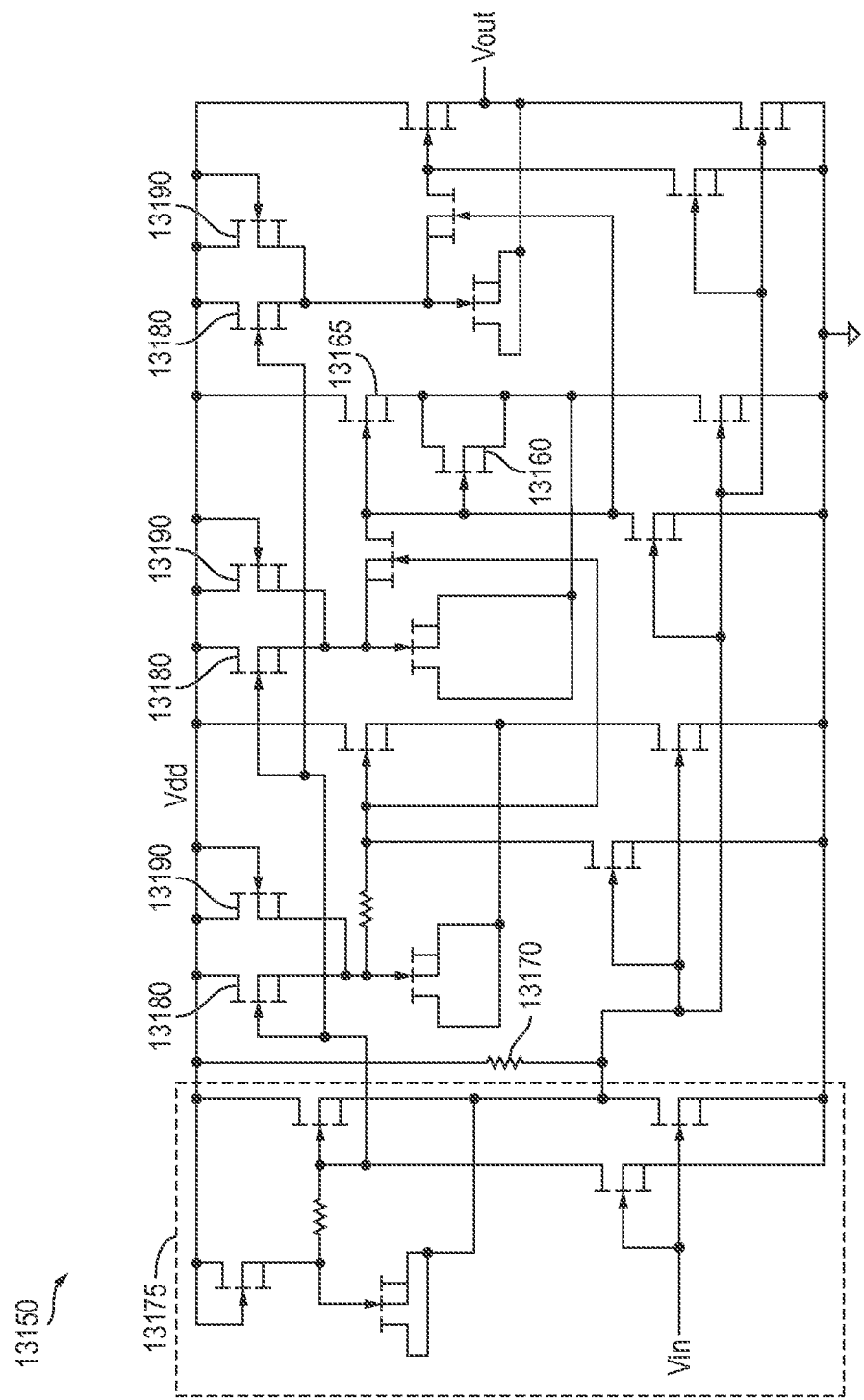
FIG. 55 is a schematic circuit diagram of an embodiment of a buffer.

FIG. 55 is a schematic circuit diagram of an embodiment of a buffer 13150, which is an implementation of logic gate 12800. Buffer 13150 is also an implementation of buffer 12500 of FIG. 39 and is similar to buffer 13000 of FIG. 53. Buffer 13150 provides a non-inverting rail to rail output and includes circuit elements and functional features which are similar to buffers 12500 and 13000 of FIGS. 39 and 53.

Buffer 13150 also includes both pull-up FETs 13180 and diode FETs 13190. Pull-up FETs 13180 are similar to pull-up FETs 13145 of FIG. 54, and diode FETs 13190 are similar to diode FETs 13025, 13035, and 13045 of FIG. 53. This configuration ensures that even if a gate signal for pull-up FETs 13180, diode FETs 13190 provide a current path to charge the capacitors.

Buffer 13150 also includes a state retention capacitor 13160 connected across the gate and source of FET 13165. State retention capacitor 13160 helps the voltage difference between the gate and source of FET 13165 to be more stable. Gate to source current leakage of FET 13165 causes a voltage drop across the gate and source of FET 13165. However, the use of state retention capacitor 13160 reduces the effect of the leakage current on the voltage across the gate and source of FET 13165.

In some embodiments, other embodiments discussed herein use one or more state retention capacitors across the gate and source of one or more FETs. For example, in some embodiments, at least one FET, used to drive a capacitor to increase the gate voltage of the driving FET, has a state retention capacitors across the gate and source thereof Buffer 13150 also includes a state retention resistor 13170 at the output of inverter 13175. State retention resistor 13170 is beneficial at least because state retention resistor 13170 causes the voltage at the output of inverter 13175 to be in a known state if buffer 13150 is inactive for a substantially long duration, the result of which would otherwise be that the voltage at the output of inverter 13175 drifts to an unknown state because of charge leakage or coupling.

Figure 56:
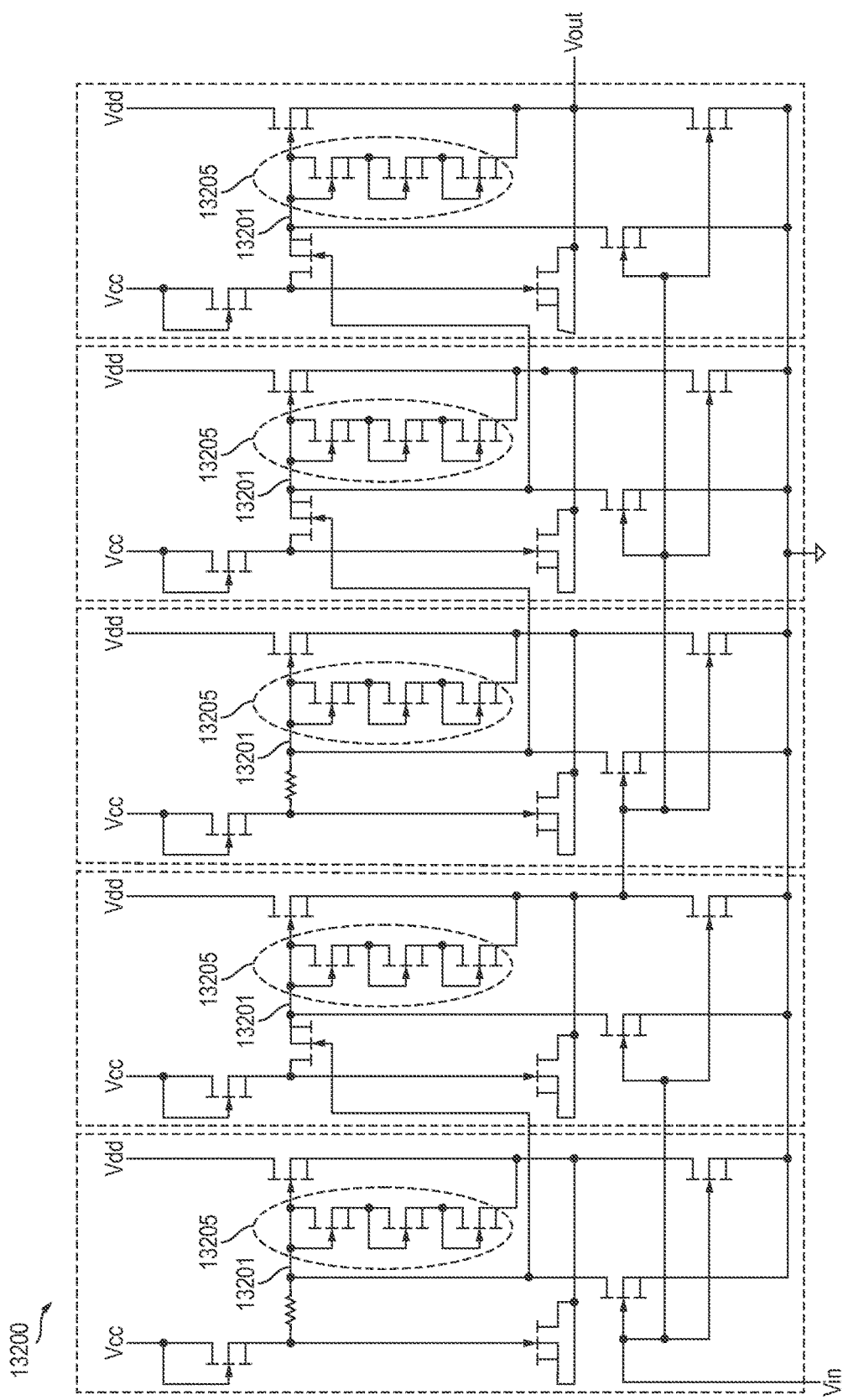
FIG. 56 is a schematic circuit diagram of an embodiment of a buffer.

FIG. 56 is a schematic circuit diagram of an embodiment of a buffer 13200, which is an implementation of logic gate 12800. Buffer 13200 is also an implementation of buffer 12500 of FIG. 39 and is similar to buffer 13000 of FIG. 53. Buffer 13200 provides a non-inverting rail to rail output and includes first inverter 13220 and second inverter 13240, which are respectively similar to first and second inverters 13020 and 13040 of FIG. 53.

In this embodiment, the power supply of certain portions of the buffer 13200 are powered by a first power supply, Vcc, and other portions of the buffer 13200 are powered by a second power supply, Vdd, where Vcc is greater than Vdd. For example, Vcc may be equal to about 10-15V and Vdd may be equal to 5-7V. In addition, some of the FETs may be built to withstand 10-15V across them, while other FETs are not. For example, those that are not, may be used because of their greater speed or transconductance. The buffer 13200 uses one or more lower voltage FETs connected to nodes 13201. Accordingly, nodes 13201 should be prevented from reaching voltage levels which could damage the lower voltage FETs.

Buffer 13200 uses diode connected FETs 13205 which prevent the nodes 13201 from going higher than, for example, Vdd+3Vth. In other embodiments, a different number of diode connected FETs is used. For example, 1, 2, 4, or more diode connected FETs may be used. In addition, clamps similar to clamps 13205 may be used in other logic gates, for example, in schematic locations similar to clamps 13205.

Figure 57:
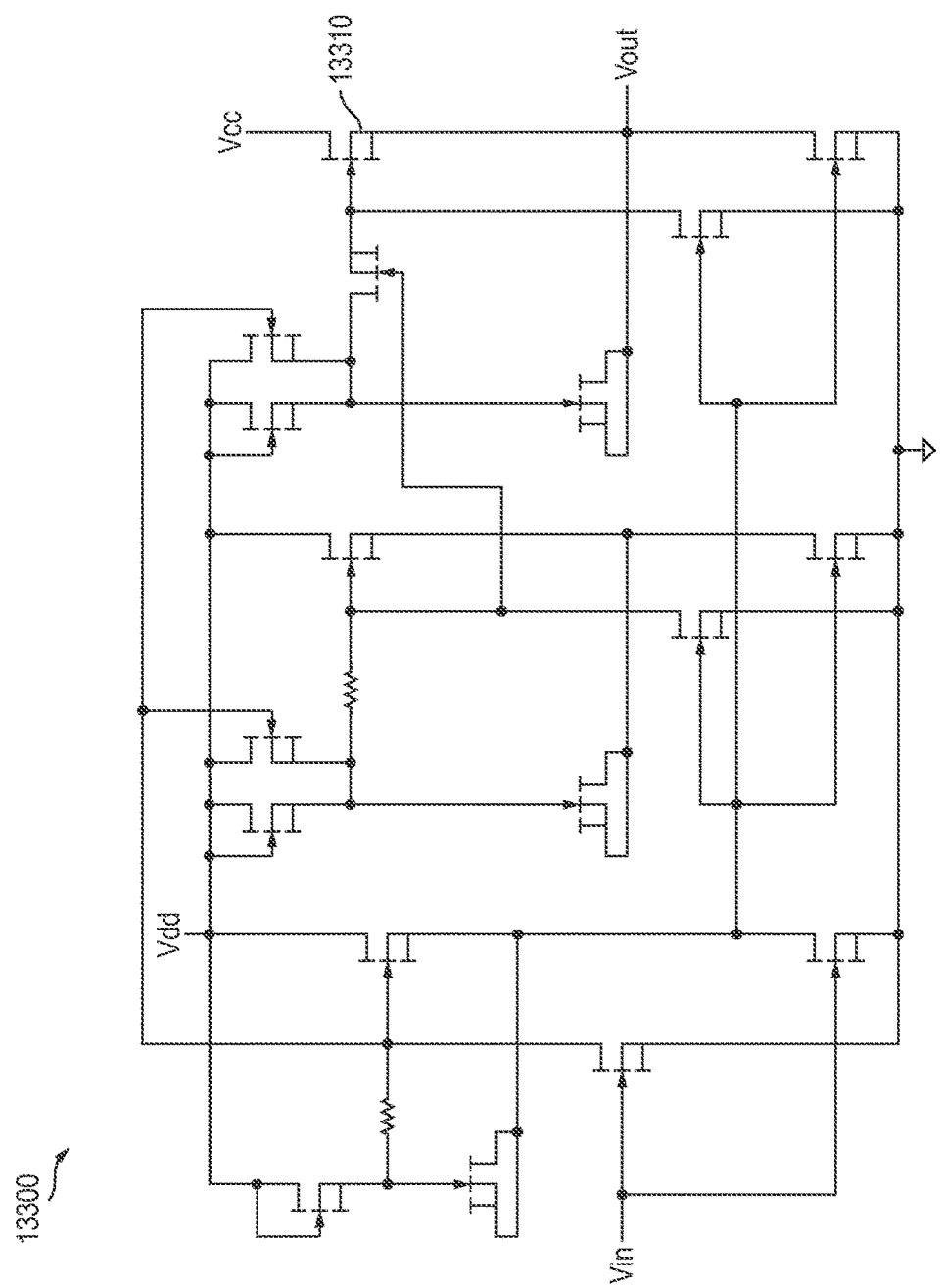
FIG. 57 is a schematic circuit diagram of an embodiment of a buffer.

FIG. 57 is a schematic circuit diagram of an embodiment of a buffer 13300, which is an implementation of logic gate 12800. Buffer 13300 provides a non-inverting rail to rail output and has characteristics of other circuits discussed herein.

In this embodiment, the power supply of certain portions of the buffer 13300 are powered by a first power supply, Vdd, and other portions of the buffer 13300 are powered by a second power supply, Vcc, where Vcc is greater than Vdd. For example, Vcc may be equal to about 10-15V and Vdd may be equal to 5-7V. In addition, some of the FETs may be built to withstand 10-15V across them, while other FETs are not. For example, those that are not, may be used because of their greater speed or transconductance.

In this embodiment, the output stage is driven with the higher voltage power supply, Vcc. Buffer 13300 functions similar to other circuits described herein. For example, when the output is driven to Vcc, the gate voltage of the pull-up FET 13310 is capacitively coupled to approximately Vdd+Vcc.

Figure 58:
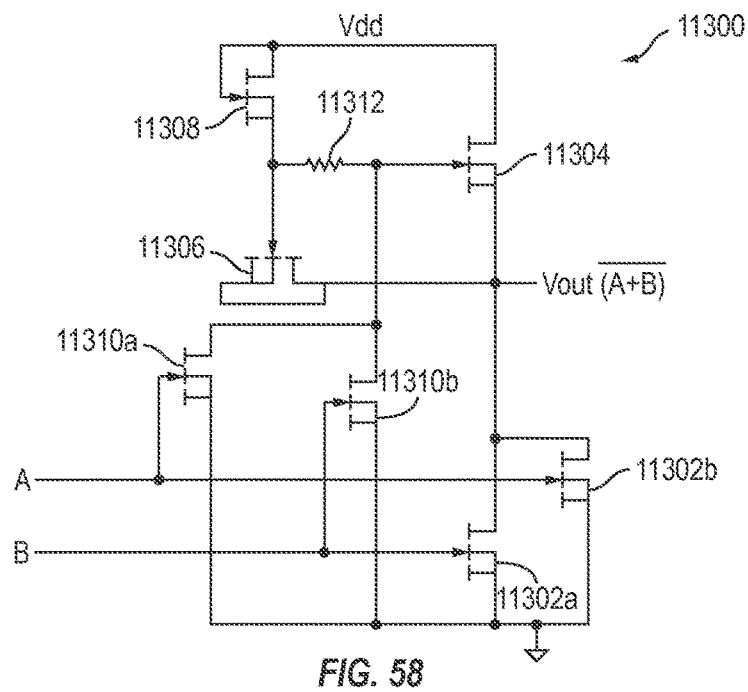
FIG. 58 is a schematic circuit diagram of a two-input NOR logic gate.

Other logic gates, such as NOR and NAND gates may be formed as embodiments of logic gate 12800, discussed above. For example, FIG. 58 is a schematic circuit diagram of a two-input NOR logic gate 11300, which is an implementation of logic gate 12800. As shown, NOR gate 11300 includes a pull-down device comprising FETs 11302*a* and 11302*b*, which respectively receive an input to the NOR gate 11300 at their gates. NOR gate 11300 also includes pull-up device FET 11304. The output node of NOR gate 11300 is connected to pull-up FET 11304, and capacitor FET 11306.

NOR gate 11300 further includes control circuitry comprising capacitor FET 11306, and diode connected FET 11308, which respectively have functionality similar to capacitor FET 10206 and diode connected FET 10208 described above with reference to FIG. 46. The control circuitry of NOR gate 11300 also includes pull-up device control FETs 11310a and 11310b.

The NOR logic function is achieved by either of pull-down FETs 11302a and 11302b causing the output voltage to go to ground if either of inputs A or B is a High logic level while pull-up FET gate control FETs 11310a and 11310b turn off pull-up FET 11304 in response to either of inputs A or B being in the High logic level state. In addition, if both inputs A and B are a Low logic level, diode connected FET 11308 and capacitor FET 11306 drive up the gate voltage of pull-up FET 11304, causing the output to go to Vdd while pull-down FETs 11302a and 11302b are turned off by both inputs A and B being in the Low logic level state.

In addition, NOR gate 11300 includes optional resistors 11312, which have functionality similar to resistors 10612 described above with reference to FIG. 50.

In alternative embodiments, a NAND gate implementation of logic gate 12800 may be similar to NOR gate 11300. For example, a NAND logic gate may be formed by: 1) connecting pull-down FETs 11302a and 11302b in series between the output and ground instead of in parallel, and 2) connecting pull-up FET gate control FETs 11310a and 11310b in series between the gate of pull-up FET 11304 and ground instead of in parallel.

Figure 59:
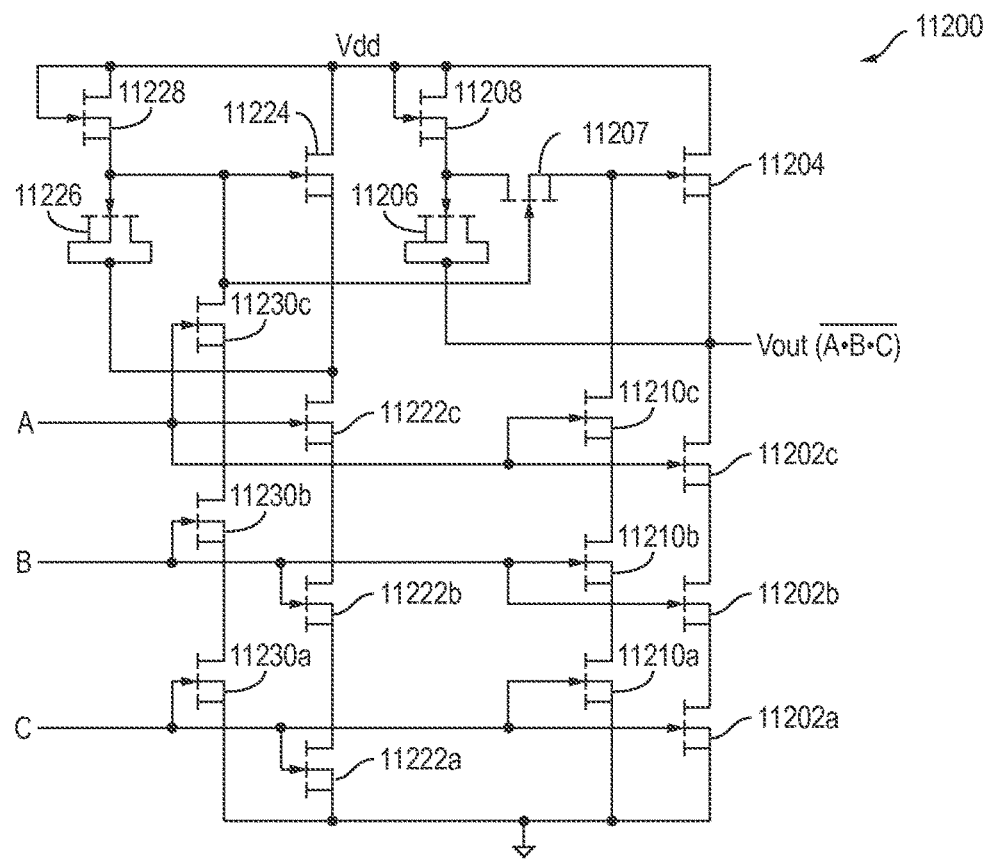
FIG. 59 is a schematic circuit diagram of a three-input NAND logic gate.

FIG. 59 is a schematic circuit diagram of a three-input NAND logic gate 11200, which is an implementation of logic gate 12800.

As shown, NAND gate 11200 includes a pull-down device comprising FETs 11202a, 11202b, and 11202c, which respectively receive an input to the NAND gate 11300 at their gates. NAND gate 11300 also includes pull-up device FET 11204. The output node of NAND gate 11200 is connected to pull-up FET 11204, and pull-down FET 11202c.

NAND gate 11200 further includes control circuitry comprising capacitor FET 11206, and diode connected FET 11208, which respectively have functionality similar to capacitor FET 10206 and diode connected FET 10208 described above with reference to FIG. 46. The control circuitry of NAND gate 11200 also includes pull-down FETs 11210a, 11210b, 11210c, 11222a, 11222b, 11222c, 11230a, 11230b, and 11230c. The control circuitry of NAND gate 11200 also includes pull-up FET 11224, pass FET 11207, resistor 11227, diode connected FET 11228, and capacitor FET 11226

In some embodiments, NAND and NOR logic gates include one or more features of one or more of the inverters discussed above, for example, with reference to FIGS. 46 and 49-53.

Figure 60:
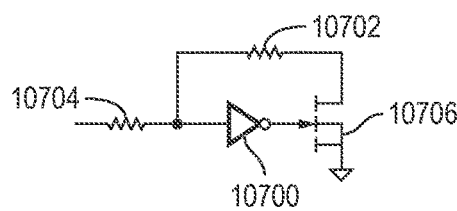
FIG. 60 is a schematic circuit diagram of an embodiment of an inverter.

Some embodiments of logic gates achieve asymmetric input hysteresis, which occurs as a result of an increase in the input threshold voltage for an output transitioning from High to Low. FIG. 60 is a schematic diagram of an example inverter 10700, which is an embodiment of logic gate 12800 having asymmetric input hysteresis.

Inverter 10700 is connected to hysteresis FET 10706. Hysteresis FET 10706 receives the output of inverter 10700, and generates a feedback signal which is connected to the inverter input.

The hysteresis is a result of the feedback signal. In this embodiment, hysteresis FET 10706 has a gate terminal connected to the output of inverter 10700, and the drain voltage of the hysteresis FET is fed back to the input through a resistor divider including resistor 10702 and 10704. Consequently, the input threshold for the logic gate is increased for output going from hi to low.

Similar hysteresis FETs and resistor dividers may be connected to other logic gates or combinations of logic gates to have similar asymmetric input hysteresis. For logic gates or combinations having multiple inputs, each input may be provided with a separate feedback circuit including a hysteresis FET and a resistor divider. In some embodiments, the feedback circuits of the multiple inputs share a single hysteresis FET.

Some embodiments of logic gates achieve substantially symmetric input hysteresis, which occurs as a result of an increase in the input threshold voltage for an output transitioning from Low to High and a decrease in the input threshold voltage for an output transitioning from High to Low.

Figure 61:
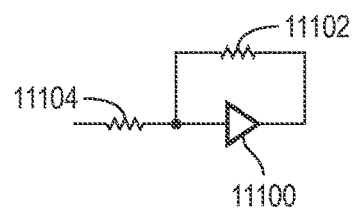
FIG. 61 is a schematic diagram of an embodiment of a buffer.

FIG. 61 is a schematic diagram of an example buffer 11100, which is an embodiment of logic gate 12800 having substantially symmetric input hysteresis.

Buffer 11100 is connected to hysteresis resistor divider formed by resistors 11102 and 11104. The hysteresis is a result of the feedback signal. In this embodiment, the output of buffer 11100 is fed back to the input through the hysteresis resistor divider. Consequently, the input threshold for the logic gate is increased for output going from Low to High and is decreased for output going from High to Low.

Similar hysteresis resistor dividers may be connected to other logic gates or combinations of logic gates to have similar symmetric input hysteresis. For logic gates or combinations having multiple inputs, each input may be provided with a separate resistor divider.

In some embodiments, one or more depletion mode (dmode) devices may be used in combination with enhancement mode (emode) devices.

Figure 62:
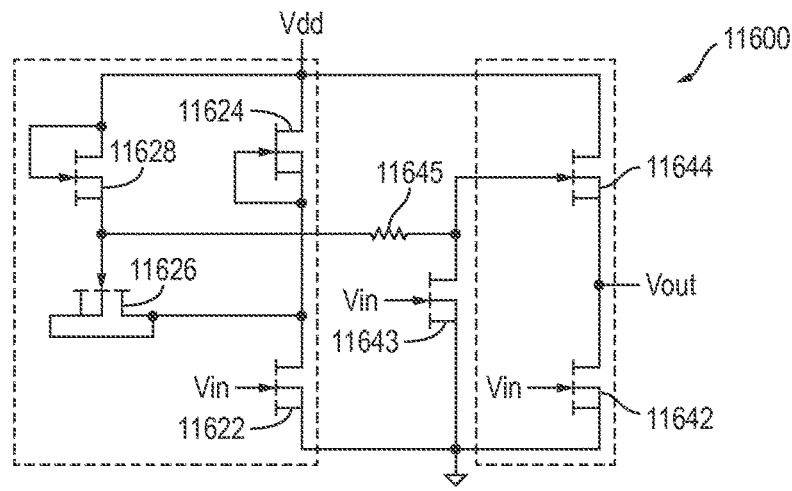
FIG. 62 is a schematic circuit diagram of an embodiment of an inverter.

FIG. 62 is a schematic circuit diagram of an inverter 11600, which is an embodiment of logic gate 12800 having a dmode pull-up device 11624. The other FETs of inverter 11600 are emode devices.

Inverter 11600 includes pull-down device FET 11642, pull-up device FET 11644, and control circuitry, which includes pull-down FETs 11643 and 11622, capacitor FET 11626, diode connected FET 11628, dmode FET 11624, and resistor 11645.

As shown, dmode pull-up device 11624 has its gate connected with its source. In some embodiments, dmode pull-up device 11624 functions as a current source driving the gate of FET 11644 High through capacitor FET 11626 and resistor 11645. Pull-down FET 11622 receives the input to the inverter 11600 and conditionally drives the gate of FET 11644 Low through capacitor FET 11626 and resistor 11645.

As shown, the input of inverter 11600 drives the gate of pull-down FETs 11642 and 11643. Pull-down FET 11643 conditionally causes the gate voltage of pull-up FET 11644 to be driven to ground. In addition, pull-down FET 11642 conditionally causes the output of the inverter 11600 to be driven to ground. In addition, the pull-up FET 11644 causes the output of the inverter 11600 to be driven to Vdd according to principles and features discussed elsewhere herein.

The embodiment of FIG. 62 is an example of a logic gate using a dmode FET. The other logic gates discussed herein and other logic gates may similarly use one or more dmode FETs for example in schematic locations corresponding with dmode pull-up device 11624.

Figure 63:
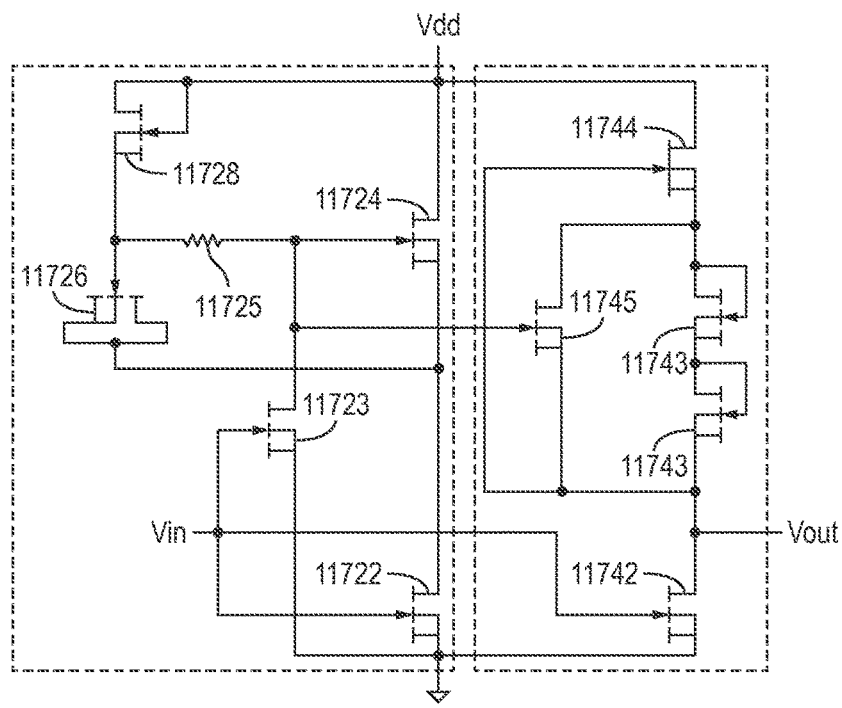
FIG. 63 is a schematic circuit diagram of an embodiment of an inverter.

FIG. 63 is a schematic circuit diagram of an inverter 11700, which is an embodiment of logic gate 12800 having a dmode pull-up device 11744. The other FETs of inverter 11700 are emode devices.

Inverter 11700 includes pull-down device FET 11742, dmode pull-up device FET 11744, diode connected FETs 11743, parallel FET 11745, and parallel FET gate drive circuitry, which drives the gate of parallel FET 11745. The parallel FET gate drive circuitry includes pull-down FETs 11722 and 11723, capacitor FET 11726, diode connected FET 11728, pull-up FET 11724, and resistor 11725. The parallel FET gate drive circuitry operates according to logic gates having similar features discussed elsewhere herein. Other logic gates having other features, for example discussed elsewhere herein, may alternatively be used.

In response to a Low input, the output of inverter 11700 is charged to Vdd by current flowing through dmode FET 11744, and the parallel connection of diode-connected FETs 11743 and parallel FET 11745, which is turned on by the parallel FET gate drive circuitry.

In response to a High input, the output of inverter 11700 is driven to ground by current flowing through pull-down FET 11742, and the pull-up current path to Vdd is interrupted by parallel FET 11745 being turned off by the parallel FET gate drive circuitry, and by the sum of the threshold voltages of the diode-connected FETs 11743 being greater than or equal to the pinch-off voltage of dmode FET 11744.

In some embodiments, diode-connected FETs 11743 are omitted. In such embodiments, the output of inverter 11700 is driven to Vdd by current flowing through dmode FET 11744 and parallel FET 11745.

In some embodiments, instead of a single diode-connected FET 11728, multiple diode-connected FETs are connected in series.

Figure 64:
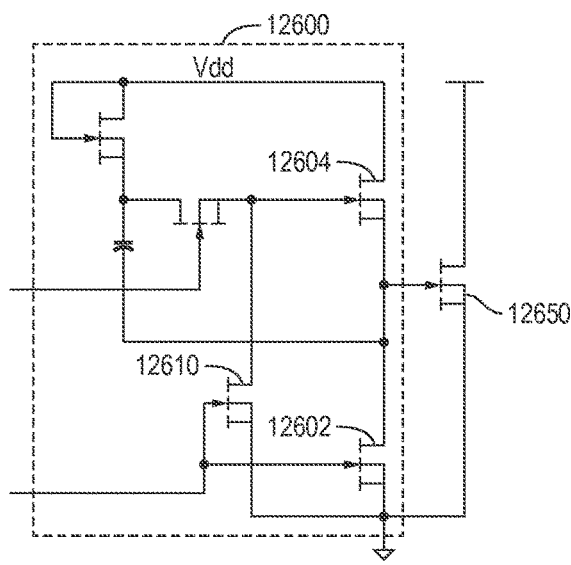
FIG. 64 is a schematic circuit diagram illustrating an output portion of a logic gate driving drive a power switch device.

FIG. 64 is a schematic circuit diagram illustrating an output portion of a logic gate 12600 driving drive power switch device 12650. Logic gate 12600 is an embodiment of logic gate 12800 discussed with reference to FIG. 45. Logic gate 12600 includes pull-down FET 12602, pull-up FET 12604, and pull-down FET 12610. The illustrated FETs are formed on a single substrate, using processing techniques which form the FETs substantially simultaneously.

Figure 65:
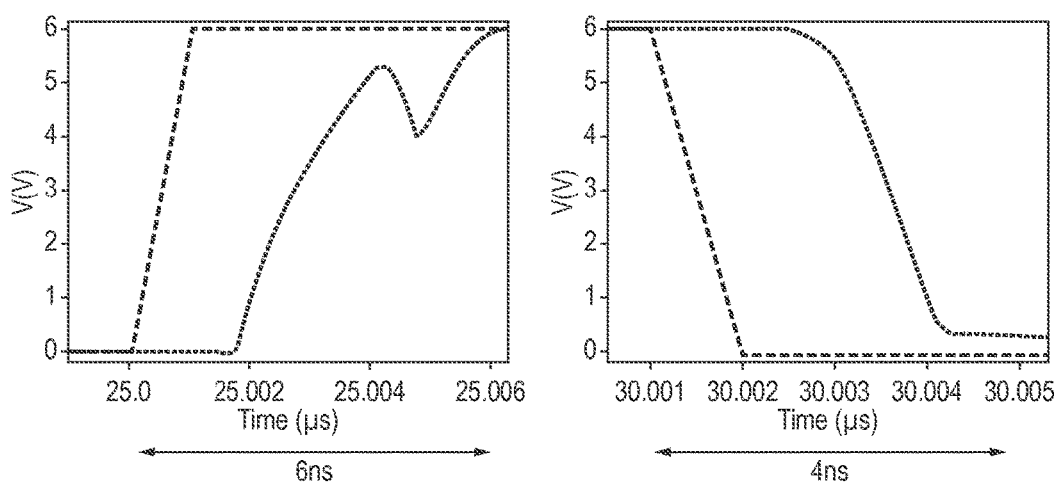
FIG. 65 illustrates switching waveforms associated with the circuit of FIG. 63.

FIG. 65 illustrates switching waveforms associated with the circuit of FIG. 64.

Figure 66:
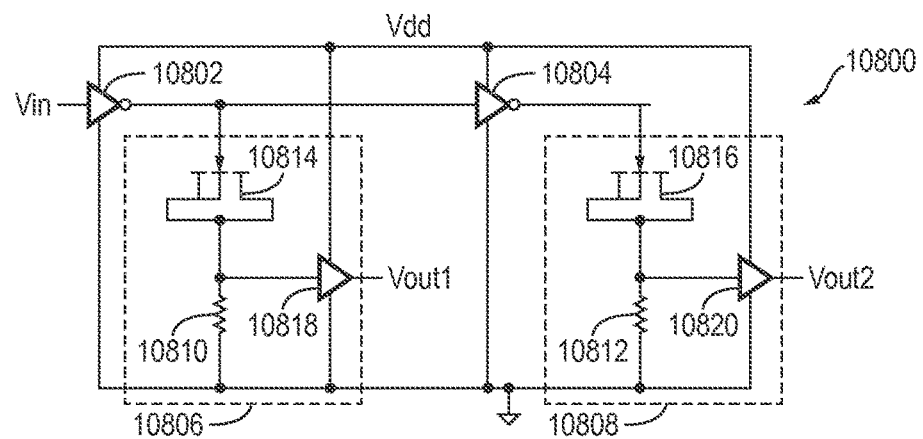
FIG. 66 is a schematic circuit diagram of an embodiment of a pulse generator.

FIG. 66 is a schematic circuit diagram of a pulse generator 10800 configured to generate pulses that correspond with the transitions of an input signal. Pulse generator 10800 includes inverters 10802 and 10804, which respectively drive pulse circuits 10806 and 10808.

Pulse circuits 10806 and 10808 generate high pulses in response to Low to High transitions at their inputs. In response to Low to High input transitions, capacitors 10814 and 10816 respectively pull up the voltage at the inputs of buffers 10818 and 10820 to High levels. The inputs of buffers 10818 and 10820 remain High until the charge on the capacitors 10814 and 10816 is discharged through resistors 10810 and 10812 such that the inputs of buffers 10818 and 10820 are reduced to Low levels. The duration of the pulses is dependent on the values of the resistors 10810 and 10812 and the capacitors 10814 and 10816.

Therefore, pulse generator 10800 generates a positive "on pulse" in response to a positive transition at its input, and generates a positive "off pulse" in response to a negative transition at its input.

Figure 67:
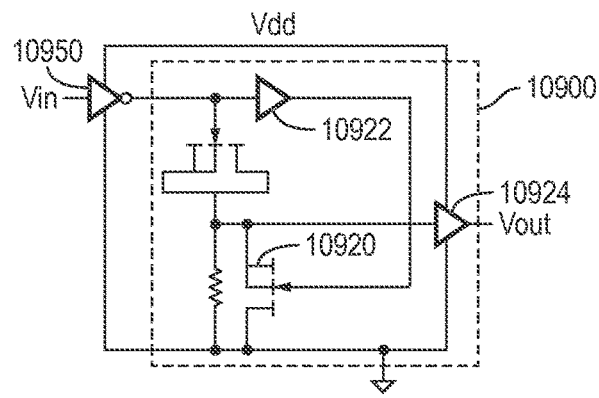
FIG. 67 is a schematic circuit diagram of an embodiment of a pulse generator.

FIG. 67 is a schematic circuit diagram of a pulse generator 10900 driven by inverter 10950. Pulse generator 10900 is configured to generate pulses that correspond with the transitions of an input signal. Pulse generator has features similar to pulse generator 10800 of FIG. 67. In addition, pulse generator 10900 includes emode transistor 10920 and delay element 10922.

Emode transistor 10920 is configured pull-down the input to buffer 10924. In some embodiments, the emode transistor 10920 ensures that the input to buffer 10924 is completely pulled to ground. In some embodiments, the emode transistor 10920 causes the end of the pulse to be the result of the positive transition of the delay element 10922. In such embodiments, the pulse is generated in response to a negative transition at the input of inverter 10950 and has a duration determined by the duration of the delay of the delay element 10922.

Figure 68:
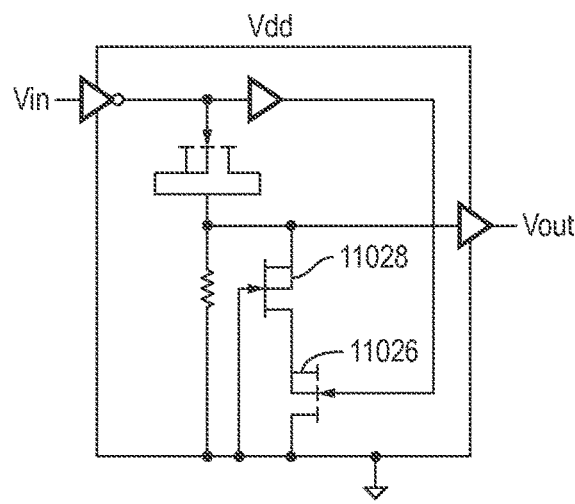
FIG. 68 is a schematic circuit diagram of an embodiment of a pulse generator.

In some embodiments the emode transistor may be replaced by a dmode transistor 11026 with an emode cascode transistor 11028, for example, as shown in FIG. 68.

Each of the circuits discussed herein include one or more inventive features. The various features of the circuits may be applied to other embodiments of circuits in combinations of features which are contemplated, but not specifically discussed for the sake of brevity.

The various aspects of the devices discussed herein may be practiced in other semiconductor technologies. For example, the various aspects of the devices discussed herein may be practiced in Silicon, Germanium, Gallium Arsenide, Silicon Carbide, Organic, and other technologies.

While various embodiments of present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. An electronic circuit, comprising:
   a substrate comprising GaN;
   a power switch formed on the substrate and including a first control gate and a first source; and
   a drive circuit formed on the substrate and comprising:
     a plurality of transistors, wherein all of the transistors of the drive circuit are of the same conductivity type,
     an output coupled to the first control gate, and
     a power supply having a supply voltage and coupled to the drive circuit,
   wherein the output of the drive circuit can be driven to the supply voltage.

2. The electronic circuit of claim 1, wherein the drive circuit is coupled to at least one power supply and to one input that are both referenced to the first source.

3. The electronic circuit of claim 1, wherein the drive circuit is coupled to exactly one PWM input.

4. The electronic circuit of claim 1, wherein the drive circuit comprises:
   at least one enhancement mode transistor;
   at least one current conducting element; and
   does not include any depletion mode transistors.

5. The electronic circuit of claim 1, wherein the drive circuit comprises an inverter, comprising:
   a first enhancement-mode transistor having a second gate connected to a first input signal, a second source connected to the first source, and a second drain; and
   a second enhancement-mode transistor having a third drain connected to the power supply, a third source connected to the second drain and a third gate connected to a control circuit configured to generate a voltage higher than the power supply.

6. The electronic circuit of claim 5, including a capacitive element that moves up and down in voltage synchronously with the third source and supplies charge to the third gate.

7. The electronic circuit of claim 5, further comprising a rectifying element configured to supply power to the capacitive element and to prevent discharge of the capacitive element when a voltage on a terminal of the capacitive element rises above a voltage on the power supply.

8. The electronic circuit of claim 5, wherein the second enhancement mode transistor can be switched on in less than 100 nanoseconds.

9. The electronic circuit of claim 5 where in a third enhancement mode transistor has a fourth gate connected the first input signal, a fourth drain connected to the third gate and a fourth source connected to the first source.

10. The electronic circuit of claim 9 wherein a current limiting element is disposed in a current conduction path from the power supply to the first source, and wherein the current conduction path comprises a series connection of a rectifying element, the current limiting element and the third enhancement mode transistor.

11. The electronic circuit of claim 10, wherein the current limiting element comprises a fifth enhancement mode transistor having a sixth gate, a sixth source connected to the third gate, and a sixth drain connected to a terminal of the second capacitive element, wherein the second capacitive element is configured to supply power to the third gate.

12. The electronic circuit of claim 11, wherein the sixth gate is connected to a circuit capable of delivering a voltage higher than the first power supply voltage.

13. The electronic circuit of claim 12, wherein the sixth gate is configured to turn off the fifth enhancement mode transistor synchronously with the turn on of the first enhancement mode transistor, and wherein the sixth gate is further configured to turn on the fifth enhancement mode transistor when a voltage of a terminal of the second capacitive element rises above a voltage on the first power supply.

14. The electronic circuit of claim 9, wherein the fourth gate is connected to a circuit capable of supply a voltage greater than the first power supply voltage.

15. The electronic circuit of claim 14, wherein the fourth gate is configured to turn on the third enhancement mode transistor to supply power from the first power supply to the second capacitive element synchronously with the turn on of the first enhancement mode transistor, and wherein the fourth gate is further configured to turn off the third enhancement mode transistor when a voltage of a terminal of the second capacitive element rises above a voltage on the first power supply.

16. The electronic circuit of claim 5 wherein a resistor is disposed between the first input signal and the first control gate.

17. The electronic circuit of claim 5, wherein the second enhancement mode transistor is configured to be in an off state when the first enhancement mode transistor is in an on state and wherein the second enhancement mode transistor is configured to be in an on state when the first enhancement mode transistor is in an off state.

18. The electronic circuit of claim 17, wherein the third drain is connected to the first power supply.

19. The electronic circuit of claim 17, wherein the third drain is connected to a second power supply.

20. The electronic circuit of claim 17, further comprising a depletion mode transistor having a fourth gate, a fourth source, and a fourth drain connected to the first power supply, wherein the fourth gate is connected to the second drain and the fourth source is connected to the third drain.

21. The electronic circuit of claim 5, further comprising a first resistor disposed between the second drain and the first power supply.

22. The electronic circuit of claim 5, wherein the inverter is coupled to a seventh gate of a sixth enhancement mode transistor having a seventh source coupled to the first source and a seventh drain coupled to the control gate.

23. The electronic circuit of claim 1 wherein the drive circuit comprises two inverters connected serially to form a non-inverting buffer circuit.

24. The electronic circuit of claim 1 where in the drive circuit comprises at least one buffer circuit.

25. The electronic circuit of claim 1 where in the drive circuit is coupled with a gate of a fourth enhancement mode transistor having a fifth drain connected to the first control gate and a fifth source connected to the first source.

26. The electronic circuit of claim 1 further comprising an electrostatic discharge protection circuit.

27. An electronic component comprising:
a package base;
at least one GaN-based die secured to the package base and including an electronic circuit comprising:
a power switch formed on the at least one GaN-based die and including a first control gate and a first source; and
a drive circuit formed on the at least one GaN-based die, the drive circuit comprising:
a plurality of transistors, wherein all of the transistors of the drive circuit are of the same conductivity type,
an output coupled to the first control gate, and
a power supply having a supply voltage and coupled to the drive circuit,
wherein the output of the drive circuit can be driven to the supply voltage.

28. The power conversion component of claim 27, wherein the drive circuit is coupled to at least one power supply and to one input that are referenced to the first source.

29. The power conversion component of claim 27, wherein the drive circuit is coupled to exactly one PWM input.

30. The electronic component of claim 27, wherein the drive circuit comprises:
at least one enhancement mode transistor;
at least one current conducting element; and
does not include any depletion mode transistors.

31. A method of operating a GaN-based circuit, the method comprising:
receiving a signal with a drive circuit;
processing the signal with the drive circuit; and
transmitting an output signal to a control gate of a switch,
wherein the drive circuit and the switch are disposed on a unitary GaN substrate, and
wherein the drive circuit comprises:
a plurality of enhancement mode transistors, and
at least one current conducting element,
an output coupled to the first control gate, and
a power supply having a supply voltage and coupled to the drive circuit,
wherein the output of the drive circuit can be driven to the supply voltage, and
wherein the drive circuit does not include any depletion mode transistors and does not include transistors of differing conductivity types.

* * * * *